(12) United States Patent
Na et al.

(10) Patent No.: US 12,550,559 B2
(45) Date of Patent: Feb. 10, 2026

(54) DISPLAY DEVICE

(71) Applicant: Samsung Display Co., LTD., Yongin-si (KR)

(72) Inventors: Ji Su Na, Yongin-si (KR); Su Mi Jang, Yongin-si (KR); Won Mi Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 414 days.

(21) Appl. No.: 18/215,090

(22) Filed: Jun. 27, 2023

(65) Prior Publication Data

US 2024/0122003 A1    Apr. 11, 2024

(30) Foreign Application Priority Data

Oct. 6, 2022   (KR) .................... 10-2022-0128193
Dec. 6, 2022   (KR) .................... 10-2022-0168394

(51) Int. Cl.
*H10K 59/131*  (2023.01)
*H10K 59/88*   (2023.01)

(52) U.S. Cl.
CPC ........... *H10K 59/131* (2023.02); *H10K 59/88* (2023.02)

(58) Field of Classification Search
None
See application file for complete search history.

(56) References Cited

U.S. PATENT DOCUMENTS

2022/0351690 A1*  11/2022  Park .................... G06F 1/1637

FOREIGN PATENT DOCUMENTS

| CN | 111833796 A | 10/2020 |
| KR | 10-2020-0145953 A | 12/2020 |
| KR | 10-2021-0033120 A | 3/2021 |
| KR | 10-2021-0135977 A | 11/2021 |

* cited by examiner

*Primary Examiner* — Kyoung Lee
(74) *Attorney, Agent, or Firm* — Womble Bond Dickinson (US) LLP

(57) ABSTRACT

A display device includes: a circuit layer including: demux circuits in a demux area of a non-display area and electrically connected between data lines and a display driving circuit; a first higher-priority output connection line electrically connected to a higher-priority output terminal of a first demux circuit from among the demux circuits, and extending to the display area; a first lower-priority output connection line electrically connected to a lower-priority output terminal of the first demux circuit, and extending to the display area; and a first input connection line electrically connected to an input terminal of the first demux circuit. One of the first higher-priority output connection line, the first lower-priority output connection line, or the first input connection line is included in the same conductive layer as that of the data lines, and the others are included in a conductive layer different from that of the data lines.

32 Claims, 30 Drawing Sheets

SEL: CHDT, SDT, DDT, CH1-1, S1-1, D1-1, CH1-2, S1-2, D1-2,
CH2, S2, D2, CH3-1, S3-1, D3-1, CH3-2, S3-2, D3-2,
CH4, S4, D4, CH5, S5, D5, CH6, S6, D6
CDL1: GWL, GIL, ECL, GCL, GDT, G1-1, G1-2, G2, G3-1, G3-2, G4, G5, G6
CDL2: VDSBL1, VGIL, VAIL, SHE
CDL3: VDSBL2, VGIAL, VAIAL, CE1, CE2, CE3
VDL: VDSBL1, VDSBL2

DISPLAY DEVICE

CROSS-REFERENCE TO RELATED APPLICATION

This application claims priority to and the benefit of Korean Patent Application No. 10-2022-0128193, filed on Oct. 6, 2022, in the Korean Intellectual Property Office, and Korean Patent Application No. 10-2022-0168394, filed on Dec. 6, 2022, in the Korean Intellectual Property Office, the entire content of all of which are incorporated by reference herein.

BACKGROUND

1. Field

Aspects of embodiments of the present disclosure relate to a display device.

2. Description of the Related Art

With the advancement of information-oriented society, more and more demands are placed on display devices for displaying images in various ways. For example, display devices are employed in various electronic devices, such as smartphones, digital cameras, laptop computers, navigation devices, and smart televisions.

The display device may include a display panel for emitting light to display an image, and a driver for supplying a signal or power for driving the display panel.

At least one surface of the display device may be referred to as a display surface on which an image is displayed. The display surface may include a display area in which a plurality of emission areas for emitting light for image display are arranged, and a non-display area disposed around the display area.

The display device may include data lines disposed in the display area for transmitting data signals to the plurality of emission areas, and a display driving circuit for supplying the data signals to the data lines.

The above information disclosed in this Background section is for enhancement of understanding of the background of the present disclosure, and therefore, it may contain information that does not constitute prior art.

SUMMARY

The display device may include connection lines for electrical connection between each of the data lines and the display driving circuit. The connection lines are disposed in the non-display area. Therefore, as the number of the data lines increases for a scale-up or resolution improvement, the number of the connection lines also increases, which may make it difficult to reduce the width of the non-display area.

Further, if the width of the non-display area is reduced in order to increase a ratio of the display area on the display surface, a risk of a short circuit defect occurring may increase as a gap between the connection lines decreases.

Embodiments of the present disclosure are directed to a display device having a reduced width of the non-display area, without deteriorating a resolution thereof or increasing a probability of short-circuit defects.

According to one or more embodiments of the present disclosure, a display device includes: a substrate including: a main region including a display area including emission areas, and a non-display area around the display area; and a sub-region protruding from one side of the main region; a circuit layer on the substrate, and including: pixel drivers corresponding to the emission areas, respectively; and data lines configured to transmit data signals to the pixel drivers; a light emitting element layer on the circuit layer, and including light emitting elements corresponding to the emission areas, respectively; and a display driving circuit in the sub-region of the substrate, and configured to supply data driving signals corresponding to the data lines. The circuit layer further includes: demux circuits located side by side with one another in a demux area of the non-display area and electrically connected between the data lines and the display driving circuit, each of the demux circuits including: an input terminal configured to receive a data driving signal from among the data driving signals of the display driving circuit; a higher-priority output terminal configured to output a first data signal from among the data signals corresponding to the data driving signal from among the data driving signals during a first output period; and a lower-priority output terminal configured to output a second data signal from among the data signals corresponding to the data driving signal from among the data driving signals during a second output period after the first output period; a first higher-priority output connection line electrically connected to the higher-priority output terminal of a first demux circuit from among the demux circuits, and extending to the display area; a first lower-priority output connection line electrically connected to the lower-priority output terminal of the first demux circuit, and extending to the display area; and a first input connection line electrically connected to the input terminal of the first demux circuit. One of the first higher-priority output connection line, the first lower-priority output connection line, or the first input connection line is included in the same conductive layer as that of the data lines, and the others are included in a conductive layer different from that of the data lines.

In an embodiment, the first demux circuit may be adjacent to a bent corner of an edge of the substrate.

In an embodiment, the demux area may include: a demux middle region at a center of the demux area in a first direction; a first demux side region adjacent to the edge of the substrate in the first direction, the first demux side region including: a curved region having a bent shape along the bent corner of the edge of the substrate; and a straight region other than the curved region; and a second demux side region between the demux middle region and the first demux side region in the first direction. The first demux circuit may be located in the curved region.

In an embodiment, in the first direction, the first input connection line may be located between the first higher-priority output connection line and the first lower-priority output connection line.

In an embodiment, the circuit layer may have a multilayered structure including: a semiconductor layer on the substrate; a first conductive layer on a first gate insulating layer covering the semiconductor layer; a second conductive layer on a second gate insulating layer covering the first conductive layer; a third conductive layer on an interlayer insulating layer covering the second conductive layer; a fourth conductive layer on a first planarization layer covering the third conductive layer; a fifth conductive layer on a second planarization layer covering the fourth conductive layer; and a third planarization layer covering the fifth conductive layer. The data lines may be included in the fifth conductive layer. One of the first higher-priority output connection line, the first lower-priority output connection line, or the first input connection line may be included in the fifth conductive layer, and each of the others may be included in the third conductive layer or the fourth conductive layer.

In an embodiment, the first higher-priority output connection line, the first lower-priority output connection line, and the first input connection line may be included in different conductive layers from each other.

In an embodiment, the first higher-priority output connection line may be included in one of the third conductive layer or the fifth conductive layer; the first lower-priority output connection line may be included in the other one of the third conductive layer or the fifth conductive layer; and the first input connection line may be included in the fourth conductive layer.

In an embodiment, the first higher-priority output connection line may be included in one of the third conductive layer or the fifth conductive layer; the first lower-priority output connection line may be included in the fourth conductive layer; and the first input connection line may be included in the other one of the third conductive layer or the fifth conductive layer.

In an embodiment, the first higher-priority output connection line may be included in one of the third conductive layer or the fifth conductive layer, and the first lower-priority output connection line and the first input connection line may overlap with each other.

In an embodiment, the first higher-priority output connection line may be included in one of the third conductive layer or the fifth conductive layer, and the first lower-priority output connection line and the first input connection line may be included in the other one of the third conductive layer or the fifth conductive layer, and may be spaced from each other.

In an embodiment, the circuit layer may further include a shielding layer overlapping with the first lower-priority output connection line and the first input connection line, and included in the fourth conductive layer.

In an embodiment, the circuit layer may further include a first power supply line and a second power supply line in the non-display area to transmit a first power and a second power, respectively, for driving the light emitting elements, and the shielding layer may be electrically connected to one of the first power supply line or the second power supply line.

In an embodiment, the demux circuits may further include a second demux circuit in the straight region. The circuit layer may further include: a second higher-priority output connection line electrically connected to the higher-priority output terminal of the second demux circuit, and extending to the display area; a second lower-priority output connection line electrically connected to the lower-priority output terminal of the second demux circuit, and extending to the display area; and a second input connection line electrically connected to the input terminal of the second demux circuit. The second higher-priority output connection line, the second lower-priority output connection line, and the second input connection line may be included in the same conductive layer as that of the data lines.

In an embodiment, the demux circuits may further include a third demux circuit in the second demux side region, and a fourth demux circuit in the demux middle region. The circuit layer may further include: a third higher-priority output connection line electrically connected to the higher-priority output terminal of the third demux circuit, and extending to the display area; a third lower-priority output connection line electrically connected to the lower-priority output terminal of the third demux circuit, and extending to the display area; a fourth higher-priority output connection line electrically connected to the higher-priority output terminal of the fourth demux circuit, and extending to the display area; and a fourth lower-priority output connection line electrically connected to the lower-priority output terminal of the fourth demux circuit, and extending to the display area. The third higher-priority output connection line, the third lower-priority output connection line, the fourth higher-priority output connection line, and the fourth lower-priority output connection line may be included in the fifth conductive layer.

In an embodiment, the circuit layer may further include circuit output lines in the sub-region and the non-display area to electrically connect the demux circuits to the display driving circuit; the first input connection line and the second input connection line may be electrically connected to a first circuit output line and a second circuit output line from among the circuit output lines, respectively, through input bypass lines in the display area; and the input terminal of the third demux circuit and the input terminal of the fourth demux circuit may be electrically connected to a third circuit output line and a fourth circuit output line from among the circuit output lines, respectively.

In an embodiment, the display area may include: a display middle region adjacent to the demux middle region in a second direction crossing the first direction; a first display side region adjacent to the first demux side region in the second direction; and a second display side region adjacent to the second demux side region in the second direction. The data lines may extend in the second direction, and each of the input bypass lines may include: a first bypass line in the second display side region, electrically connected to the first circuit output line, and extending in the second direction; a second bypass line electrically connected to the first bypass line, and extending in the first direction; and a third bypass line in the first display side region, electrically connected to the second bypass line, and extending in the second direction toward the demux area.

In an embodiment, the first bypass line and the third bypass line may be included in the fifth conductive layer, and the second bypass line may be included in the fourth conductive layer.

In an embodiment, the circuit layer may further include first dummy lines in the display area, adjacent to the data lines, respectively, extending in the second direction, and included in the fifth conductive layer, and the first dummy lines may include the first bypass line of the input bypass lines, the third bypass line of the input bypass lines, and first auxiliary lines other than the first bypass line and the third bypass line.

In an embodiment, the circuit layer may further include: a first power supply line and a second power supply line in the non-display area to transmit a first power and a second power, respectively, for driving the light emitting elements; first power additional lines in the display area, extending in the first direction, included in the fourth conductive layer, and electrically connected to the first power supply line; and second dummy lines in the display area, extending in the first direction, included in the fourth conductive layer, and adjacent to the first power additional lines, respectively. The second dummy lines may include the second bypass line of the input bypass lines and second auxiliary lines other than the second bypass line, and the first auxiliary lines and the second auxiliary lines may be electrically connected to the second power supply line.

According to one or more embodiments of the present disclosure, a display device includes: a substrate including:

a main region including a display area including emission areas, and a non-display area around the display area; and a sub-region protruding from one side of the main region; a circuit layer on the substrate, and including pixel drivers corresponding to the emission areas, respectively, and data lines configured to transmit data signals to the pixel drivers; a light emitting element layer on the circuit layer, and including light emitting elements corresponding to the emission areas, respectively; and a display driving circuit in the sub-region of the substrate, and configured to supply data driving signals corresponding to the data lines. The circuit layer has a multilayered structure including: a semiconductor layer on the substrate; a first conductive layer on a first gate insulating layer covering the semiconductor layer; a second conductive layer on a second gate insulating layer covering the first conductive layer; a third conductive layer on an interlayer insulating layer covering the second conductive layer; a fourth conductive layer on a first planarization layer covering the third conductive layer; a fifth conductive layer on a second planarization layer covering the fourth conductive layer, and including the data lines; and a third planarization layer covering the fifth conductive layer. The circuit layer further includes demux circuits located side by side with one another in a demux area of the non-display area and electrically connected between the data lines and the display driving circuit, each of the demux circuits including: an input terminal configured to receive a data driving signal from among the data driving signals of the display driving circuit; a higher-priority output terminal configured to output a first data signal from among the data signals corresponding to the data driving signal during a first output period; and a lower-priority output terminal configured to output a second data signal from among the data signals corresponding to the data driving signal during a second output period after the first output period. The circuit layer further includes: a first higher-priority output connection line electrically connected to the higher-priority output terminal of a first demux circuit adjacent to a bent corner of an edge of the substrate from among the demux circuits, and extending to the display area; a first lower-priority output connection line electrically connected to the lower-priority output terminal of the first demux circuit, and extending to the display area; and a first input connection line electrically connected to the input terminal of the first demux circuit. The first higher-priority output connection line is included in one of the third conductive layer or the fifth conductive layer, and at least one of the first lower-priority output connection line or the first input connection line is included in the other one of the third conductive layer or the fifth conductive layer.

In an embodiment, the demux area may include: a demux middle region at a center of the demux area in a first direction; a first demux side region adjacent to the edge of the substrate in the first direction; and a second demux side region between the demux middle region and the first demux side region in the first direction. The first demux side region may include a curved region including a bent shape corresponding to the bent corner of the substrate, and a straight region other than the curved region, and the first demux circuit may be located in the curved region.

In an embodiment, the first higher-priority output connection line, the first lower-priority output connection line, and the first input connection line may be included in different conductive layers from each other.

In an embodiment, one of the first lower-priority output connection line or the first input connection line may be included in the other one of the third conductive layer or the fifth conductive layer, and the other one of the first lower-priority output connection line or the first input connection line may be included in the fourth conductive layer.

In an embodiment, the first lower-priority output connection line and the first input connection line may overlap with each other.

In an embodiment, the first lower-priority output connection line and the first input connection line may be included in the other one of the third conductive layer or the fifth conductive layer, and may be spaced from each other.

In an embodiment, the circuit layer may further include a shielding layer overlapping with the first lower-priority output connection line and the first input connection line, and included in the fourth conductive layer.

In an embodiment, the circuit layer may further include a first power supply line and a second power supply line in the non-display area to transmit a first power and a second power, respectively, for driving the light emitting elements, and the shielding layer may be electrically connected to one of the first power supply line or the second power supply line.

In an embodiment, the demux circuits may further include a second demux circuit in the straight region, and the circuit layer may further include: a second higher-priority output connection line electrically connected to the higher-priority output terminal of the second demux circuit, and extending to the display area; a second lower-priority output connection line electrically connected to the lower-priority output terminal of the second demux circuit, and extending to the display area; and a second input connection line electrically connected to the input terminal of the second demux circuit. The second higher-priority output connection line, the second lower-priority output connection line, and the second input connection line may be included in the fifth conductive layer.

In an embodiment, the demux circuits may further include a third demux circuit in the second demux side region, and a fourth demux circuit in the demux middle region. The circuit layer may further include: a third higher-priority output connection line electrically connected to the higher-priority output terminal of the third demux circuit, and extending to the display area; a third lower-priority output connection line electrically connected to the lower-priority output terminal of the third demux circuit, and extending to the display area; a fourth higher-priority output connection line electrically connected to the higher-priority output terminal of the fourth demux circuit, and extending to the display area; and a fourth lower-priority output connection line electrically connected to the lower-priority output terminal of the fourth demux circuit, and extending to the display area. The third higher-priority output connection line, the third lower-priority output connection line, the fourth higher-priority output connection line, and the fourth lower-priority output connection line may be included in the fifth conductive layer.

In an embodiment, the circuit layer may further include circuit output lines in the sub-region and the non-display area to electrically connect the demux circuits to the display driving circuit. The first input connection line and the second input connection line may be electrically connected to a first circuit output line and a second circuit output line from among the circuit output lines, respectively, through input bypass lines in the display area. The input terminal of the third demux circuit and the input terminal of the fourth demux circuit may be electrically connected to a third circuit output line and a fourth circuit output line from among the circuit output lines, respectively.

In an embodiment, the display area may include: a display middle region adjacent to the demux middle region in a second direction crossing the first direction; a first display side region adjacent to the first demux side region in the second direction; and a second display side region adjacent to the second demux side region in the second direction. The data lines may extend in the second direction, and each of the input bypass lines may include: a first bypass line in the second display side region, electrically connected to the first circuit output line, and extending in the second direction; a second bypass line electrically connected to the first bypass line, and extending in the first direction; and a third bypass line in the first display side region, electrically connected to the second bypass line, and extending in the second direction toward the demux area.

In an embodiment, the first bypass line and the third bypass line may be included in the fifth conductive layer, and the second bypass line may be included in the fourth conductive layer.

According to one or more embodiments of the present disclosure, a display device may include: a substrate having a main region including a display area and a non-display area, and a sub-region protruding from one side of the main region; a circuit layer on the substrate; a light emitting element layer on the circuit layer; and a display driving circuit that supplies data driving signals corresponding to data lines of the circuit layer.

The circuit layer may include pixel drivers respectively corresponding to emission areas; the data lines that transmit data signals to the pixel drivers; and demux circuits that are disposed in a demux area of the non-display area and electrically connected between the data lines and the display driving circuit.

Each demux circuit may include an input terminal to which a data driving signal of the display driving circuit is input; a higher-priority output terminal from which a first data signal is output during a first output period; and a lower-priority output terminal from which a second data signal is output during a second output period after the first output period.

The circuit layer may include a first higher-priority output connection line electrically connected to the higher-priority output terminal of a first demux circuit disposed relatively more adjacent to the corner of the edge of the substrate from among the demux circuits, a first lower-priority output connection line electrically connected to the lower-priority output terminal of the first demux circuit, and a first input connection line electrically connected to the input terminal of the first demux circuit.

One of the first higher-priority output connection line, the first lower-priority output connection line, or the first input connection line may be formed of the same conductive layer as that of the data lines, and the others may be formed of a conductive layer different from that of the data lines.

Because the display device according to one or more embodiments of the present disclosure includes the demux circuits connected between the display driving circuit and the data lines, the output end of the display driving circuit may not be directly connected to the data lines, and may be connected to the demux circuits, the number of which may be smaller than the number of the data lines. Accordingly, as the number of circuit output lines that are electrically connected to the display driving circuit and extend to the demux area may be smaller than the number of the data lines, the width of the non-display area may be reduced.

Because the width of the non-display area may be reduced without decreasing the number of the data lines, a limitation on the resolution due to a decrease in the width of the non-display area may be avoided.

Because the first demux circuit that is adjacent to the corner of the edge of the substrate is relatively farther from the display area, the first higher-priority output connection line, the first lower-priority output connection line, and the first input connection line disposed between the display area and the first demux circuit that is adjacent to the corner of the edge of the substrate may have a relatively longer length, which may result in poor coupling between the lines.

According to one or more embodiments of the present disclosure, however, one of the first higher-priority output connection line, the first lower-priority output connection line, or the first input connection line disposed between the display area and the first demux circuit that is adjacent to the corner of the edge of the substrate may be formed of a conductive layer different from that of the others. Accordingly, the distance between the first higher-priority output connection line, the first lower-priority output connection line, and the first input connection line may be increased as compared to a case where all of the first higher-priority output connection line, the first lower-priority output connection line, and the first input connection line are formed of one and the same conductive layer as each other.

Therefore, noise that might be caused by the poor coupling between the first higher-priority output connection line, the first lower-priority output connection line, and the first input connection line may be reduced.

Accordingly, in the data lines that are connected to the first demux circuit that is adjacent to the edge of the substrate, the width in which the data signal fluctuates due to noise caused by the poor coupling may be reduced, so that deterioration of display quality may be prevented or substantially prevented.

However, the aspects and features of the present disclosure are not limited to the aforementioned aspects and features, and various other aspects and features may be included in the present specification as would be apparent to those having ordinary skill in the art from reference to the detailed description and figures, or learned by practicing one or more of the presented embodiments of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
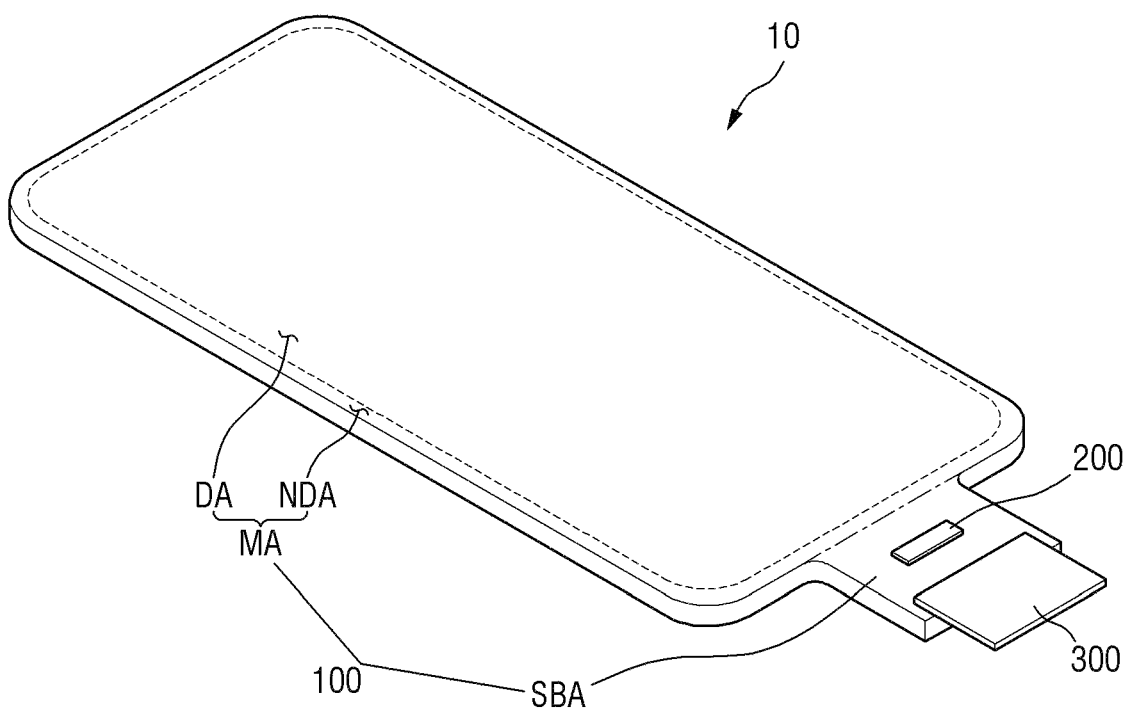
FIG. 1 is a perspective view illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

As used herein, the phrase "in a plan view" may refer to an object portion that is viewed from above, and the phrase "in a schematic cross-sectional view" may refer to a side view of a schematic cross-section taken by vertically cutting an object portion. The terms "overlap with" or "overlapped with" mean that a first object may be above or below or to a side of a second object, and vice versa. Additionally, the term "overlap with" may include layer, stack, face or facing, extending over, covering, or partly covering or any other suitable term as would be appreciated and understood by those of ordinary skill in the art. The expression "not overlap with" may include a meaning such as "spaced apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," "approximately," and similar terms are used as terms of approximation and not as terms of degree, and are intended to account for the inherent variations in measured or calculated values that would be recognized by those of ordinary skill in the art. For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
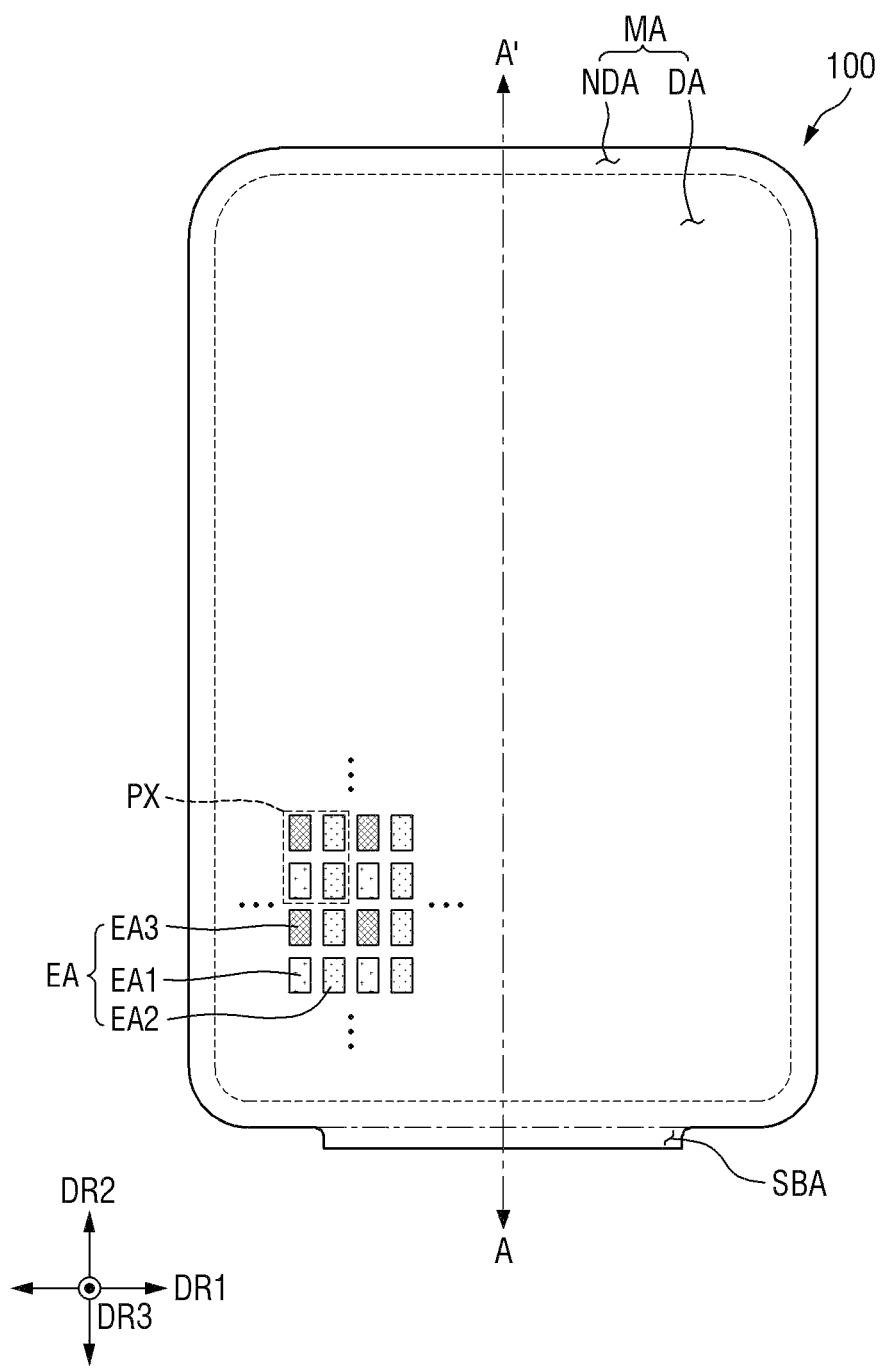
FIG. 2 is a plan view illustrating the display device of FIG. 1.
Figure 3:
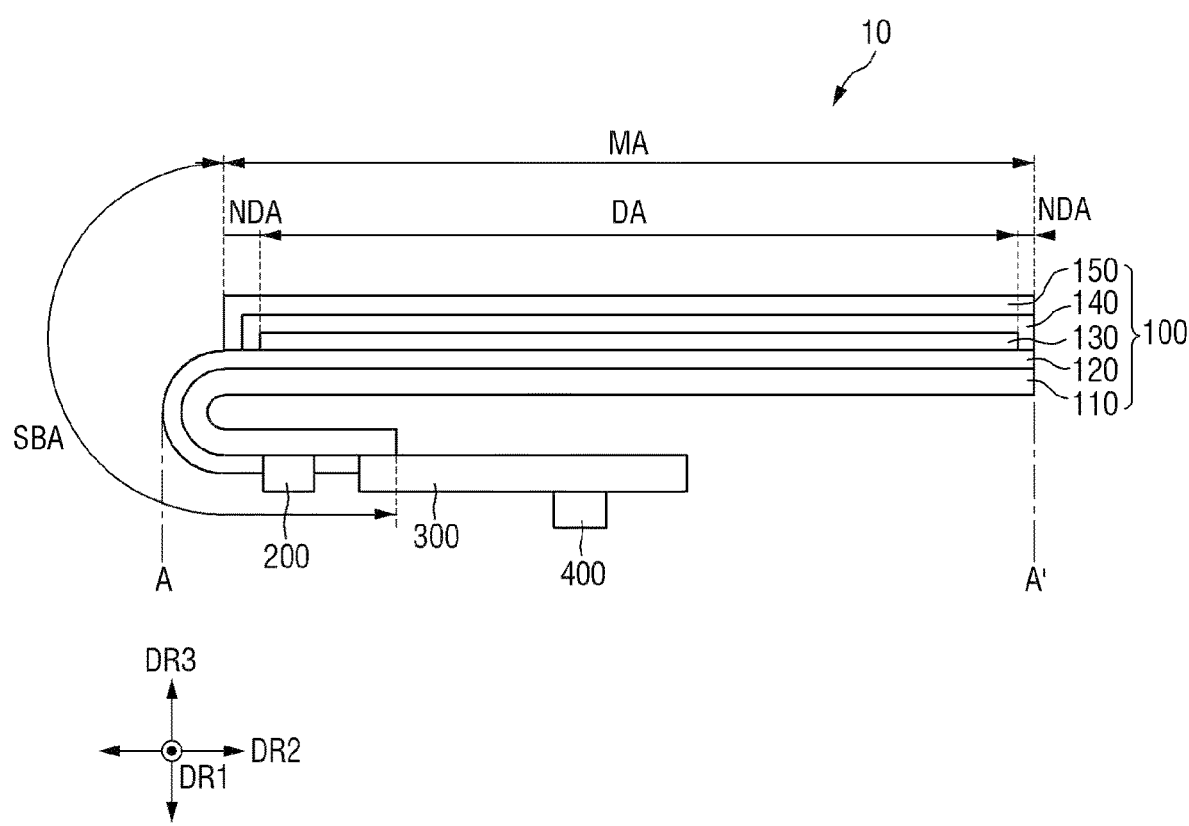
FIG. 3 is a cross-sectional view illustrating an example of a plane taken along the line A-A' of FIG. 2.
Figure 4:
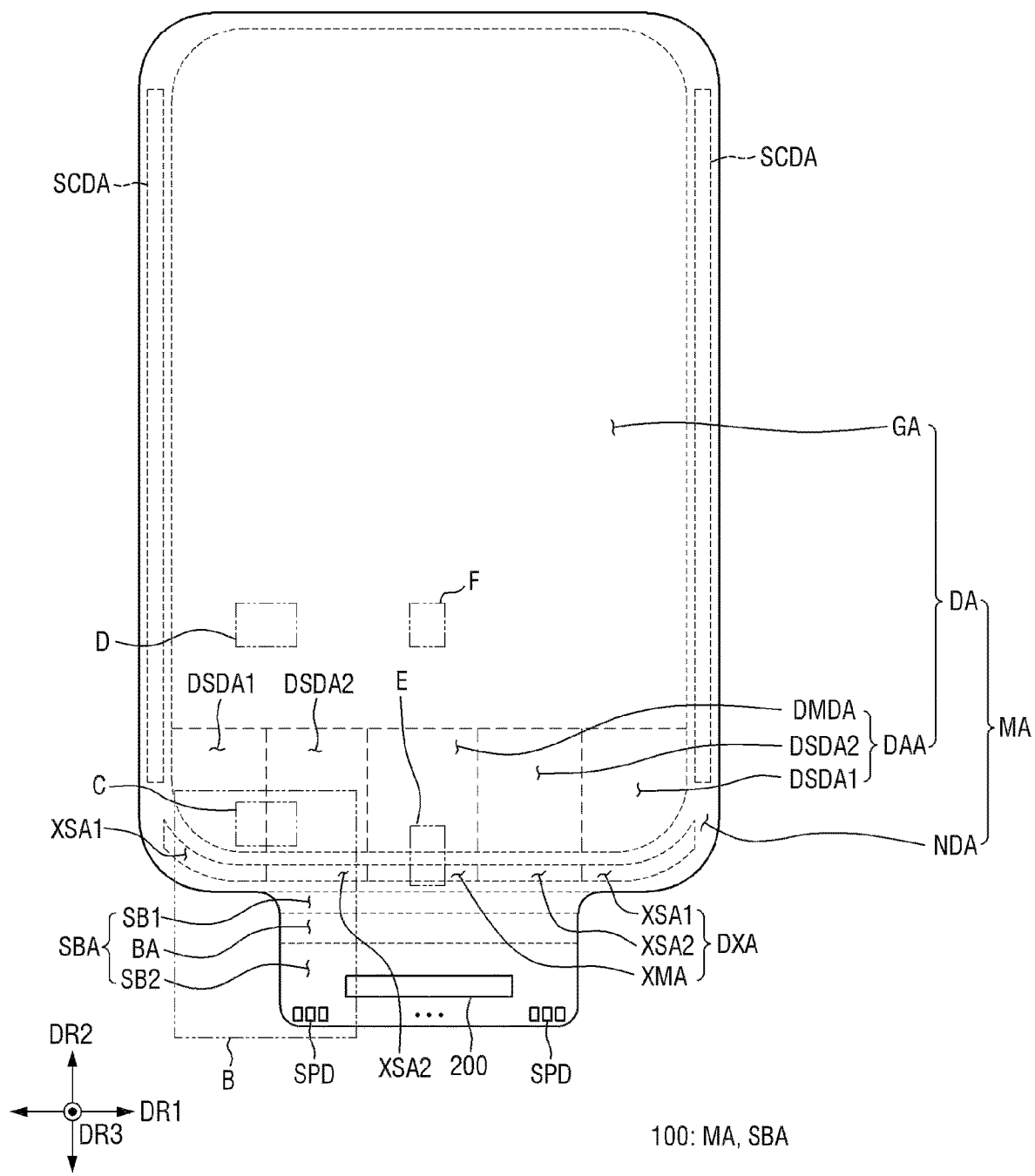
FIG. 4 is a plan view illustrating the main region and the sub-region of the display device of FIG. 1.

FIG. 1 is a perspective view illustrating a display device according to an embodiment. FIG. 2 is a plan view illustrating the display device of FIG. 1. FIG. 3 is a cross-sectional view illustrating an example of a plane taken along the line A-A' of FIG. 2. FIG. 4 is a plan view illustrating the main region and the sub-region of the display device of FIG. 1.

Referring to FIG. 1, a display device 10 is a device for displaying a moving image and/or a still image. The display device 10 may be used as a display screen of various suitable devices, such as a television, a laptop computer, a monitor, a billboard, and an Internet-of-Things (IOT) device, as well as of various suitable portable electronic devices, such as a mobile phone, a smartphone, a tablet personal computer (PC), a smart watch, a watch phone, a mobile communication terminal, an electronic notebook, an electronic book, a portable multimedia player (PMP), a navigation device, and an ultra-mobile PC (UMPC).

The display device 10 may be a light emitting display device, such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). For convenience, hereinafter, the display device 10 may be described in more detail in the context of an organic light emitting display device. However, the present disclosure is not limited thereto, and the display device may include an organic insulating material, an organic light emitting material, and a metal material.

The display device 10 may be formed to be flat or substantially flat, but is not limited thereto. For example, the display device 10 may include a curved portion formed at left and right ends and having a constant or substantially constant curvature or a varying curvature. In addition, the display device 10 may be formed to be flexible, so that it may be curved, bent, folded, or rolled.

The display device 10 may include a display panel 100, a display driving circuit 200, and a circuit board 300.

The display panel 100 includes a display area DA, in which a plurality of emission areas EA (e.g., see FIG. 5) for displaying an image are arranged.

In other words, a substrate 110 (e.g., see FIG. 3) of the display panel 100 may have a main region MA and a sub-region SBA protruding from one side of the main region MA in a second direction DR2. The main region MA may include the display area DA and a non-display area NDA around (e.g., adjacent to) the display area DA. For example, the non-display area NDA may surround (e.g., around a periphery of) the display area DA.

The display driving circuit 200 may be implemented as an integrated circuit chip (IC), and mounted in the sub-region SBA. The display driving circuit 200 may supply data driving signals corresponding to data lines DL (e.g., see FIGS. 5 to 11) of the display panel 100.

The circuit board 300 may be bonded to signal pads SPD (e.g., see FIG. 4) disposed at an edge of the sub-region SBA.

FIGS. 1 and 4 illustrate a state in which the sub-region SBA is unfolded to be disposed side by side with the main region MA. FIGS. 2 and 3 illustrate a state in which a part of the sub-region SBA is bent.

Referring to FIG. 2, the display area DA may be formed in a rectangular shape in a plan view having short sides extending in a first direction DR1 and long sides extending in the second direction DR2 crossing the first direction DR1. A corner where the short side extending in the first direction DR1 and the long side extending in the second direction DR2 meet each other may be rounded to have a suitable curvature (e.g., a predetermined curvature) or may be right-angled. The planar shape of the display area DA is not limited to the rectangular shape, and may be formed in another suitable polygonal shape, a circular shape, or an elliptical shape.

The display area DA may occupy most of the main region MA. The display area DA may be disposed at the center of the main region MA.

The display area DA may include the plurality of emission areas EA arranged side by side with one another. In addition, the display area DA may further include a non-emission area NEA (e.g., see FIG. 14), which is a separation region between the plurality of emission areas EA.

The plurality of emission areas EA may be arranged side by side with one another in the first direction DR1 and the second direction DR2.

Each of the plurality of emission areas EA may have a rhombus planar shape or a rectangular planar shape. However, the present disclosure is not limited thereto, and the planar shape of the plurality of emission areas EA is not limited to that illustrated in FIG. 2. In other words, the plurality of emission areas EA may have a polygonal shape other than a quadrangle, a circular shape, or an elliptical shape in a plan view.

The plurality of emission areas EA may include first emission areas EA1 for emitting light of a first color in a suitable wavelength band (e.g., a predetermined wavelength band), second emission areas EA2 for emitting light of a second color in a wavelength band lower than that of the first color, and third emission areas EA3 for emitting light of a third color in a wavelength band lower than that of the second color.

For example, the first color may be red having a wavelength band of approximately 600 nm to 750 nm. The second color may be green having a wavelength band of approximately 480 nm to 560 nm. The third color may be blue having a wavelength band of approximately 370 nm to 460 nm.

As illustrated in FIG. 2, the first emission areas EA1 and the third emission areas EA3 may be alternately arranged along the first direction DR1 or the second direction DR2. Further, the second emission areas EA2 may be arranged side by side with one another along the first direction DR1 or the second direction DR2.

A plurality of pixels PX for displaying respective luminances and colors may include the plurality of emission areas EA. Each of the plurality of pixels PX may be a basic unit for displaying various suitable colors including white with a desired luminance (e.g., a predetermined luminance).

In other words, each of the plurality of pixels PX may include at least one first emission area EA1, at least one second emission area EA2, and at least one third emission area EA3, which are adjacent to each other.

Each of the plurality of pixels PX may display a luminance and a color obtained by mixing the light emitted from at least one first emission area EA1, at least one second emission area EA2, and at least one third emission area EA3 that are adjacent to each other.

Although FIG. 2 illustrates a case in which the plurality of emission areas EA have the same or substantially the same area (e.g., size) as each other, the present disclosure is not limited thereto. As another example, the third emission area EA3 may have the largest area, and the second emission area EA2 may have the smallest area.

Although FIG. 2 illustrates a case in which the plurality of emission areas EA are arranged side by side with one another in the first direction DR1 and the second direction DR2, the present disclosure is not limited thereto. As another example, the second emission areas EA2 may be adjacent to the first emission area EA1 and the third emission area EA3 in a diagonal direction crossing the first direction DR1 and the second direction DR2.

Referring to FIG. 3, the display panel 100 of the display device 10 includes the substrate 110 including the main region MA and the sub-region SBA, a circuit layer 120 disposed on the substrate 110, and a light emitting element layer 130 disposed on the circuit layer 120.

The circuit layer 120 includes a plurality of pixel drivers PXD (e.g., see FIGS. 10 and 11) respectively corresponding to the plurality of emission areas EA, and data lines DL (e.g., see FIGS. 5 to 12) that transmit data signals to the plurality of pixel drivers PXD.

The light emitting element layer 130 includes a plurality of light emitting elements LEL (e.g., see FIGS. 10, 11, and 14) respectively corresponding to the plurality of emission areas EA. The plurality of light emitting elements LEL may be electrically connected to the plurality of pixel drivers PXD of the circuit layer 120, respectively.

In addition, the display panel 100 of the display device 10 may further include an encapsulation layer 140 covering the light emitting element layer 130, and a sensor electrode layer 150 disposed on the encapsulation layer 140.

The substrate 110 may be formed of an insulating material, such as a polymer resin. For example, the substrate 110 may be formed of polyimide. The substrate 110 may be a flexible substrate that may be bent, folded, or rolled.

As another example, the substrate 100 may be formed of an insulating material, such as glass or the like.

The encapsulation layer 140 is disposed on the circuit layer 120, corresponds to the main region MA, and covers the light emitting element layer 130. The encapsulation layer 140 may include a structure in which two or more inorganic layers and at least one organic layer are alternately stacked.

The sensor electrode layer 150 may be disposed on the encapsulation layer 140, and may correspond to the main region MA. The sensor electrode layer 150 may include touch electrodes for sensing a touch of a person or an object.

The display device 10 may further include a cover window disposed on the sensor electrode layer 150. The cover window may be attached to the sensor electrode layer 150 by a transparent adhesive member, such as an optically clear adhesive (OCA) film or an optically clear resin (OCR). The cover window may include (e.g., may be made of) an inorganic material, such as glass, or an organic material, such as plastic or a polymer material. Due to the cover window, the sensor electrode layer 150, the encapsulation layer 140, the light emitting element layer 130, and the circuit layer 120 may be protected from electrical and physical impacts on the display surface.

In addition, the display device 10 may further include an anti-reflection member disposed between the sensor electrode layer 150 and the cover window. The anti-reflection member may be a polarizing film or a color filter. The anti-reflection member blocks external light reflected from the sensor electrode layer 150, the encapsulation layer 140, the light emitting element layer 130, the circuit layer 120, and the interfaces thereof, so that it may be possible to prevent or substantially prevent a decrease in visibility of an image in the display device 10.

The display device 10 according to an embodiment may further include a touch driving circuit 400 for driving the sensor electrode layer 150.

The touch driving circuit 400 may be provided as an integrated circuit chip (IC).

The touch driving circuit 400 may be electrically connected to the sensor electrode layer 150, while being mounted on the circuit board 300 that is bonded to the signal pads SPD.

As another example, similarly to the display driving circuit 200, the touch driving circuit 400 may be mounted on the second sub-region SB2 of the substrate 110.

The touch driving circuit 400 may apply a touch driving signal to a plurality of driving electrodes provided on the sensor electrode layer 150, may receive a touch sensing signal of each of a plurality of touch nodes through a plurality of sensing electrodes, and may sense a charge change amount of a mutual capacitance based on the touch sensing signal.

In other words, the touch driving circuit 400 may determine whether or not the user's touch occurs, whether or not the user is proximate, and/or the like, according to the touch sensing signals of each of the plurality of touch nodes. The user's touch indicates a direct contact of an object, such as a pen or a user's finger, with the front surface of the display device 10. The proximity of the user indicates that an object, such as a pen or a user's finger, is positioned away (e.g., spaced apart) from the front surface of the display device 10, such as hovering.

Referring to FIG. 4, the sub-region SBA may include a bending area BA that is transformed to be bent, and a first sub-region SB1 and a second sub-region SB2 that are in contact with opposite sides of the bending area BA.

The first sub-region SB1 is disposed between the main region MA and the bending area BA. One side of the first sub-region SB1 may be in contact with the non-display area NDA of the main region MA, and another side of the first sub-region SB1 may be in contact with the bending area BA.

The second sub-region SB2 is spaced apart from the main region MA with the bending area BA interposed therebetween, and is disposed on a bottom surface of the substrate 110 when the bending area BA is transformed to be bent. In other words, the second sub-region SB2 may overlap with the main region MA in a thickness direction DR3 of the substrate 110 due to the bending area BA that is transformed to be bent.

One side of the second sub-region SB2 may be in contact with the bending area BA. Another side of the second sub-region SB2 may be in contact with a part of an edge of the substrate 110.

The signal pads SPD and the display driving circuit 200 may be disposed in the second sub-region SB2.

The display driving circuit 200 may generate signals and voltages for driving the pixel drivers PXD of the display area DA.

The display driving circuit 200 may be provided as an integrated circuit (IC), and mounted on the second sub-region SB2 of the substrate 110 by a chip on glass (COG) method, a chip on plastic (COP) method, or an ultrasonic bonding method, but the present disclosure is not limited thereto. For example, the display driving circuit 200 may be attached onto the circuit board 300 by a chip on film (COF) method.

The circuit board 300 may be attached and electrically connected to the signal pads SPD of the second sub-region SB2 using a low-resistance high-reliability material, such as SAP or an anisotropic conductive film.

The pixel drivers PXD of the display area DA and the display driving circuit 200 may receive digital video data, timing signals, and driving voltages from the circuit board 300.

The circuit board 300 may be a flexible printed circuit board, a printed circuit board, or a flexible film, such as a chip on film.

The non-display area NDA includes a demux area DXA, in which demux circuits DMC (e.g., see FIG. 5) are disposed.

The demux area DXA may be disposed to be adjacent to a corner of the display area DA, which is adjacent to the sub-region SBA, in the second direction DR2.

The non-display area NDA may further include a scan driving circuit area SCDA disposed to be adjacent to at least one edge of the display area DA in the first direction DR1.

The circuit layer 120 may include a scan driving circuit disposed in the scan driving circuit area SCDA. The scan driving circuit may supply scan signals to the scan lines disposed in the first direction DR1 in the display area DA.

For example, the display driving circuit 200 or the circuit board 300 may supply a scan control signal to the scan driving circuit based on digital video data and timing signals.

In addition, the circuit board 300 may supply a constant (e.g., a predetermined constant) or substantially constant voltage for generating the scan signal to the scan driving circuit.

FIG. 4 illustrates a case in which the scan driving circuit area SCDA is a part of the non-display area NDA that is adjacent to two corners of the display area DA in the first direction DR1, but the present disclosure is not limited thereto. In other words, the scan driving circuit area SCDA may be a part of the non-display area NDA that is adjacent to one side of the display area DA in the first direction DR1, or may be divided areas overlapping with some parts of the display area DA.

The demux area DXA may be a part of the non-display area NDA that is adjacent to the sub-region SBA. The demux circuits DMC (e.g., see FIG. 5) are disposed in the demux area DXA. The demux circuits DMC are electrically connected between the display driving circuit 200 and the data lines DL disposed in the second direction DR2 in the display area DA.

In other words, one of the demux circuits DMC may output respective data signals to two or more different data lines DL based on a single data driving signal DDRS (e.g., see FIG. 15) transmitted from the display driving circuit 200.

The single demux circuit DMC (e.g., see FIG. 15) includes an input terminal DIP, which is electrically connected to the display driving circuit 200 and to which the single data driving signal DDRS is input, a higher-priority output terminal AOP from which a first data signal corresponding to the data driving signal is output during a first output period, and a lower-priority output terminal BOP from which a second data signal corresponding to the data driving signal is output during a second output period after the first output period.

Each of the demux circuits DMC (e.g., see FIG. 15) may further include a first demux transistor TDM1 electrically connected between the input terminal DIP and the higher-priority output terminal AOP, and a second demux transistor TDM2 electrically connected between the input terminal DIP and the lower-priority output terminal BOP.

This demux circuit DMC may time-demultiplex the data driving signal DDRS by time-demultiplexing a turn-on period of the demux transistors TDM1 and TDM2, and thus, may be capable of outputting the first data signal and the second data signal corresponding to the data driving signal DDRS during the different time periods.

The demux area DXA may include a demux middle region XMA at the center thereof in the first direction DR1, a first demux side region XSA1 adjacent to an edge of the substrate 110 in the first direction DR1, and a second demux side region XSA2 disposed between the demux middle region XMA and the first demux side region XSA1 in the first direction DR1.

The first demux side region XSA1 may include a curved region XSA11 (e.g., see FIG. 5) formed in a bent shape along the corner of the edge of the substrate 110, and a straight region XSA12 other than the curved region XSA11.

The curved region XSA11 may include a bent shape corresponding to the corner between the first direction DR1 and the second direction DR2.

The straight region XSA12 may include a straight line shape in the first direction DR1. The straight region XSA12 may be disposed between the curved region XSA11 and the second demux side region XSA2.

The demux area DXA may include two second demux side regions XSA2 and two first demux side regions XSA1 disposed on opposite sides of the demux middle region XMA in the first direction DR1.

The display area DA may include a demux adjacent area DAA that is adjacent to the demux area DXA, and a general area GA other than the demux adjacent area DAA. An input bypass line DETL (e.g., see FIG. 5) may be disposed in the demux adjacent area DAA.

The demux adjacent area DAA may include a display middle region DMDA adjacent to the demux middle region XMA in the second direction DR2, a first display side region DSDA1 adjacent to the first demux side region XSA1 in the second direction DR2, and a second display side region DSDA2 adjacent to the second demux side region XSA2 in the second direction DR2.

The display middle region DMDA is a central portion of the demux adjacent area DAA.

The first display side region DSDA1 and the second display side region DSDA2 are portions between the display middle region DMDA and the non-display area NDA.

The first display side region DSDA1 is adjacent to the non-display area NDA, and the second display side region DSDA2 is adjacent to the display middle region DMDA.

Figure 5:
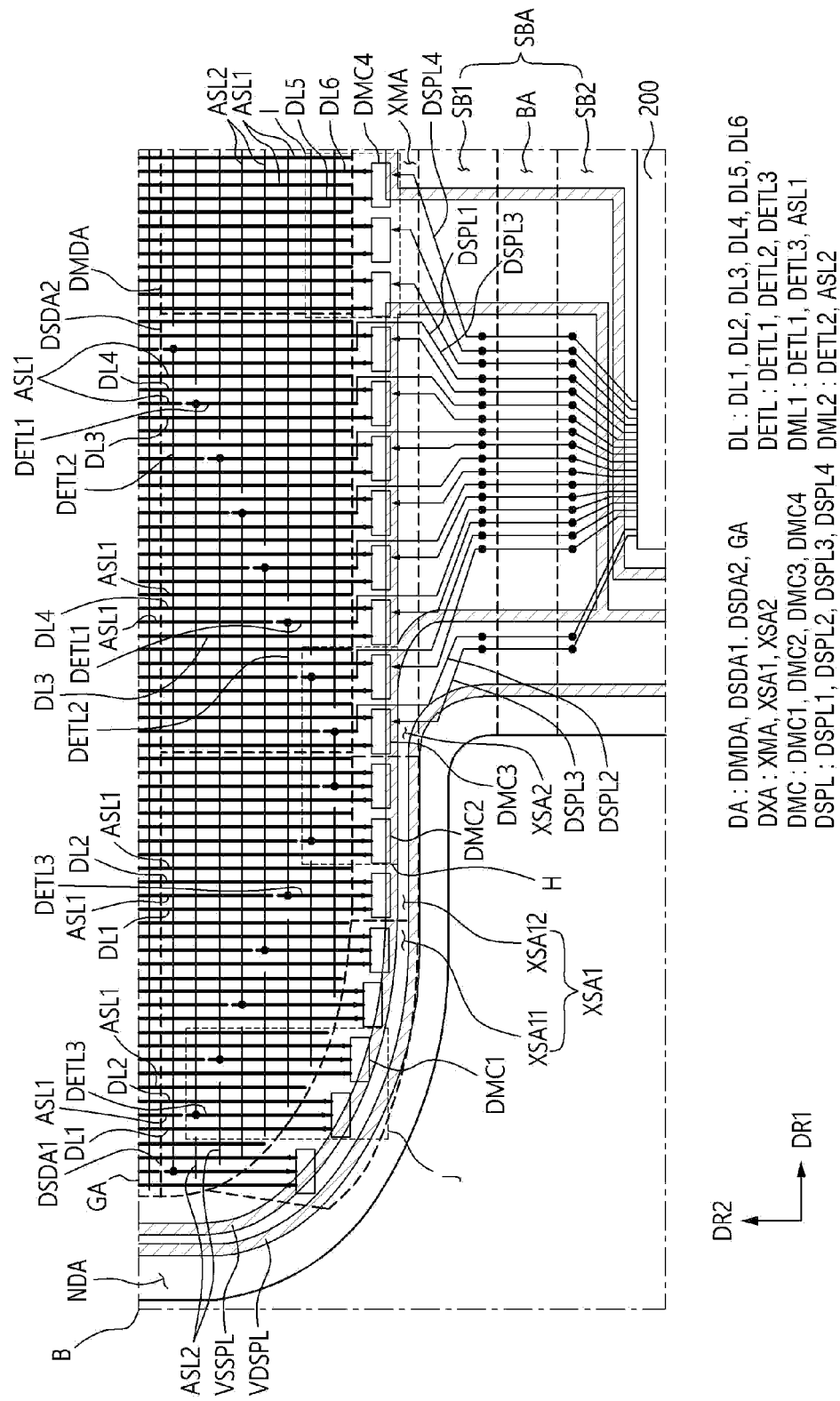
FIG. 5 is a layout diagram showing an example of the part B of FIG. 4.

FIG. 5 is a layout diagram showing an example of the part B of FIG. 4.

As shown in FIGS. 1 to 4, the display device 10 according to an embodiment includes: the substrate 110 including the main region MA having the display area DA in which the emission areas EA are arranged and the non-display area DA around the display area DA, and the sub-region SBA protruding from one side of the main region MA; the circuit layer 120 disposed on the substrate 110; the light emitting element layer 130 disposed on the circuit layer 120; and the display driving circuit 200 disposed in the sub-region SBA of the substrate 110 and configured to supply the data driving signals DDRS corresponding to the data lines DL of the circuit layer 120.

The circuit layer 120 of the display device 10 according to an embodiment includes the pixel drivers PXD respectively corresponding to the emission areas EA, and the data lines DL configured to transmit the data signals to the pixel drivers PXD.

In addition, the light emitting element layer 130 of the display device 10 according to an embodiment includes the light emitting elements LEL respectively corresponding to the emission areas EA.

Referring to FIG. 5, the circuit layer 120 of the display device 10 according to an embodiment further includes the demux circuits DMC disposed side by side with each other in the demux area DXA of the non-display area NDA, and electrically connected between the data lines DL and the display driving circuit 200.

The demux circuits DMC may be arranged along the first direction DR1 in the demux area DXA.

Each of the demux circuits DMC (e.g., see FIG. 15) includes the input terminal DIP to which the data driving signal DDRS of the display driving circuit 200 is input, the higher-priority output terminal AOP from which the first data signal corresponding to the data driving signal is output during the first output period, and the lower-priority output terminal BOP from which the second data signal corresponding to the data driving signal is output during the second output period after the first output period.

Each of the demux circuits DMC (e.g., see FIG. 15) may further include the first demux transistor TDM1 electrically connected between the input terminal DIP and the higher-priority output terminal AOP, and the second demux transistor TDM2 electrically connected between the input terminal DIP and the lower-priority output terminal BOP.

The demux circuits DMC include a first demux circuit DMC1 disposed in the curved region XSA11 of the first demux side region XSA1 that is relatively more adjacent to the corner of the edge of the substrate 110.

Also, the demux circuits DMC may further include a second demux circuit DMC2 disposed in the straight region XSA12 of the first demux side region XSA1, a third demux circuit DMC3 disposed in the second demux side region XSA2, and a fourth demux circuit DMC4 disposed in the demux middle region XMA.

The circuit layer 120 of the display device 10 according to an embodiment may further include a higher-priority output connection line AOL that electrically connects the higher-priority output terminal AOP of each of the demux circuits DMCs to one data line (e.g., one of data lines DL1, DL3, and DL5), and a lower-priority output connection line BOL that electrically connects the lower-priority output terminal BOP of each of the demux circuits to another data line (e.g., one of data lines DL2, DL4, and DL6).

In other words, the circuit layer 120 (e.g., see FIG. 20) includes a first higher-priority output connection line AOPL1 electrically connected to the higher-priority output terminal AOP of the first demux circuit DMC1 and extending to the display area DA, and a first lower-priority output connection line BOPL1 electrically connected to the lower-priority output terminal BOP of the first demux circuit DMC1 and extending to the display area DA.

In addition, the circuit layer 120 (e.g., see FIG. 20) further includes a first input connection line ICNL1 electrically connected to the input terminal DIP of the first demux circuit DMC1.

According to an embodiment, the first higher-priority output connection line AOPL1, the first lower-priority output connection line BOPL1, and the first input connection line INCL1 may extend from the curved region XSA11 to the display area DA, and may be arranged side by side with one another in the first direction DR1. One of the first higher-priority output connection line AOPL1, the first lower-priority output connection line BOPL1, or the first input connection line INCL1 is formed of the same conductive layer CDL5 (e.g., see FIG. 13) as that of the data lines DL, while the others are formed of a conductive layer different from that of the data lines DL. As a result, the first higher-priority output connection line AOPL1, the first lower-priority output connection line BOPL1, and the first input connection line INCL1 are spaced apart from each other not only in the first direction DR1, but also in the third direction DR3, so that the distance between the first higher-priority output connection line AOPL1, the first lower-priority output connection line BOPL1, and the first input connection line INL1 may be increased. Therefore, poor coupling between the first higher-priority output connection line AOPL1, the first lower-priority output connection line BOPL1, and the first input connection line INCL1 may be reduced. This will be described in more detail below with reference to FIGS. 20 to 30.

The circuit layer 120 (e.g., see FIG. 17) may further include a second higher-priority output connection line AOPL2 electrically connected to the higher-priority output terminal AOP of the second demux circuit DMC2 disposed in the straight region XSA12 of the first demux side region XSA1 and extending to the display area DA, a second lower-priority output connection line BOPL2 electrically connected to the lower-priority output terminal BOP of the second demux circuit DMC2 and extending to the display area DA, and a second input connection line ICNL2 electrically connected to the input terminal DIP of the second demux circuit DMC2.

The circuit layer 120 (e.g., see FIG. 17) may further include a third higher-priority output connection line AOPL3 electrically connected to the higher-priority output terminal AOP of the third demux circuit DMC3 disposed in the second demux side region XSA2 and extending to the display area DA, a third lower-priority output connection line BOPL3 electrically connected to the lower-priority output terminal BOP of the third demux circuit DMC3 and extending to the display area DA, a fourth higher-priority output connection line AOPL4 (e.g., see FIG. 19) electrically connected to the higher-priority output terminal AOP of the fourth demux circuit DMC4 disposed in the demux middle region XMA and extending to the display area DA, and a fourth lower-priority output connection line BOPL4 electrically connected to the lower-priority output terminal BOP of the fourth demux circuit DMC4 and extending to the display area DA.

The circuit layer 120 of the display device 10 according to an embodiment may further include circuit output lines DSPL extending from the second sub-region SB2 to the demux area DXA to electrically connect each of the demux circuits DMC to the display driving circuit 200.

The display driving circuit 200 may be disposed in the second sub-region SB2.

Accordingly, each of the circuit output lines DSPL may include a portion disposed in the second sub-region SB2 and electrically connected to the output terminal of the display driving circuit 200, a portion disposed in the bending area BA, and a portion extending from the first sub-region SB1 to the non-display area NDA.

The first input connection line ICNL1 (e.g., see FIG. 15 and FIG. 20) and the second input connection line ICNL2 (e.g., see FIG. 17) respectively connected to the first demux circuit DMC1 and the second demux circuit DMC2 disposed in the first demux side region XSA1 may be electrically connected to a first circuit output line DSPL1 and a second circuit output line DSPL2, respectively, from among the circuit output lines DSPL through the input bypass line DETL disposed in the display area DA.

In other words, the first input connection line ICNL1 connected to the input terminal DIP of the first demux circuit DMC1 disposed in the curved region XSA1 of the first demux side region XSA1 may be electrically connected to the first circuit output line DSPL1 from among the circuit output lines DSPL through the input bypass line DETL disposed in the display area DA.

Similarly, the second input connection line ICNL2 (e.g., see FIG. 17) connected to the input terminal DIP of the second demux circuit DMC2 disposed in the straight region XSA12 of the first demux side region XSA1 may be electrically connected to the second circuit output line DSPL2 through the input bypass line DETL disposed in the display area DA.

Accordingly, each of the first circuit output line DSPL1 and the second circuit output line DSPL2 may not extend to the first demux side region XSA1, but may extend to the second demux side region XSA2 to be electrically connected to the input bypass line DETL in the second display side region DSDA2.

The input terminal DIP of the third demux circuit DMC3 disposed in the second demux side region XSA2 may be electrically connected directly to a third circuit output line DSPL3 from among the circuit output lines DSPL.

Similarly, the input terminal DIP of the fourth demux circuit DMC4 disposed in the demux middle region XMA may be electrically connected directly to a fourth circuit output line DSPL4 from among the circuit output lines DSPL.

Because the first circuit output line DSPL1 and the second circuit output line DSPL2 are electrically connected to the first input connection line ICNL1 and the second input connection line ICNL2, respectively, through the input bypass line DETL, they may extend not to the first demux side region XSA1 but to the second demux side region XSA2. Accordingly, the first circuit output line DSPL1 and the second circuit output line DSPL2 may be disposed to be adjacent to the third circuit output line DSPL3.

As described above, according to an embodiment, the circuit layer 120 may further include the input bypass line DETL.

The data lines DL disposed in the display area DA may extend in the second direction DR2.

The input bypass line DETL may include a first bypass line DETL1 electrically connected to the first circuit output line DSPL1 and extending in the second direction DR2, a second bypass line DETL2 electrically connected to the first bypass line DETL1 and extending in the first direction DR1, and a third bypass line DETL3 electrically connected to the second bypass line DETL2 and extending in the second direction DR2 toward the first demux side region XSA1 of the demux area DXA. In other words, the third bypass line DETL3 may electrically connect the first input connection line ICNL1 or the second input connection line ICNL2 to the second bypass line DETL2.

The first bypass line DETL1 may be disposed in the second display side region DSDA2 adjacent to the second demux side region XSA2.

The third bypass line DETL3 may be disposed in the first display side region DSDA1 adjacent to the first demux side region XSA1.

As described above, the first demux circuit DMC1 and the second demux circuit DMC2 disposed in the first demux side region XSA1 adjacent to the bent corner of the edge of the substrate 110 are not directly connected electrically to the first circuit output line DSPL1 and the second circuit output line DSPL2, respectively. Therefore, the first circuit output line DSPL1 and the second circuit output line DSPL2 may not extend to the first demux side region XSA1.

In other words, the first circuit output line DSPL1 and the second circuit output line DSPL2 are not disposed in the first demux side region XSA1.

Accordingly, the width of the first demux side region XSA1 including the portion bent along the corner of the substrate 110 may be reduced, so that the width of the non-display area NDA may be reduced.

According to an embodiment, the circuit layer 120 may further include a first power supply line VDSPL and a second power supply line VSSPL disposed in the non-display area NDA to supply a first power and a second power, respectively, for driving the light emitting elements LEL of the light emitting element layer 130.

The first power supply line VDSPL and the second power supply line VSSPL may extend from the second sub-region SB2 to the non-display area NDA, and may be electrically connected to power pads disposed in the second sub-region SB2, respectively.

The data lines DL of the display area DA may include the first data line DL1 and the second data line DL2 extending in the second direction DR2 in the first display side region DSDA1, the third data line DL3 and the fourth data line DL4 extending in the second direction DR2 in the second display side region DSDA2, and the fifth data line DL5 and the sixth data line DL6 extending in the second direction DR2 in the display middle region DMDA.

The first data line DL1 and the second data line DL2 may be electrically connected to the output terminals AOP and BOP, respectively, of either one of the first demux circuit DMC1 or the second demux circuit DMC2 disposed in the first demux side region XSA1.

In other words, each of the first demux circuit DMC1 and the second demux circuit DMC2 may be electrically connected to the first data line DL1 and the second data line DL2 that are alternately arranged in the first display side region DSDA1.

The third data line DL3 and the fourth data line DL4 may be electrically connected to the output terminals AOP and BOP, respectively, of the third demux circuit DMC3 disposed in the second demux side region XSA2.

The fifth data line DL5 and the sixth data line DL6 may be electrically connected to the output terminals AOP and BOP, respectively, of the fourth demux circuit DMC4 disposed in the demux middle region XMA.

As described above, the circuit layer 120 according to an embodiment includes the input bypass line DETL disposed in the display area DA. However, because the input bypass line DETL is disposed only in the first display side region DSDA1 and the second display side region DSDA2 in the display area DA, display quality may be deteriorated when the presence or absence of the input bypass line DETL is recognized.

As such, the circuit layer 120 of the display device 10 according to an embodiment may further include first dummy lines DML1 respectively adjacent to the data lines DL and extending in the second direction DR2, and second dummy lines DML2 extending in the first direction DR1, such that the recognition of the presence or absence of the input bypass line DETL may be prevented or substantially prevented.

The first dummy lines DML1 may include the first bypass line DETL1 and the third bypass line DETL3 of the input bypass line DETL that extend in the second direction DR2, and first auxiliary lines ASL1 other than the first bypass line DETL1 and the third bypass line DETL3.

The second dummy lines DML2 may include the second bypass line DETL2 of the input bypass line DETL that extends in the first direction DR1, and second auxiliary lines ASL2 other than the second bypass line DETL2.

In addition, as the first circuit output line DSPL1 and the second circuit output line DSPL2 extend to the second demux side region XSA2, the first bypass line DETL1 of the input bypass line DETL may be disposed in the second display side region DSDA2.

Accordingly, one of the third data line DL3 or the fourth data line DL4 disposed in the second display side region DSDA2 may be adjacent to the first bypass line DETL1 of the input bypass line DETL, and the other may be adjacent to the first auxiliary line ASL1. For example, the first bypass line DETL1 may be disposed between the third data line DL3 and the fourth data line DL4.

Also, one of the first data line DL1 or the second data line DL2 disposed in the first display side region XSA1 may be adjacent to the third bypass line DETL3 of the input bypass line DETL, and the other may be adjacent to the first auxiliary line ASL1. For example, the third bypass line DETL3 may be disposed between the first data line DL1 and the second data line DL2.

Because the first bypass line DETL1 and the third bypass line DETL3 extend to be connected to the second bypass line DETL2, some of the first auxiliary lines ASL1 may be disposed side by side in the second direction DR2 on one side of the first bypass line DETL1 and on one side of the third bypass line DETL3, respectively.

In addition, because the second bypass line DETL2 extends to be connected to the first bypass line DETL1 and the third bypass line DETL3, some of the second auxiliary lines ASL2 may be arranged side by side in the first direction DR1 on both sides of the second bypass line DETL2.

The first auxiliary line ASL1 and the second auxiliary line ASL2 may be electrically connected to each other, and may be electrically connected to the second power supply line VSSPL.

As such, an RC delay of the second power supply may be reduced by the first auxiliary line ASL1 and the second auxiliary line ASL2.

In addition, according to an embodiment, a part of the first power supply line VDSPL and a part of the second power supply line VSSPL may be disposed in the demux area DXA. As such, even if the demux area DXA is further included, the width of the non-display area NDA may be increased by an increment smaller than the width of the demux area DXA.

Figure 6:
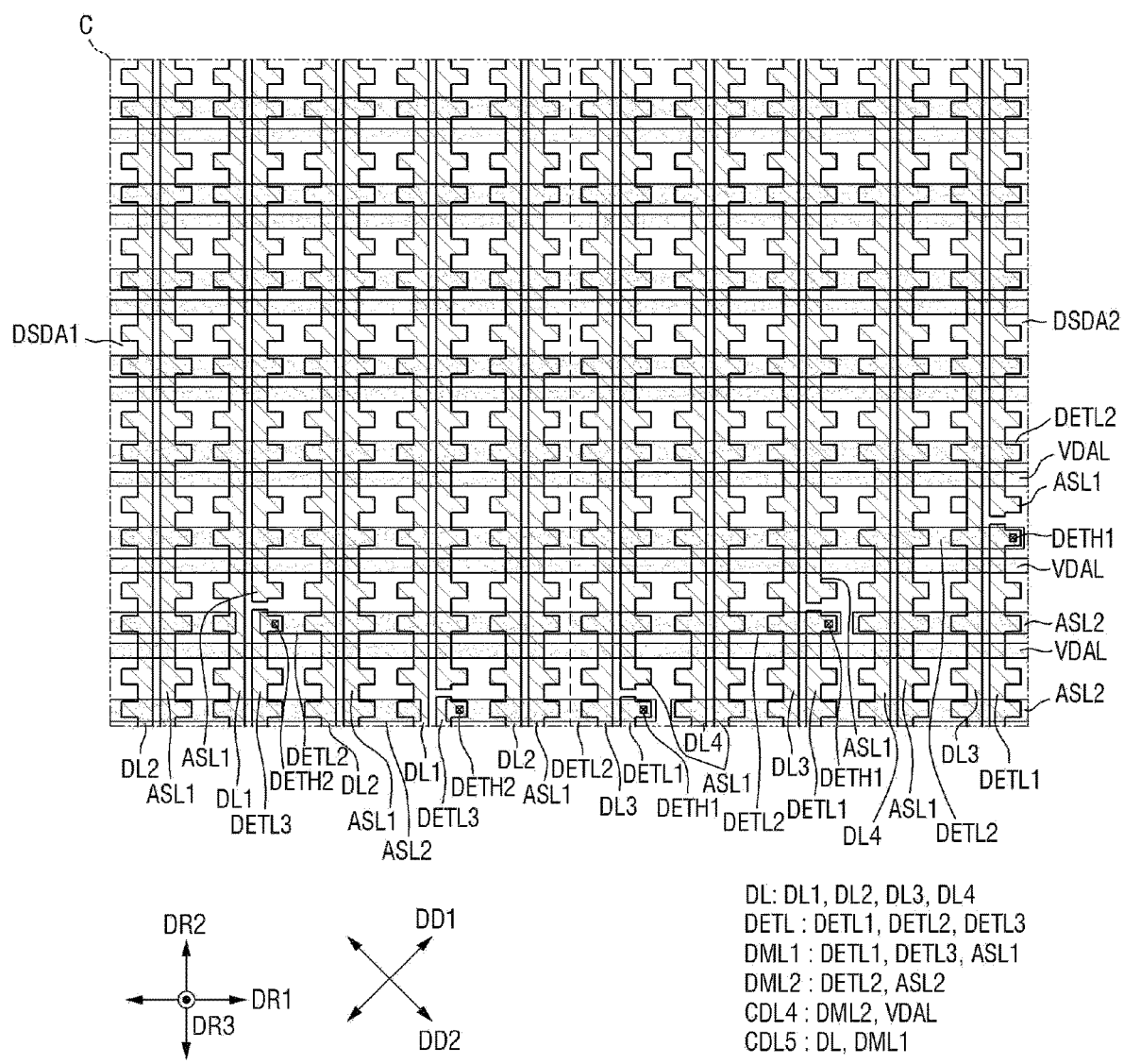
FIG. 6 is a plan view illustrating an example of data lines, first dummy lines, second dummy lines, and first power auxiliary lines disposed in the part C of FIG. 4.
Figure 7:
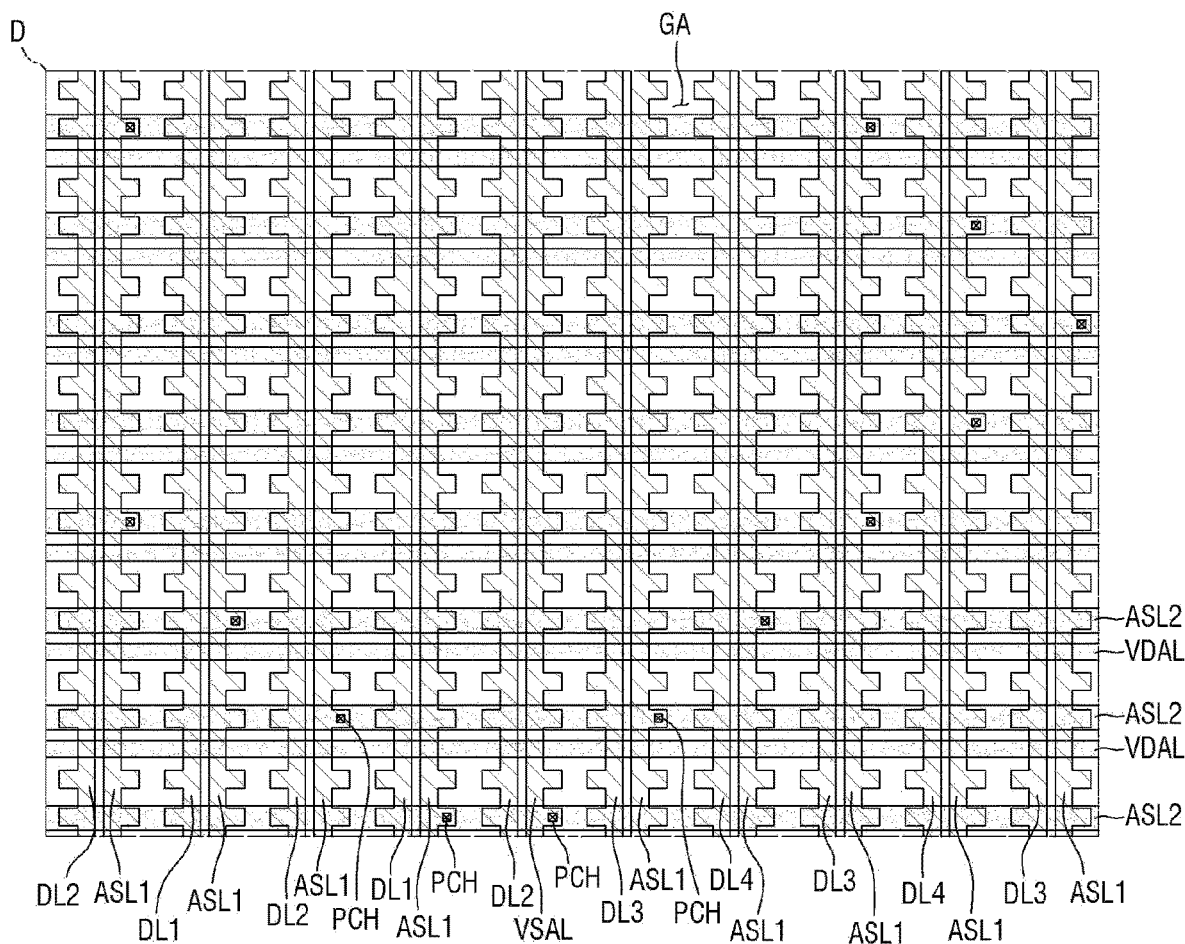
FIG. 7 is a plan view illustrating an example of data lines, first dummy lines, second dummy lines, and first power auxiliary lines disposed in the part D of FIG. 4.

FIG. 6 is a plan view illustrating an example of data lines, first dummy lines, second dummy lines, and first power auxiliary lines disposed in the part C of FIG. 4. FIG. 7 is a plan view illustrating an example of data lines, first dummy lines, second dummy lines, and first power auxiliary lines disposed in the part D of FIG. 4.

FIG. 6 illustrates a part of the first display side region DSDA1, a part of the second display side region DSDA2, and a boundary between the first display side region DSDA1 and the second display side region DSDA2 of FIG. 4.

FIG. 7 shows a part of the general area GA parallel to a part of the first display side region DSDA1 and a part of the second display side region DSDA2 shown in FIG. 6 in the second direction DR2.

Referring to FIGS. 6 and 7, the first data line DL1 and the second data line DL2 electrically connected to either one of the first demux circuit DMC1 or the second demux circuit DMC2 disposed in the first demux side region XSA1 extend from the first display side region DSDA1 to the general area GA in the second direction DR2.

The first data line DL1 and the second data line DL2 may be adjacent to the third bypass line DETL3 of the input bypass line DETL or the first auxiliary line ASL1.

In other words, on one side in the first direction DR1 (e.g., the right side of FIGS. 6 and 7), a part of the first data line DL1 may be adjacent to the third bypass line DETL3, another part of the first data line DL1 may be adjacent to the first auxiliary line ASL1, and the second data line DL2 may be adjacent to the first auxiliary line ASL1.

In addition, the third data line DL3 and the fourth data line DL4 electrically connected to the third demux circuit DMC3 disposed in the second demux side region XSA2 extend from the second display side region DSDA2 to the general area GA in the second direction DR2.

The third data line DL3 and the fourth data line DL4 may be adjacent to the first bypass line DETL1 of the input bypass line DETL or the first auxiliary line ASL1.

In other words, on one side in the first direction DR1 (e.g., the right side of FIGS. 6 and 7), a part of the third data line DL3 may be adjacent to the first bypass line DETL1, another part of the third data line DL3 may be adjacent to the first auxiliary line ASL1, and the fourth data line DL4 may be adjacent to the first auxiliary line ASL1.

Because the second bypass line DETL2 of the input bypass line DETL is for jumping the data lines DL and the first dummy lines DML1, it is formed of a conductive layer different from that of the data lines DL and the first dummy line DML1.

As will be described in more detail below with reference to FIGS. 12 to 14, the circuit layer 120 may have a structure including a semiconductor layer SEL on the substrate 110, a first conductive layer CDL1 on a first gate insulating layer 122 covering the semiconductor layer SEL, a second conductive layer CDL2 on a second gate insulating layer 123 covering the first conductive layer CDL1, a third conductive layer CDL3 on an interlayer insulating layer 124 covering the second conductive layer CDL2, a fourth conductive layer CDL4 on a first planarization layer 125 covering the third conductive layer CDL3, a fifth conductive layer CDL5 on a second planarization layer 126 covering the fourth conductive layer CDL4, and a third planarization layer 127 covering the fifth conductive layer CDL5.

The data lines DL and the first dummy lines DL1 may be formed of the fifth conductive layer CDL5. The second dummy lines DML2 may be formed of the fourth conductive layer CDL4.

One end of the second bypass line DETL2 of the input bypass line DETL may be electrically connected to the first bypass line DETL1 through a first bypass connection hole DETH1 disposed in the second display side region DSDA2.

The other end of the second bypass line DETL2 may be electrically connected to the third bypass line DETL3 through a second bypass connection hole DETH2 disposed in the first display side region DSDA1.

In the second display side region DSDA2, the first bypass connection holes DETH1 may be arranged side by side with one another in a first diagonal direction DD1.

In the first display side region DSDA1, the second bypass connection holes DETH2 may be arranged side by side with one another in a second diagonal direction DD2.

With this configuration, it can be relatively easily inferred from the arrangement of the first bypass connection holes DETH1 and the arrangement of the second bypass connection holes DETH2, whether the first bypass connection holes DETH1 and the second bypass connection holes DETH2 are normally disposed.

The circuit layer 120 of the display device 10 according to an embodiment may further include first power additional lines VDAL disposed in the display area DA, extending in the first direction DR1, formed of the fourth conductive layer CDL4, and electrically connected to the first power supply line VDSPL.

The first power additional lines VDAL are provided to reduce the RC delay during the first power supply.

The first power additional lines VDAL and the second dummy lines DML2 may be alternately arranged in the second direction DR2.

In other words, the second dummy lines DML2 may be adjacent to the first power additional lines VDAL, respectively.

As illustrated in FIG. 7, the first auxiliary lines ASL1 may be electrically connected to the second auxiliary lines ASL2 through power connection holes PCH disposed in a part of the general area GA.

The power connection holes PCH may be arranged side by side with one another in the first diagonal direction DD1 or the second diagonal direction DD2.

In this way, through the arrangement of the power connection holes PCH, it is possible to relatively easily detect whether the power connection holes PCH are normally disposed.

Figure 8:
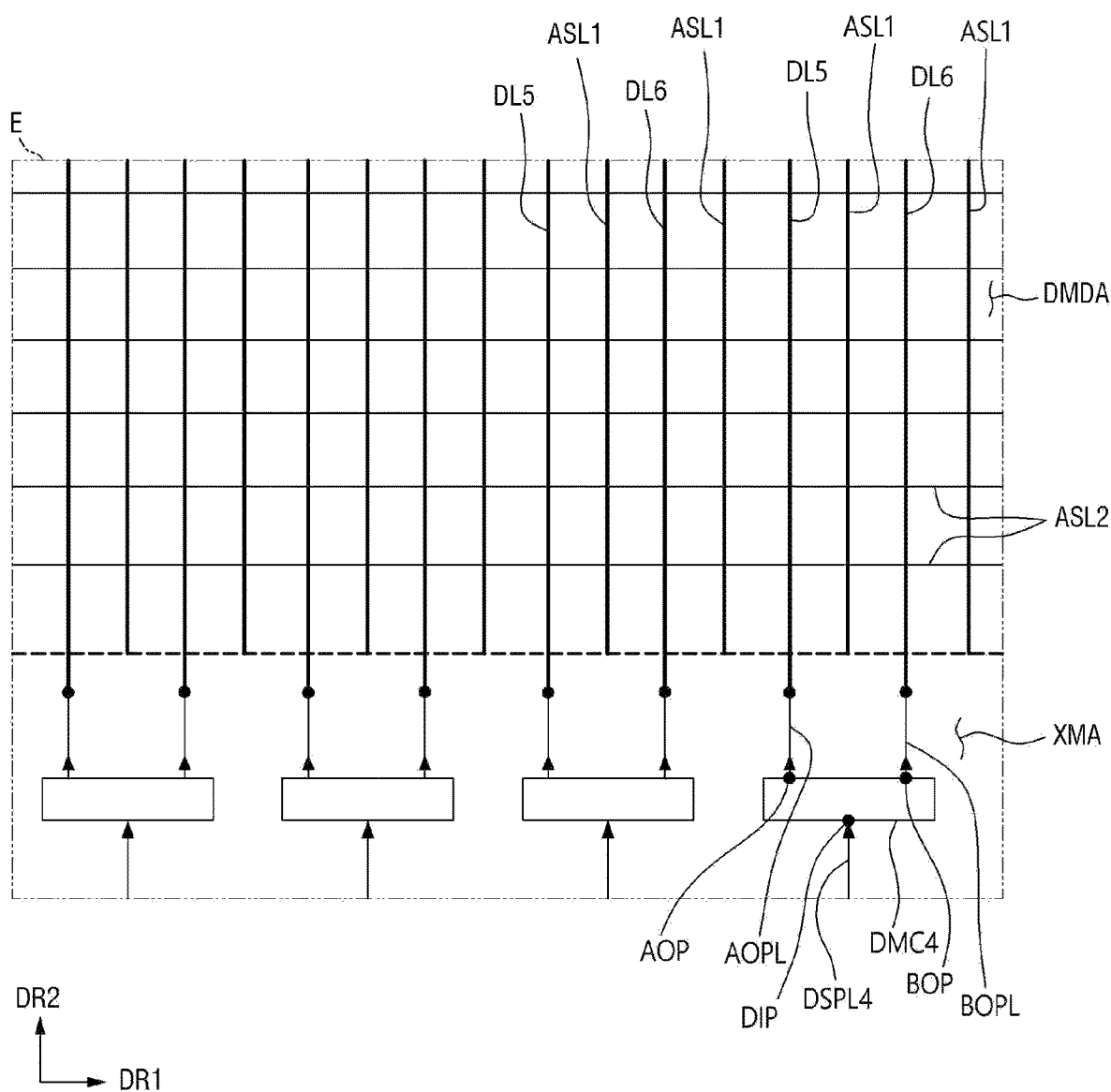
FIG. 8 is a layout diagram showing an example of the part E of FIG. 4.
Figure 9:
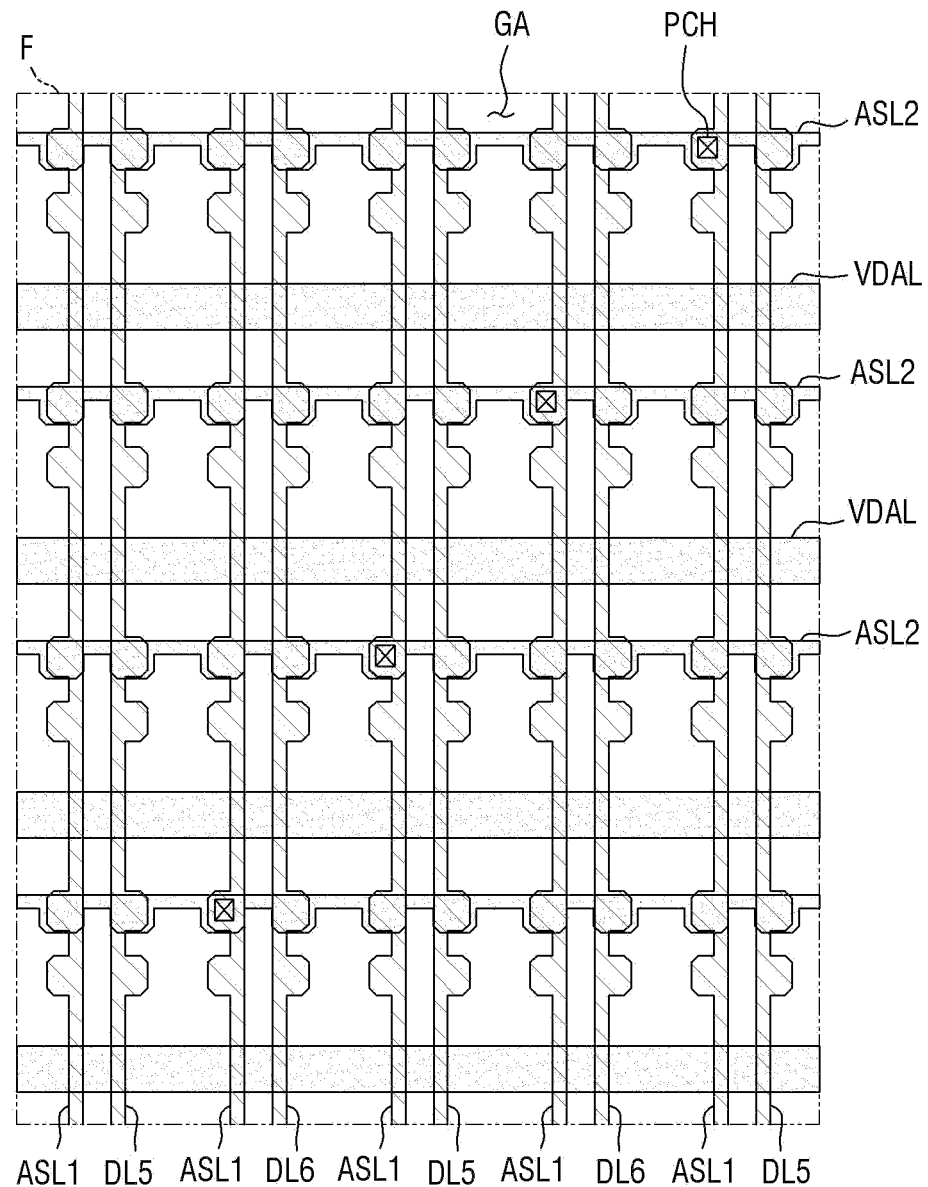
FIG. 9 is a plan view illustrating an example of data lines, first dummy lines, second dummy lines, and first power auxiliary lines disposed in the part F of FIG. 4.

FIG. 8 is a layout diagram showing an example of the part E of FIG. 4. FIG. 9 is a plan view illustrating an example of data lines, first dummy lines, second dummy lines, and first power auxiliary lines disposed in the part F of FIG. 4.

As described above, the demux area DXA may include the demux middle region XMA disposed at the center in the first direction DR1, the first demux side region XSA1 adjacent to the corner of the substrate 110, and the second demux side region XSA2 between the demux middle region XMA and the first demux side region XSA1.

In addition, the demux adjacent area DAA of the display area DA may include the display middle region DMDA adjacent to the demux middle region XMA, the first display side region DSDA1 adjacent to the first demux side region XSA1, and the second display side region DSDA2 adjacent to the second demux side region XSA2.

Referring to FIG. 8, the demux circuits DMC may further include the fourth demux circuit DMC4 disposed in the demux middle region XMA.

The circuit output lines DSPL electrically connected to the display driving circuit 200 may further include the fourth circuit output line DSPL4 electrically connected to the third demux circuit DMC4.

The fourth circuit output line DSPL4 may be electrically connected directly to the input terminal DIP of the fourth demux circuit DMC4.

In addition, the data lines DL may further include the fifth data line DL5 and the sixth data line DL6 electrically connected to the output terminals AOP and BOP of the fourth demux circuit DMC4, respectively, and disposed in the display middle region XMA.

The fifth data line DL5 and the sixth data line DL6 may be electrically connected to the output terminals AOP and BOP of the fourth demux circuit DMC4 through the fourth higher-priority output connection line AOPL and the fourth lower-priority output connection line BOPL, respectively.

Referring to FIG. 9, because the input bypass line DETL is not disposed in the display middle region DMDA, the fifth data line DL5 and the sixth data line DL6 may be respectively adjacent to the first auxiliary lines ASL1.

In the display middle region DMDA, the first power auxiliary lines VDAL may be respectively adjacent to the second auxiliary lines ASL2.

The power connection holes PCH for electrical connection between the first auxiliary lines ASL1 and the second auxiliary lines ASL2 may be further disposed in the display middle region DMDA.

In the display middle region DMDA, the power connection holes PCH may be arranged side by side with one another in the first diagonal direction DD1 or the second diagonal direction DD2.

Figure 10:
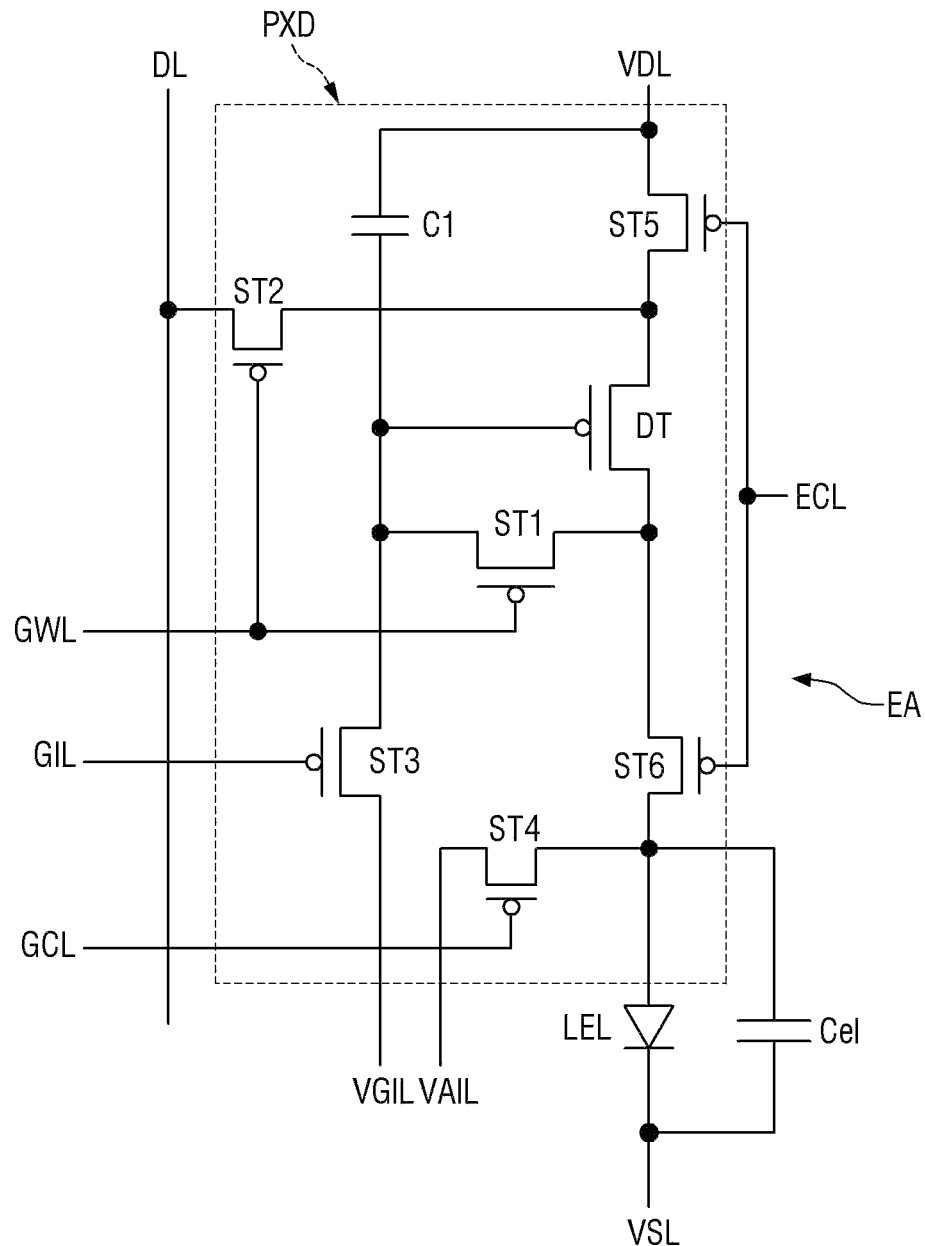
FIG. 10 is an equivalent circuit diagram showing an example of a pixel driver included in an emission area of FIG. 2.
Figure 11:
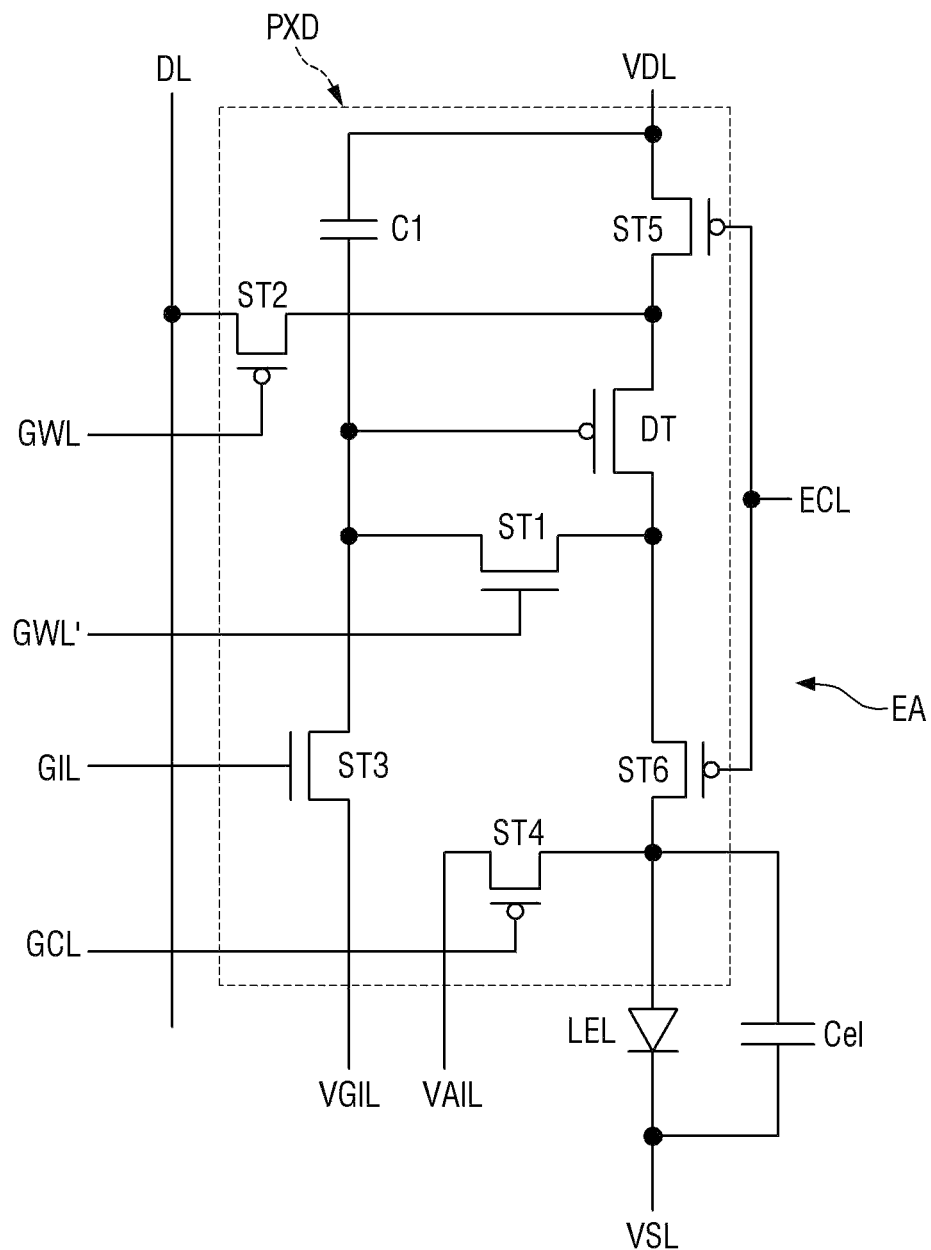
FIG. 11 is an equivalent circuit diagram showing another example of a pixel driver included in an emission area of FIG. 2.

FIG. 10 is an equivalent circuit diagram showing an example of a pixel driver included in an emission area of FIG. 2. FIG. 11 is an equivalent circuit diagram showing another example of a pixel driver included in an emission area of FIG. 2.

The circuit layer 120 includes the pixel drivers PXD respectively corresponding to the emission areas EA. The pixel drivers PXD supply a driving current to the plurality of light emitting elements LEL provided in the light emitting element layer 130, respectively.

Each of the pixel drivers PXD may include a driving transistor DT, at least one switch element, and at least one capacitor.

Referring to FIG. 10, one of the pixel drivers PXD of the circuit layer 120 may include the driving transistor DT, switch elements of a first transistor ST1 (e.g., a switch transistor), a second transistor ST2, a third transistor ST3, a fourth transistor ST4, a fifth transistor ST5, and a sixth transistor ST6, and a capacitor C1.

The scan lines of the circuit layer 120 connected to the scan driving circuit of the scan drive circuit region SCDA may include a write scan line GWL connected to the gate electrode of each of the first transistor ST1 and the second transistor ST2, an initialization scan line GIL connected to the gate electrode of the third transistor ST3, a control scan line GCL connected to the gate electrode of the fourth transistor ST4, and an emission control line ECL connected to the gate electrode of each of the fifth transistor ST5 and the sixth transistor ST6.

The driving transistor DT is connected in series with the light emitting element LEL between a first power line VDL and the second power line VSL.

The first electrode of the driving transistor DT may be connected to the first power line VDL through the fifth transistor ST5.

Also, the first electrode of the driving transistor DT may be connected to the data line DL through the second transistor ST2.

The second electrode of the driving transistor DT may be connected to the light emitting element LEL through the sixth transistor ST6.

The capacitor C1 is connected between the first power line VDL and the gate electrode of the driving transistor DT. In other words, the gate electrode of the driving transistor DT may be connected to the first power line VDL through the capacitor C1.

Accordingly, when the data signal of the data line DL is applied to the first electrode of the driving transistor DT, the driving transistor DT generates a drain-source current corresponding to the data signal. The drain-source current of the driving transistor DT is supplied as a driving current of the light emitting element LEL.

The light emitting element LEL emits light having a luminance corresponding to the driving current of the driving transistor DT.

The light emitting element LEL may include an anode electrode AND (e.g., see FIG. 14) and a cathode electrode CTD disposed to face each other, and a light emitting layer EML between the anode electrode AND and the cathode electrode CTD.

For example, the light emitting element LEL may be an organic light emitting diode having a light emitting layer including (e.g., made of) an organic light emitting material. As another example, the light emitting element LEL may be an inorganic light emitting element including a light emitting layer including (e.g., made of) an inorganic semiconductor. As another example, the light emitting element LEL may be a quantum dot light emitting element having a quantum dot light emitting layer. As another example, the light emitting element LEL may be a micro light emitting diode.

A capacitor Cel connected in parallel with the light emitting element LEL is a parasitic capacitance between the anode electrode and the cathode electrode.

The first transistor ST1 is connected between the gate electrode of the driving transistor DT and the second electrode of the driving transistor DT, and thus, when turned on, diode-connects the driving transistor DT.

The second transistor ST2 is connected between the first electrode of the driving transistor DT and the data line DL.

The gate electrode of each of the first transistor ST1 and the second transistor ST2 is connected to the write scan line GWL.

When a write scan signal is supplied through the write scan line GWL, the first transistor ST1 and the second transistor ST2 are turned on, and the gate electrode and the second electrode of the driving transistor DT are connected to each other to have the same potential as each other through the turned-on first transistor ST1. Further, the data signal of the data line DL is supplied to the first electrode of the driving transistor DT through the turned-on second transistor ST2.

At this time, when the voltage difference between the first electrode and the gate electrode of the driving transistor DT becomes larger than a threshold voltage, the driving transistor DT is turned on to generate a drain-source current between the first electrode and the second electrode of the driving transistor DT.

The third transistor ST3 is connected between the gate electrode of the driving transistor DT and a gate initialization voltage line VGIL. The gate electrode of the third transistor ST3 is connected to the initialization scan line GIL.

When an initialization scan signal is supplied through the initialization scan line GIL, the third transistor ST3 is turned on. At this time, the gate electrode of the driving transistor DT is connected to the gate initialization voltage line VGIL through the turned-on third transistor ST3, so that the potential of the gate electrode of the driving transistor DT is initialized to the first initialization voltage of the gate initialization voltage line VGIL.

The fourth transistor ST4 is connected between the anode electrode of the light emitting element LEL and an anode initialization voltage line VAIL. The gate electrode of the fourth transistor ST4 is connected to the control scan line GCL.

When a control scan signal is supplied through the control scan line GCL, the fourth transistor ST4 is turned on. At this time, the anode electrode of the light emitting element LEL is connected to the anode initialization voltage line VAIL through the turned-on fourth transistor ST4, so that the potential of the anode electrode of the light emitting element LEL is initialized to the second initialization voltage of the anode initialization voltage line VAIL.

The fifth transistor ST5 is connected between the first electrode of the driving transistor DT and the first power line VDL.

The sixth transistor ST6 is connected between the second electrode of the driving transistor DT and the anode electrode of the light emitting element LEL.

The gate electrode of each of the fifth transistor ST5 and the sixth transistor ST6 is connected to the emission control line ECL.

When an emission control signal is supplied through the emission control line ECL, the driving transistor DT and the light emitting element LEL are connected in series between the first power line VDL and the second power line VSL, so that the light emitting element LEL emits light based on the driving current of the driving transistor DT.

As shown in FIG. 10, the driving transistor DT and one or more switch elements ST1 to ST6 provided in the pixel driver PXD may be all implemented as P-type MOSFETs.

In this case, all of the scan lines GWL, GIL, GCL, and ECL may supply low-level turn-on signals.

As another example, unlike the example shown in FIG. 10, some of the one or more switch elements ST1 to ST6 and/or the driving transistor DT provided in the pixel driver PXD may be implemented as P-type MOSFETs, while the others may be implemented as N-type MOSFETs. In this case, the switching elements implemented as P-type MOSFETs and the switching elements implemented as N-type MOSFETs may include active layers of different semiconductor materials from each other. Therefore, the width of the pixel driver PXD may be reduced through the stacked structure, which may help improve the resolution.

For example, as shown in FIG. 11, the pixel driver PXD includes the driving transistor DT and one or more switch elements ST1 to ST6 from among which the driving transistor DT, the second transistor ST2, the fourth transistor ST4, the fifth transistor ST5, and the sixth transistor ST6 are implemented as P-type MOSFETs having an active layer of a polysilicon semiconductor material, while the first transistor ST1 and the third transistor ST3 may be implemented as N-type MOSFETs having an active layer of an oxide semiconductor material.

In this case, unlike the second transistor ST2, because the first transistor ST1 is turned on by a high-level turn-on signal, the gate electrode of the first transistor ST1 may be connected to an additional write scan line GWL' instead of to the write scan line GWL.

As another example, not only the first transistor ST1 and the third transistor ST3 from among the switch elements ST1 to ST6, but also the fourth transistor ST4 may be implemented as an N-type MOSFET. In this case, the control scan line GCL may transmit a high-level turn-on signal.

Figure 12:
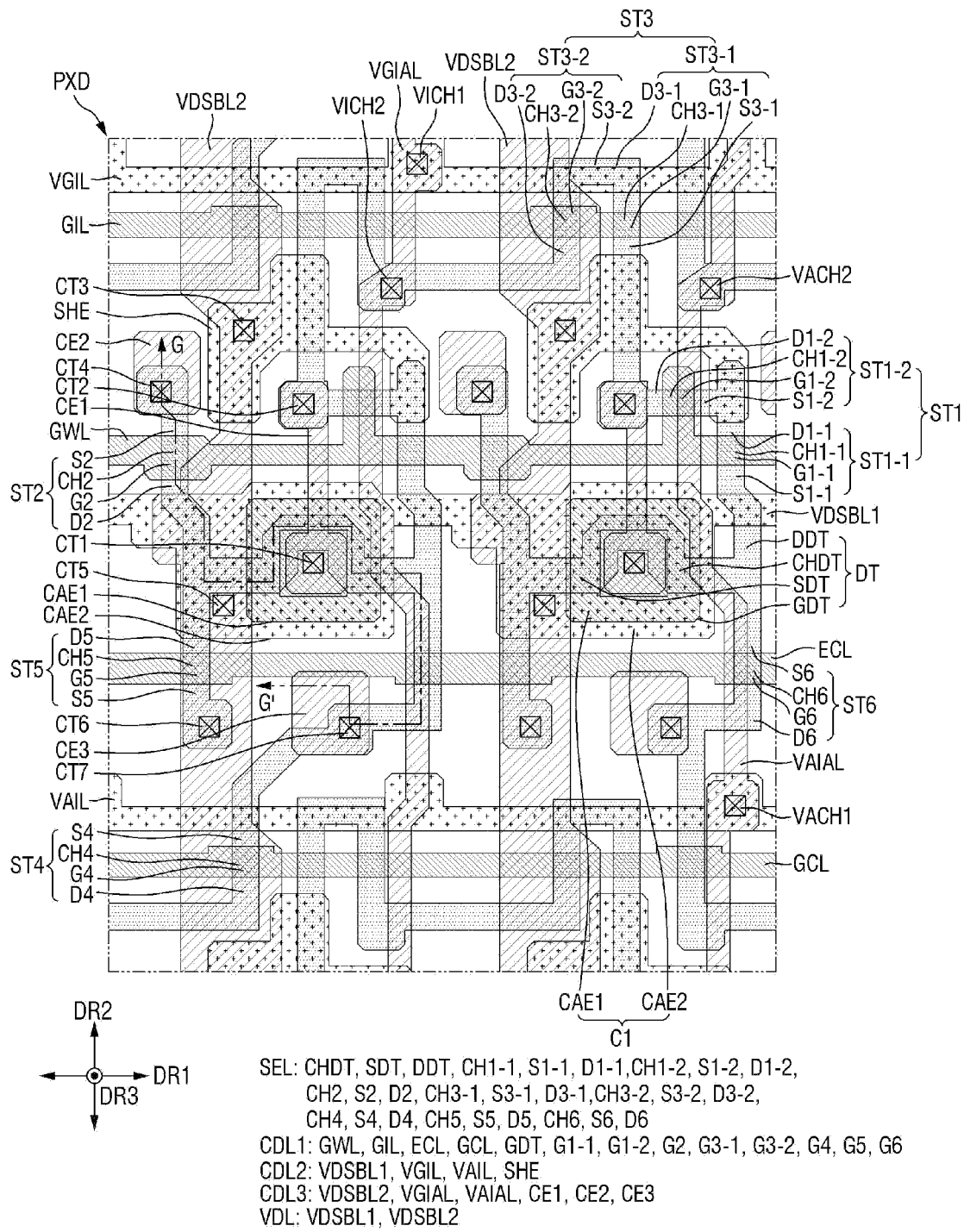
FIG. 12 is a plan view illustrating an example of a semiconductor layer, a first conductive layer, a second conductive layer, and a third conductive layer of two pixel drivers respectively included in two adjacent emission areas of FIG. 2.

FIG. 12 is a plan view illustrating an example of a semiconductor layer, a first conductive layer, a second conductive layer, and a third conductive layer of two pixel drivers respectively included in two adjacent emission areas of FIG. 2. FIG. 13 is a plan view illustrating an example of a semiconductor layer, a first conductive layer, a second conductive layer, a third conductive layer, a fourth conductive layer, and a fifth conductive layer of two pixel drivers respectively included in two adjacent emission areas of FIG. 2. FIG. 14 is a cross-sectional view showing an example of a plane taken along the line G-G' of FIG. 13.

Figure 13:
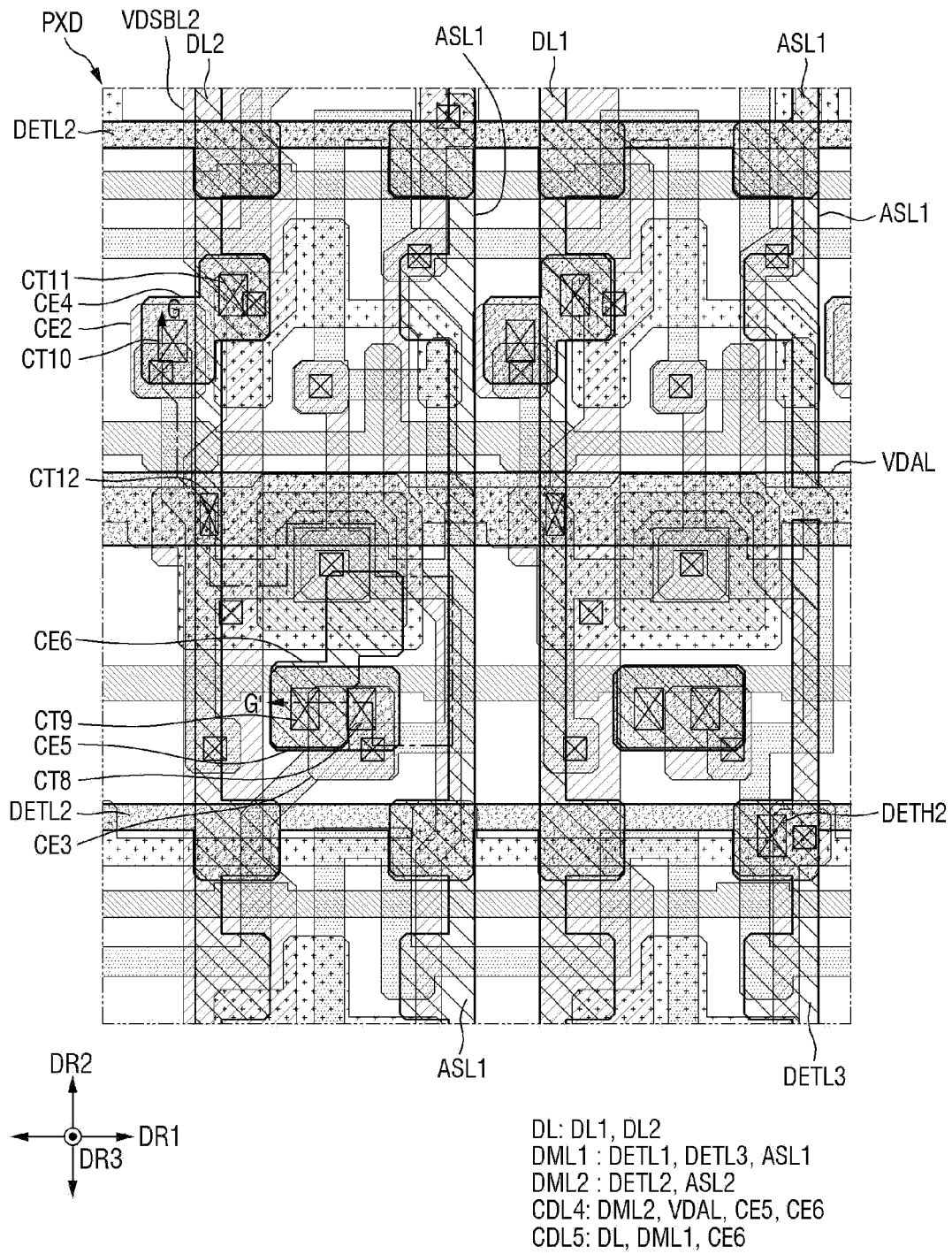
FIG. 13 is a plan view illustrating an example of a semiconductor layer, a first conductive layer, a second conductive layer, a third conductive layer, a fourth conductive layer, and a fifth conductive layer of two pixel drivers respectively included in two adjacent emission areas of FIG. 2.
Figure 14:
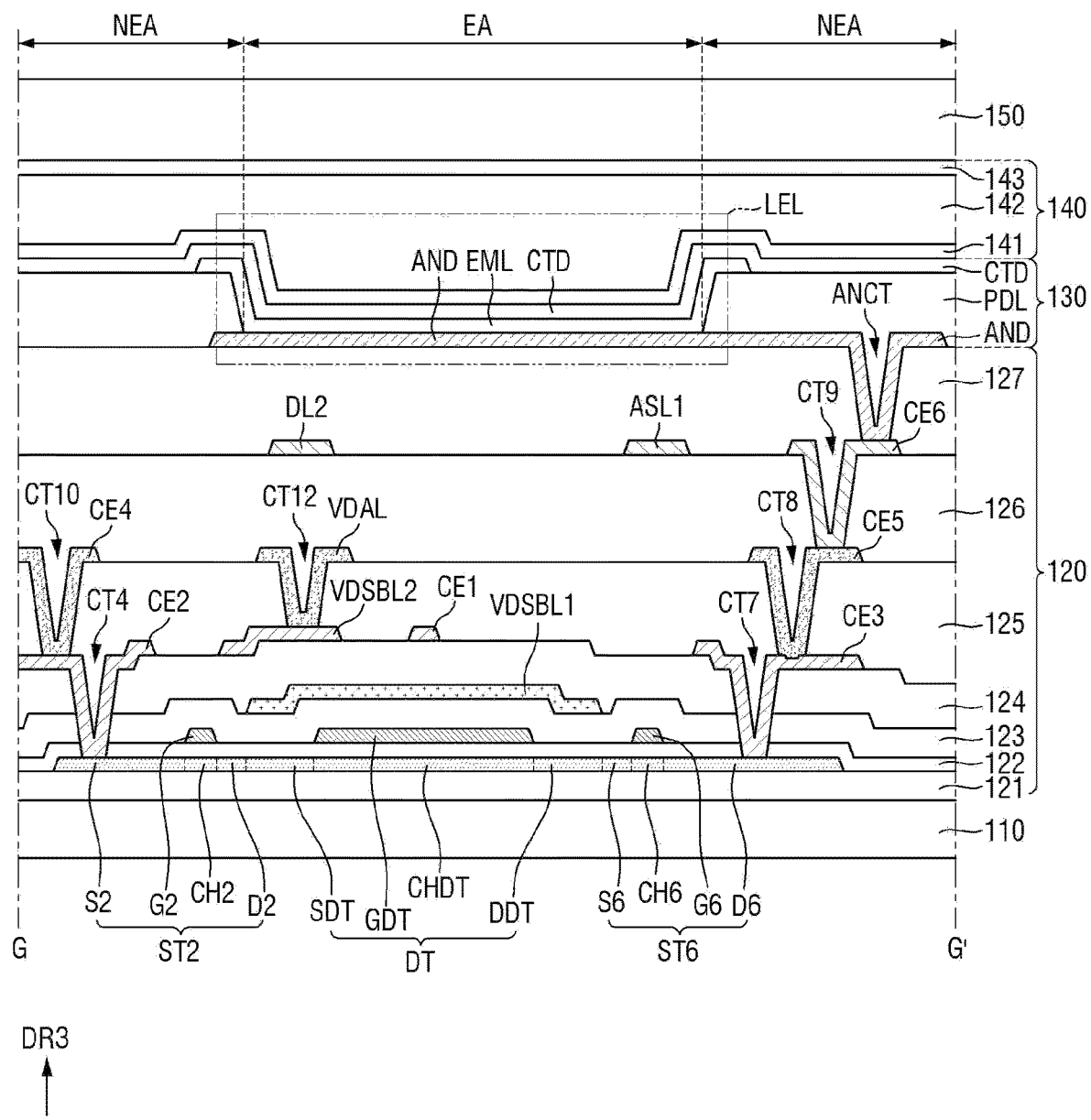
FIG. 14 is a cross-sectional view showing an example of a plane taken along the line G-G' of FIG. 13.

First, referring to FIG. 14, the circuit layer 120 of the display device 10 according to an embodiment may be provided in a structure that includes the semiconductor layer SEL (e.g., see FIG. 12) on the substrate 110, the first conductive layer CDL1 (e.g., see FIG. 12) on the first gate insulating layer 122 (e.g., see FIG. 14) covering the semiconductor layer SEL, the second conductive layer CDL2 (e.g., see FIG. 12) on the second gate insulating layer 123 (e.g., see FIG. 14) covering the first conductive layer CDL1, the third conductive layer CDL3 (e.g., see FIG. 12) on the interlayer insulating layer 124 (e.g., see FIG. 14) covering the second conductive layer CDL2, the fourth conductive layer CDL4 (e.g., see FIG. 13) on the first planarization layer 125 (e.g., see FIG. 14) covering the third conductive layer CDL3, the fifth conductive layer CDL5 on the second planarization layer 126 (e.g., see FIG. 14) covering the fourth conductive layer CDL4, and the third planarization layer 127 (e.g., see FIG. 14) covering the fifth conductive layer CDL5.

Further, the light emitting element layer 130 may be disposed on the third planarization layer 127.

FIGS. 12 and 13 show an example of the pixel drivers PXD of FIG. 10, which correspond to two emission areas EA disposed in a first display side area MDSA1.

Referring to FIG. 12, the semiconductor layer SEL may include channel portions CHDT, CH1-1, CH1-2, CH2, CH3-1, CH3-2, CH4, CH5, and CH6, source electrodes SDT, S1-1, S1-2, S2, S3-1, S3-2, S4, S5, and S6, and drain electrodes DDT, D1-1, D1-2, D2, D3-1, D3-2, D4, D5, and D6 of the driving transistor DT and the first to sixth transistors ST1 to ST6.

The first conductive layer CDL1 may include gate electrodes GDT, G1-1, G1-2, G2, G3-1, G3-2, G4, G5, and G6 of the driving transistor DT and the first to sixth transistors ST1 to ST6.

In addition, the first conductive layer CDL1 may further include scan lines connected to the gate electrodes GDT, G1-1, G1-2, G2, G3-1, G3-2, G4, G5, and G6 of the first to sixth transistors ST1 to ST6, or in other words, the write scan line GWL, the initialization scan line GIL, the emission control line ECL, and the control scan line GCL. The write scan line GWL, the initialization scan line GIL, the emission control line ECL, and the control scan line GCL extend in the first direction DR1.

The second conductive layer CDL2 may include the gate initialization voltage line VGIL that is connected to the drain electrode D3-2 of the third transistor ST3 and transmits a first initialization voltage, and the anode initialization voltage line VAIL that is connected to the drain electrode D4 of the fourth transistor ST4 and transmits a second initialization voltage. The gate initialization voltage line VGIL and the anode initialization voltage line VAIL may extend in the first direction DR1.

The first power line VDL may include a first power horizontal auxiliary line VDSBL1 extending in the first direction DR1, and a first power vertical auxiliary line VDSBL2 extending in the second direction DR2.

The second conductive layer CDL2 may further include the first power horizontal auxiliary line VDSBL1.

The third conductive layer CDL3 may include the first power vertical auxiliary line VDSBL2.

The third conductive layer CDL3 may further include a gate initialization voltage auxiliary line VGIAL and an anode initialization voltage auxiliary line VAIAL.

The gate initialization voltage auxiliary line VGIAL may be electrically connected to the gate initialization voltage line VGIL, and may extend in the second direction DR2.

The anode initialization voltage auxiliary line VAIAL may be electrically connected to the anode initialization voltage line VAIL, and may extend in the second direction DR2.

The first power vertical auxiliary line VDSBL2 may be electrically connected to the first power horizontal auxiliary line VDSBL1.

In more detail, the driving transistor DT may include the channel portion CHDT, the source electrode SDT and the drain electrode DDT connected to opposite sides of the channel portion CHDT, and the gate electrode DTG overlapping with the channel portion CHDT.

The source electrode SDT of the driving transistor DT may be connected to the drain electrode D2 of the second transistor ST2 and the drain electrode D5 of the fifth transistor ST5.

The drain electrode DDT of the driving transistor DT may be connected to the source electrode S1-1 of a first-first transistor ST1-1 and the source electrode S6 of the sixth transistor ST6.

The channel portion CHDT, the source electrode SDT, and the drain electrode DDT of the driving transistor DT may be formed of the semiconductor layer SEL. The source electrode SDT and the drain electrode DDT may be formed of parts of the semiconductor layer SEL, which are made conductive by doping ions or impurities into a semiconductor material.

The gate electrode GDT of the driving transistor DT may be provided as the first conductive layer CDL1.

The first transistor ST1 may include the first-first transistor ST1-1 and the first-second transistor ST1-2 connected in series with each other.

The first-first transistor ST1-1 may include the channel portion CH1-1, the source electrode S1-1 and the drain electrode D1-1 connected to opposite sides of the channel portion CH1-1, and the gate electrode G1-1 that overlaps with the channel portion CH1-1 and is formed of a part of the write scan line GWL.

The source electrode S1-1 of the first-first transistor ST1-1 may be connected to the drain electrode DDT of the driving transistor DT.

The drain electrode D1-1 of the first-first transistor ST1-1 may be connected to the source electrode S1-2 of the first-second transistor ST1-2.

The first-second transistor ST1-2 may include the channel portion CH1-2, the source electrode S1-2 and the drain electrode D1-2 connected to opposite sides of the channel portion CH1-2, and the gate electrode G1-2 that overlaps with the channel portion CH1-2 and is formed of a protrusion of the write scan line GWL.

The source electrode S1-2 of the first-second transistor ST1-2 may be connected to the drain electrode D1-1 of the first-first transistor ST1-1.

The drain electrode D1-2 of the first-second transistor ST1-2 may be connected to the source electrode S3-1 of a third-first transistor ST3-1.

The channel portion CH1-1, the source electrode S1-1 and the drain electrode D1-1 of the first-first transistor ST1-1, and the channel portion CH1-2, the source electrode S1-2, and the drain electrode D1-2 of the first-second transistor ST1-2 may be provided as the semiconductor layer SEL. The source electrodes S1-1 and S1-2 and the drain electrodes D1-1 and D1-2 of the respective first-first transistor ST1-1 and first-second transistor ST1-2 may be formed of parts of the semiconductor layer SEL, which are made conductive by doping ions or impurities into a semiconductor s material.

The gate electrodes G1-1 and G1-2 of the respective first-first transistor ST1-1 and first-second transistor ST1-2 may be formed of different parts of the write scan lines GWL provided as the first conductive layer CDL1.

The gate electrode DTG of the driving transistor DT may be connected to a first connection electrode CE1 through a first contact hole CT1, and the first connection electrode CE1 may be connected to the drain electrode D1-2 of the first-second transistor ST1-2 through a second contact hole CT2.

The first connection electrode CE1 may be formed of the third conductive layer CDL3.

The second transistor ST2 may include the channel portion CH2, the source electrode S2 and drain electrode D2 connected to opposite sides of the channel portion CH2, and the gate electrode G2 that overlaps with the channel portion CH2 and is formed of another part of the write scan line GWL.

The source electrode S2 of the second transistor ST2 may be connected to the second connection electrode CE2 through a fourth contact hole CT4.

The drain electrode D2 of the second transistor ST2 may be connected to the source electrode SDT of the driving transistor DT and the drain electrode D5 of the fifth transistor ST5.

The channel portion CH2, the source electrode S2, and the drain electrode D2 of the second transistor ST2 may be formed of the semiconductor layer SEL. The source electrode S2 and the drain electrode D2 may be formed of parts of the semiconductor layer SEL, which are made conductive by doping ions or impurities into a semiconductor material.

The gate electrode G2 of the second transistor ST2 may be formed of a part of the write scan line GWL provided as the first conductive layer CDL1.

The second connection electrode CE2 may be provided as the third s conductive layer CDL3.

The third transistor ST3 may include the third-first transistor ST3-1 and a third-second transistor ST3-2 connected in series with each other.

The third-first transistor ST3-1 may include the channel portion CH3-1, the source electrode S3-1 and the drain electrode D3-1 connected to opposite sides of the channel portion CH3-1, and the gate electrode G3-1 overlapping with the channel portion CH3-1.

The source electrode S3-1 of the third-first transistor ST3-1 may be connected to the drain electrode D1-2 of the first-second transistor ST1-2.

The drain electrode D3-1 of the third-first transistor ST3-1 may be connected to the source electrode S3-2 of the third-second transistor ST3-2.

The third-second transistor ST3-2 may include the channel portion CH3-2, the source electrode S3-2 and the drain electrode D3-2 connected to opposite sides of the channel portion CH3-2, and the gate electrode G3-2 overlapping with the channel portion CH3-2.

The drain electrode D3-2 of the third-second transistor ST3-2 may be connected to the gate initialization auxiliary line VGIAL through a second initialization contact hole VICH2.

The channel portion CH3-1, the source electrode S3-1, and the drain electrode D3-1 of the third-first transistor ST3-1, and the channel portion CH3-2, the source electrode S3-2, and the drain electrode D3-2 of the third-second transistor ST3-2 may be formed of the semiconductor layer SEL. The source electrodes S3-1 and S3-2 and the drain electrodes D3-1 and D3-2 of the respective third-first transistor ST3-1 and third-second transistor ST3-2 may be formed of parts of the semiconductor layer SEL, which are made conductive by doping ions or impurities into a semiconductor material.

The gate electrodes G3-1 and G3-2 of the respective third-first transistor ST3-1 and third-second transistor ST3-2 may be formed of different parts of the initialization scan line GIL that is provided as the first conductive layer CDL1.

The circuit layer 120 may further include a shielding electrode SHE overlapping with at least a part of the source electrode S3-1 of the third-first transistor ST3-1.

The shielding electrode SHE may be provided as the second conductive layer CDL2.

The shielding electrode SHE may be connected to the first power vertical auxiliary line VDSBL2 through a third contact hole CT3.

The shielding electrode SHE may also overlap with a part of the drain electrode D1-1 of the first-first transistor ST1-1.

The first power vertical auxiliary line VDSBL2 may be connected to the first power horizontal auxiliary line VDSBL1 through the fifth contact hole CT5.

The fourth transistor ST4 may include the channel portion CH4, the source electrode S4 and drain electrode D4 connected to opposite sides of the channel portion CH4, and the gate electrode G4 that overlaps with the channel portion CH4 and is formed of a part of the control scan line GCL.

The source electrode S4 of the fourth transistor ST4 may be connected to the drain electrode D6 of the sixth transistor ST6.

The drain electrode D4 of the fourth transistor ST4 may be connected to the anode initialization auxiliary line VAIAL through a fourth initialization contact hole VACH2.

The channel portion CH4, the source electrode S4, and the drain electrode D4 of the fourth transistor ST4 may be formed of the semiconductor layer SEL. The source electrode S4 and the drain electrode D4 may be formed of parts of the semiconductor layer SEL, which are made conductive by doping ions or impurities into a semiconductor material.

The gate electrode G4 of the fourth transistor ST4 may be formed of a part of the control scan line GCL provided as the first conductive layer CDL1.

The fifth transistor ST5 may include the channel portion CH5, the source electrode S5 and drain electrode D5 connected to opposite sides of the channel portion CH5, and the gate electrode G5 that overlaps with the channel portion CH5 and is formed of a part of the emission control line ECL.

The source electrode S5 of the fifth transistor ST5 may be connected to the first power vertical auxiliary line VDSBL2 through a sixth contact hole CT6.

The drain electrode D5 of the fifth transistor ST5 may be connected to the source electrode SDT of the driving transistor DT.

The sixth transistor ST6 may include the channel portion CH6, the source electrode S6 and drain electrode D6 connected to opposite sides of the channel portion CH6, and the gate electrode G6 that overlaps with the channel portion CH6 and is formed of another part of the emission control line ECL.

The source electrode S6 of the sixth transistor ST6 may be connected to the drain electrode DDT of the driving transistor DT.

The drain electrode D6 of the sixth transistor ST6 may be connected to the source electrode S4 of the fourth transistor ST4, and may be connected to a third connection electrode CE3 through a seventh contact hole CT7.

The third connection electrode CE3 may be formed of the third conductive layer CDL3.

The channel portion CH5, the source electrode S5, and the drain electrode D5 of the fifth transistor ST5 may be formed of the semiconductor layer SEL. The source electrode S5 and the drain electrode D5 may be formed of parts of the semiconductor layer SEL, which are made conductive by doping ions or impurities into a semiconductor material.

The channel portion CH6, the source electrode S6, and the drain electrode D6 of the sixth transistor ST6 may be formed of the semiconductor layer SEL. The source electrode S6 and the drain electrode D6 may be formed of parts of the semiconductor layer SEL, which are made conductive by doping ions or impurities into a semiconductor material.

The gate electrodes G5 and G6 of the respective fifth and sixth transistors ST5 and ST6 may be formed of different parts of the emission control line ECL provided as the first conductive layer CDL1.

The capacitor C1 may be provided by a first capacitor electrode CAE1 overlapping with a second capacitor electrode CAE2.

Here, the first capacitor electrode CAE1 may be formed of a part of the gate electrode GDT of the driving transistor DT, which is provided as the first conductive layer CDL1.

The second capacitor electrode CAE2 may be formed of a part of the first power horizontal auxiliary line VDSBL1, which is provided as the second conductive layer CDL2.

The second connection electrode CE2 is connected to the source electrode S2 of the second transistor ST2 through the fourth contact hole CT4.

Referring to FIG. 13, the data lines DL include the first data line DL1 and the second data line DL2 that are disposed in the first display side region DSDA1.

The first dummy lines DML1, which are respectively adjacent to the data lines DL, include the first bypass line DETL1 and the third bypass line DETL3 of the input bypass line DETL, and the remaining first auxiliary lines ASL1 excluding them.

The data lines DL and the first dummy lines DML1 may extend in the second direction DR2, and may be provided as the fifth conductive layer CDL5.

Further, the circuit layer 120 may include the first power auxiliary lines VDAL and the second dummy lines DML2 that extend in the first direction DR1.

The second dummy lines DML2 include the second bypass line DETL2 of the input bypass line DETL, and the remaining second auxiliary lines ASL2 excluding the second bypass line DETL2.

The second dummy lines DML2 and the first power auxiliary line VDAL may be formed of the fourth conductive layer CDL4, and may be alternately disposed in the second direction DR2.

A fourth connection electrode CE4 may be provided as the fourth conductive layer CDL4, and may be connected to the second connection electrode CE2 through a tenth contact hole CT10.

The data line DL provided as the fifth conductive layer CDL5 may be connected to the fourth connection electrode CE4 through an eleventh contact hole CT11.

Thus, the source electrode S2 of the second transistor ST2 may be connected to the data line DL through the second connection electrode CE2 and the fourth connection electrode CE4.

The first power auxiliary line VDAL may be electrically connected to the first power vertical auxiliary line VDSBL2 of the third conductive layer CDL3 through a twelfth contact hole CT12.

As shown in FIG. 12, the third connection electrode CE3 provided as the third conductive layer CDL3 may be connected to the source electrode S4 of the fourth transistor ST4 and the drain electrode D6 of the sixth transistor ST6 provided as the semiconductor layer SEL through the seventh contact hole CT7.

As illustrated in FIG. 13, a fifth connection electrode CE5 provided as the fourth conductive layer CDL4 may be connected to the third connection electrode CE3 through an eighth contact hole CT8.

A sixth connection electrode CE6 provided as the fifth conductive layer CDL5 may be connected to the fifth connection electrode CE5 through a ninth contact hole CT9.

Thus, the sixth connection electrode CE6 may be connected to the source electrode S4 of the fourth transistor ST4 and the drain electrode D6 of the sixth transistor ST6 via the third connection electrode CE3 and the fifth connection electrode CE5.

The sixth connection electrode CE6 may be connected to the anode electrode of the light emitting element LEL through an anode contact hole ANCT (e.g., see FIG. 14) that penetrates the third planarization layer 127.

In the first display side region DSDA1, the third bypass line DETL3 may be electrically connected to the second bypass line DETL2 through the second bypass connection hole DETH2 penetrating the second planarization layer 126.

As shown in FIG. 14, the circuit layer 120 may include the semiconductor layer SEL on the substrate 110, the first conductive layer CDL1 on the first gate insulating layer 122 covering the semiconductor layer SEL, the second conductive layer CDL2 on the second gate insulating layer 123 covering the first conductive layer CDL1, the third conductive layer CDL3 on the interlayer insulating layer 124 covering the second conductive layer CDL2, the fourth conductive layer CDL4 on the first planarization layer 125 covering the conductive layer CDL3, the fifth conductive layer CDL5 on the second planarization layer 126 covering the fourth conductive layer CDL4, and the third planarization layer 127 covering the fifth conductive layer CDL5.

The circuit layer 120 may further include a buffer layer 121 disposed between the substrate 110 and the semiconductor layer SEL.

The buffer layer 121 may be used to protect the circuit layer 120 and the light emitting element layer 130 from moisture that may penetrate through the substrate 110, and may be formed of at least one inorganic layer.

For example, the buffer layer 121 may be formed as multiple layers in which one or more inorganic layers of silicon nitride, silicon oxynitride, silicon oxide, titanium oxide, and/or aluminum oxide are alternately stacked.

The semiconductor layer SEL is disposed on the buffer layer 121, and may be formed of a silicon semiconductor, such as polycrystalline silicon, single crystal silicon, low-temperature polycrystalline silicon, and/or amorphous silicon.

The semiconductor layer SEL may include the channel portions CHDT, CH1-1, CH1-2, CH2, CH3-1, CH3-2, CH4, CH5, and CH6 of FIG. 12 of the driving transistor DT and the first to sixth transistors ST1 to ST6 provided in the pixel driver PXD.

In addition, the semiconductor layer SEL may further include the source electrodes SDT, S1-1, S1-2, S2, S3-1, S3-2, S4, S5, and S6 of FIG. 12 and the drain electrodes DDT, D1-1, D1-2, D2, D3-1, D3-2, D4, D5, and D6 of FIG. 12 of the driving transistor DT and each of the switch elements ST1 to ST6.

Another portion corresponding to the source electrodes SDT, S1-1, S1-2, S2, S3-1, S3-2, S4, S5, and S6 of FIG. 12 and the drain electrodes DDT, D1-1, D1-2, D2, D3-1, D3-2, D4, D5, and D6 of FIG. 12 of the driving transistor DT and each of the switch elements ST1 to ST6 of the semiconductor layer SEL may be doped with ions or impurities to have conductivity.

On the other hand, a portion corresponding to the channel portions CHDT, CH1-1, CH1-2, CH2, CH3-1, CH3-2, CH4, CH5, and CH6 of FIG. 12 of the driving transistor DT and each of the switch elements ST1 to ST6 of the semiconductor layer SEL may not be doped by the gate electrodes GDT, G1-1, G1-2, G2, G3-1, G3-2, G4, G5, and G6, and may maintain the characteristics of a semiconductor that generates a channel serving as a carrier movement path depending on the potential difference.

The first gate insulating layer 122 may be formed of an inorganic layer disposed on the buffer layer 121 and covering the semiconductor layer SEL.

For example, the first gate insulating layer 122 may be formed of an inorganic layer of a silicon nitride layer, a silicon oxynitride layer, a silicon oxide layer, a titanium oxide layer, or an aluminum oxide layer.

The first conductive layer CDL1 is disposed on the first gate insulating layer 122.

The first conductive layer CDL1 may include the gate electrodes GDT, G1-1, G1-2, G2, G3-1, G3-2, G4, G5, and G6 of the driving transistor DT and the switch elements ST1 to ST6 provided in the pixel driver PXD.

Further, the first conductive layer CDL1 may include the write scan line GWL, the initialization scan line GIL, the control scan line GCL, and the emission control line ECL that are connected to the gate electrodes G1-1, G1-2, G2, G3-1, G3-2, G4, G5, and G6 of the respective first to sixth transistors ST1 to ST6 provided in the pixel driver PXD and extend in the first direction DR1.

The first conductive layer CDL1 may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof.

The second gate insulating layer 123 may be formed of an inorganic layer disposed on the first gate insulating layer 122 and covering the first conductive layer CDL1.

For example, the second gate insulating layer 123 may be formed of an inorganic layer of a silicon nitride layer, a silicon oxynitride layer, a silicon oxide layer, a titanium oxide layer, or an aluminum oxide layer.

The second conductive layer CDL2 is disposed on the second gate insulating layer 123.

The second conductive layer CDL2 may include the shielding electrode SHE, the first power horizontal auxiliary line VDSBL1, the gate initialization voltage line VGIL, and the anode initialization voltage line VAIL.

The second conductive layer CDL2 may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof.

The interlayer insulating layer 124 may be formed of an inorganic layer disposed on the second gate insulating layer 123 and covering the second conductive layer CDL2.

For example, the interlayer insulating layer 124 may be formed of an inorganic layer of a silicon nitride layer, a silicon oxynitride layer, a silicon oxide layer, a titanium oxide layer, or an aluminum oxide layer.

The third conductive layer CDL3 is disposed on the interlayer insulating layer 124.

The third conductive layer CDL3 may include the first connection electrode CE1, the second connection electrode CE2, the third connection electrode CE3, the first power vertical auxiliary line VDSBL2, the gate initialization voltage auxiliary line VGIAL, and the anode initialization voltage auxiliary line VAIAL.

Referring to FIGS. 12 and 14, the pixel driver PXD may include the first contact hole CT1, the second contact hole CT2, the third contact hole CT3, the fourth contact hole CT4, the fifth contact hole CT5, the sixth contact hole CT6, and the seventh contact hole CT7.

The first contact hole CT1 connects between the first connection electrode CE1 and the gate electrode GDT of the driving transistor DT.

The first contact hole CT1 may correspond to a portion of the gate electrode GDT of the driving transistor DT, and may penetrate the second gate insulating layer 123 and the interlayer insulating layer 124. Thus, the first connection electrode CE1 formed of the third conductive layer CDL3 may be electrically connected to the gate electrode GDT of the driving transistor DT formed of the first conductive layer CDL1 through the first contact hole CT1.

The second contact hole CT2 connects between any one of the drain electrode D1-2 of the first-second transistor ST1-2 or the source electrode S3-1 of the third-first transistor ST3-1 and the first connection electrode CE1. The drain electrode D1-2 of the first-second transistor ST1-2 is connected to the source electrode S3-1 of the third-first transistor ST3-1.

The second contact hole CT2 may correspond to a portion of any one of the drain electrode D1-2 of the first-second transistor ST1-2 or the source electrode S3-1 of the third-first transistor ST3-1, and may penetrate the first gate insulating layer 122, the second gate insulating layer 123, and the interlayer insulating layer 124. Accordingly, the first connection electrode CE1 formed of the third conductive layer CDL3 may be electrically connected to the drain electrode D1-2 of the first-second transistor ST1-2 and the source electrode S3-1 of the third-first transistor ST3-1 formed of the semiconductor layer SEL through the second contact hole CT2.

In addition, the gate electrode GDT of the driving transistor DT may be electrically connected to the drain electrode D1-2 of the first-second transistor ST1-2 and the source electrode S3-1 of the third-first transistor ST3-1 through the first contact hole CT1, the second contact hole CT2, and the first connection electrode CE1.

The third contact hole CT3 connects between the shielding electrode SHE and the first power vertical auxiliary line VDSBL2.

The third contact hole CT3 may correspond to a part of the first power vertical auxiliary line VDSBL2, and may pass through the interlayer insulating layer 124. Thus, the shielding electrode SHE formed of the second conductive layer CDL2 may be electrically connected to the first power vertical auxiliary line VDSBL2 formed of the third conductive layer CDL3 through the third contact hole CT3.

The fourth contact hole CT4 connects between the second connection electrode CE2 and the source electrode S2 of the second transistor ST2.

The fourth contact hole CT4 may correspond to a part of the source electrode S2 of the second transistor ST2, and may pass through the first gate insulating layer 122, the second gate insulating layer 123, and the interlayer insulating layer 124. Accordingly, the second connection electrode CE2 formed of the third conductive layer CDL3 may be electrically connected to the source electrode S2 of the second transistor ST2 formed of the semiconductor layer SEL through the fourth contact hole CT4.

The fifth contact hole CT5 connects between the first power horizontal auxiliary line VDSBL1 and the first power vertical auxiliary line VDSBL2.

The fifth contact hole CT5 may correspond to a part of the first power horizontal auxiliary line VDSBL1, and may pass through the interlayer insulating layer 124. Thus, the first power vertical auxiliary line VDSBL2 formed of the third conductive layer CDL3 may be connected to the first power horizontal auxiliary line VDSBL1 formed of the second conductive layer CDL2 through the fifth contact hole CT5.

The sixth contact hole CT6 connects between the first power vertical auxiliary line VDSBL2 and the source electrode S5 of the fifth transistor ST5.

The sixth contact hole CT6 may correspond to a part of the source electrode S5 of the fifth transistor ST5, and may pass through the first gate insulating layer 122, the second gate insulating layer 123, and the interlayer insulating layer 124. Accordingly, the first power vertical auxiliary line VDSBL2 formed of the third conductive layer CDL3 may be electrically connected to the source electrode S5 of the fifth transistor ST5 formed of the semiconductor layer SEL through the sixth contact hole CT6.

The seventh contact hole CT7 connects between the third connection electrode CE3 and the drain electrode D5 of the fifth transistor ST5.

The seventh contact hole CT7 may correspond to a part of the drain electrode D5 of the fifth transistor ST5, and may pass through the first gate insulating layer 122, the second gate insulating layer 123, and the interlayer insulating layer 124. Accordingly, the third connection electrode CE3 formed of the third conductive layer CDL3 may be electrically connected to the drain electrode D5 of the fifth transistor ST5 formed of the semiconductor layer SEL through the seventh contact hole CT7.

The third conductive layer CDL3 may have a multilayered structure that includes a metal layer having a low resistance property, and metal layers respectively disposed on a top surface and a bottom surface of the metal layer and having an ion diffusion preventing property.

For example, the third conductive layer CDL3 may have a stacked structure of metal layers, and each of the metal layers of the third conductive layer CDL3 may be formed of any one of molybdenum (Mo), aluminum (Al), chromium (Cr), gold (Au), titanium (Ti), nickel (Ni), neodymium (Nd), or copper (Cu).

In more detail, the metal layer having a low resistance property may be formed of any one of aluminum (Al), chromium (Cr), gold (Au), nickel (Ni), neodymium (Nd), or copper (Cu).

The metal layer having an ion diffusion preventing property may be made of titanium (Ti).

In other words, the third conductive layer CDL3 may have a stacked structure (Ti/Al/Ti) of titanium (Ti)/aluminum (AD/titanium (Ti).

The first planarization layer 125 covering the third conductive layer CDL3 may be formed of an organic layer, such as acryl resin, epoxy resin, phenolic resin, polyamide resin, polyimide resin, and/or the like.

The fourth conductive layer CDL4 is disposed on the first planarization layer 125.

As shown in FIG. 13, the fourth conductive layer CDL4 may include the first power auxiliary line VDAL, the second dummy line DML2, the fourth connection electrode CE4, and the fifth connection electrode CE5.

The second dummy line DML2 includes the second bypass line DETL2 and the second auxiliary line ASL2.

The fourth conductive layer CDL4 may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof.

Similar to the third conductive layer CDL3, the fourth conductive layer CDL4 may have a stacked structure of metal layers, and each of the metal layers of the third conductive layer CDL3 may be formed of any one of molybdenum (Mo), aluminum (Al), chromium (Cr), gold (Au), titanium (Ti), nickel (Ni), neodymium (Nd), or copper (Cu).

In other words, the fourth conductive layer CDL4 may have a stacked structure (Ti/Al/Ti) of titanium (Ti)/aluminum (AD/titanium (Ti).

The second planarization layer 126 covering the fourth conductive layer CDL4 may be formed of an organic layer, such as acryl resin, epoxy resin, phenolic resin, polyamide resin, polyimide resin, and/or the like.

The fifth conductive layer CDL5 is disposed on the second planarization layer 126.

As illustrated in FIG. 13, the fifth conductive layer CDL5 may include the data line DL, the first dummy line DML1, and the sixth connection electrode CE6.

The first dummy line DML1 includes the first bypass line DETL1, the third bypass line DETL3, and the first auxiliary line ASL1.

The fifth conductive layer CDL5 may be formed as a single layer or multiple layers made of any one of molybdenum (Mo), aluminum (Al), chromium (Cr), gold (Au), titanium (Ti), nickel (Ni), neodymium (Nd), copper (Cu), or an alloy thereof.

As shown in FIG. 14, the third planarization layer 127 covering the fifth conductive layer CDL5 may be formed of an organic layer, such as acryl resin, epoxy resin, phenolic resin, polyamide resin, polyimide resin, and/or the like.

Referring to FIGS. 13 and 14, the pixel driver PXD may further include the eighth contact hole CT8, the ninth contact hole CT9, the tenth contact hole CT10, and the eleventh contact hole CT11.

The eighth contact hole CT8 connects between the fifth connection electrode CE5 and the third connection electrode CE3.

The eighth contact hole CT8 may correspond to a portion of the third connection electrode CE3, and may penetrate the first planarization layer 125. Accordingly, the fifth connection electrode CE5 formed of the fourth conductive layer CDL4 may be electrically connected to the third connection electrode CE3 formed of the third conductive layer CDL3 through the eighth contact hole CT8.

The ninth contact hole CT9 connects between the fifth connection electrode CE5 and the sixth connection electrode CE6.

The ninth contact hole CT9 may correspond to another portion of the fifth connection electrode CE5, and may penetrate the second planarization layer 126. Thus, the sixth connection electrode CE6 formed of the fifth conductive layer CDL5 may be electrically connected to the fifth connection electrode CE5 formed of the fourth conductive layer CDL4 through the ninth contact hole CT9.

The tenth contact hole CT10 connects between the fourth connection electrode CE4 and the second connection electrode CE2.

The tenth contact hole CT10 may correspond to a portion of the second connection electrode CE2, and may penetrate the first planarization layer 125. Thus, the fourth connection electrode CE4 formed of the fourth conductive layer CDL4 may be electrically connected to the second connection electrode CE2 formed of the third conductive layer CDL3 through the tenth contact hole CT10.

The eleventh contact hole CT11 connects between the fourth connection electrode CE4 and the data line DL.

The eleventh contact hole CT11 may correspond to another portion of the fourth connection electrode CE4, and may penetrate the second planarization layer 126. Thus, the data line DL formed of the fifth conductive layer CDL5 may be electrically connected to the fourth connection electrode CE4 formed of the fourth conductive layer CDL4 through the eleventh contact hole CT11.

As illustrated in FIG. 14, the light emitting element layer 130 may be disposed on the third planarization layer 127 of the circuit layer 120.

For example, the light emitting element layer 130 may include the plurality of anode electrodes AND disposed on the third planarization layer 127, respectively corresponding to the plurality of emission areas EA, and electrically and respectively connected to the plurality of pixel drivers PXD, a pixel defining layer PDL disposed on the third planarization layer 127, corresponding to the non-emission area NEA that is a separation region between the emission areas EA, and covering the edge of each of the anode electrodes AND, the plurality of light emitting layers EML respectively corresponding to the emission areas EA and respectively disposed on the anode electrodes AND, and the cathode electrode CTD corresponding to the emission areas EA, disposed on the pixel definition layer PDL and the light emitting layers EML, and connected to the second power supply line VSSPL.

The anode electrode AND may be connected to the sixth connection electrode CE6 through the anode contact hole ANCT penetrating the third planarization layer 127.

Accordingly, the anode electrode AND may be electrically connected to the drain electrode DDT of the driving transistor DT through the seventh contact hole CT7, the third connection electrode CE3, the eighth contact hole CT8, the fifth connection electrode CE5, the ninth contact hole CT9, the sixth connection electrode CE6, and the anode contact hole ANCT.

The pixel defining layer PDL may be formed of an organic layer.

The light emitting layer EML may include an organic light emitting material.

A first common layer including at least a hole transport material may be further disposed between the anode electrode AND and the light emitting layer EML.

A second common layer including at least an electron transport material may be further disposed between the light emitting layer EML and the cathode electrode CTD.

The cathode electrode CTD may correspond to the entire surface of the display area DA.

The cathode electrode CTD may be connected to the second power supply line VSSPL in the non-display area NDA.

Accordingly, the light emitting element layer 130 may include the plurality of light emitting elements LEL, which respectively correspond to the plurality of emission areas EA, and are formed of a structure having the anode electrode AND and the cathode electrode CTD opposite to each other and the light emitting layer EML interposed therebetween.

The light emitting element layer 130 may be covered with a sealing layer 140 to block penetration of oxygen or moisture.

The encapsulation layer 140 may cover the light emitting element layer 130, and may have a structure in which at least one inorganic layer and at least one organic layer are alternately stacked.

For example, the encapsulation layer 140 may include a first inorganic layer 141, which is made of an inorganic insulating material, covers the cathode electrode CTD, and is in contact with the interlayer insulating layer 124 in the non-display area NDA, an organic layer 142, which is made of an organic insulating material, is disposed on the first inorganic layer 141, and corresponds to the display area DA, and a second inorganic layer 143 which is made of an inorganic insulating material, covers the organic layer 142, and is in contact with the first inorganic layer 141 in the non-display area NDA.

Figure 15:
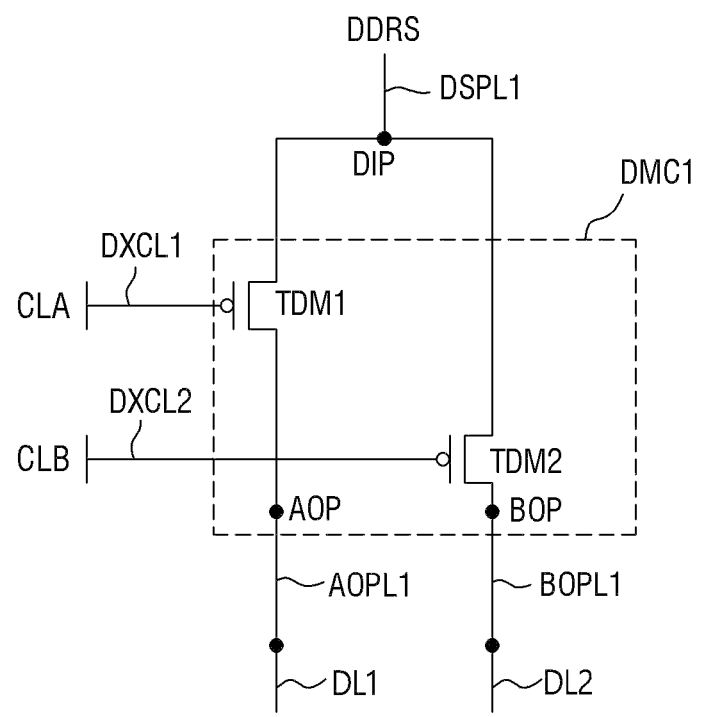
FIG. 15 is an equivalent circuit diagram showing an electrical connection between the first demux circuit and the data lines shown in FIG. 5.
Figure 16:
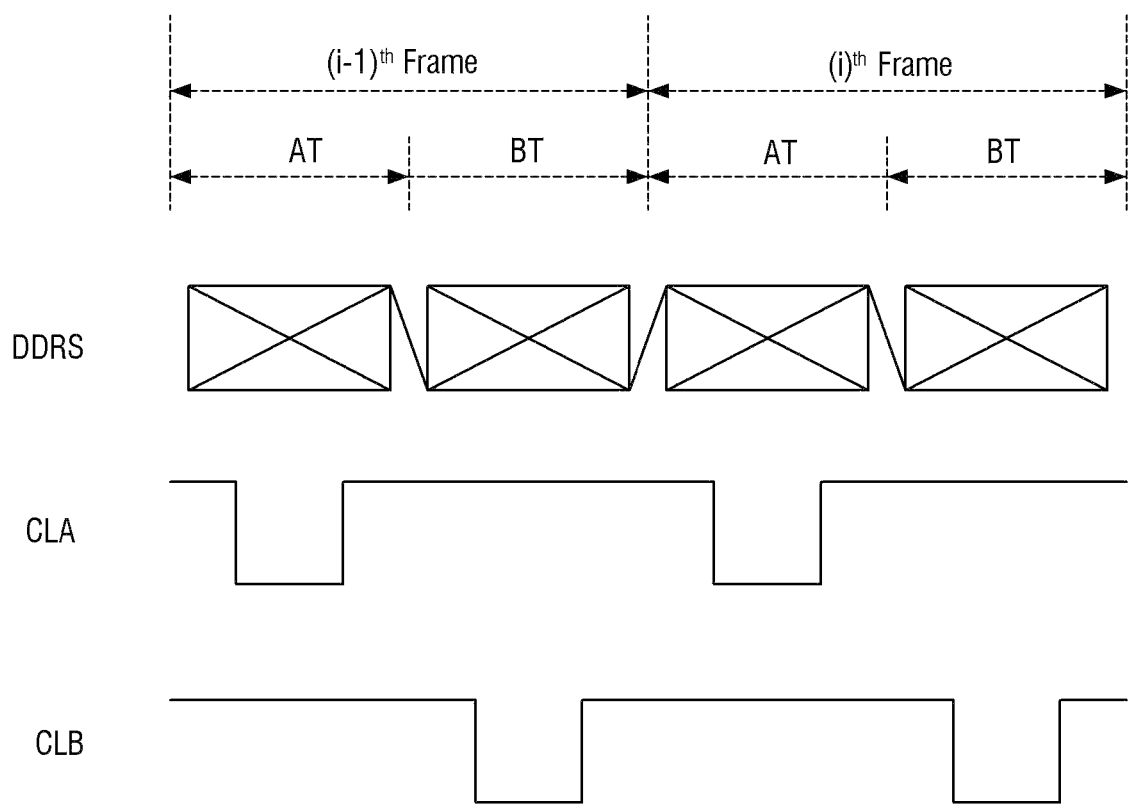
FIG. 16 is a timing diagram showing a data driving signal and demux control signals of FIG. 15.

FIG. 15 is an equivalent circuit diagram showing an electrical connection between the first demux circuit and the data lines shown in FIG. 5. FIG. 16 is a timing diagram showing a data driving signal and demux control signals of FIG. 15.

Referring to FIG. 15, the first demux circuit DMC1, as one of the demux circuits DMC, may include the input terminal DIP that is electrically connected to the display driving circuit 200 and receives one data driving signal DDRS, the higher-priority output terminal AOP that outputs a first data signal corresponding to the data driving signal during a first output period, and the lower-priority output terminal BOP that outputs a second data signal corresponding to the data driving signal during a second output period after the first output period.

Also, the first demux circuit DMC1 may further include the first demux transistor TDM1 electrically connected between the input terminal DIP and the higher-priority output terminal AOP, and the second demux transistor TDM2 electrically connected between the input terminal DIP and the lower-priority output terminal BOP.

The circuit layer 120 of the display device 10 according to an embodiment may further include the first higher-priority output connection line AOPL1 that electrically connects the higher-priority output terminal AOP of the first demux circuit DMC1 to the first data line DL1, and the first lower-priority output connection line BOPL1 that electrically connects the lower-priority output terminal BOP of the first demux circuit DMC1 to the second data line DL2.

The circuit layer 120 may further include a first demux control line DXCL1 electrically connected to a gate electrode of the first demux transistor TDM1, and a second demux control line DXCL2 electrically connected to a gate electrode of the second demux transistor TDM2.

Referring to FIG. 16, each of image frames $(i-1)^{th}$ Frame and $i^{th}$ Frame may include a first output period AT and a second output period BT.

A first demux control signal CLA of the first demux control line DXCL1 may be output at a turn-on level during the first output period AT, and a second demux control signal CLB of the second demux control line DXCL2 may be output at a turn-on level during the second output period BT.

Accordingly, the first demux transistor TDM1 may be turned on during the first output period AT, and thus, the data driving signal DDRS may be output as a data signal of one data line (e.g., one of the data lines DL1, DL3, or DL5) through the higher-priority output terminal AOP. Further, the second demux transistor TDM2 may be turned on during the second output period BT, and thus, the data driving signal DDRS may be output as a data signal of another data line (e.g., one of the data lines DL2, DL4, or DL6) through the lower-priority output terminal BOP.

In other words, the data driving signal DDRS may be time-demultiplexed into the first output period AT and the second output period BT by the demux circuit DMC.

Figure 17:
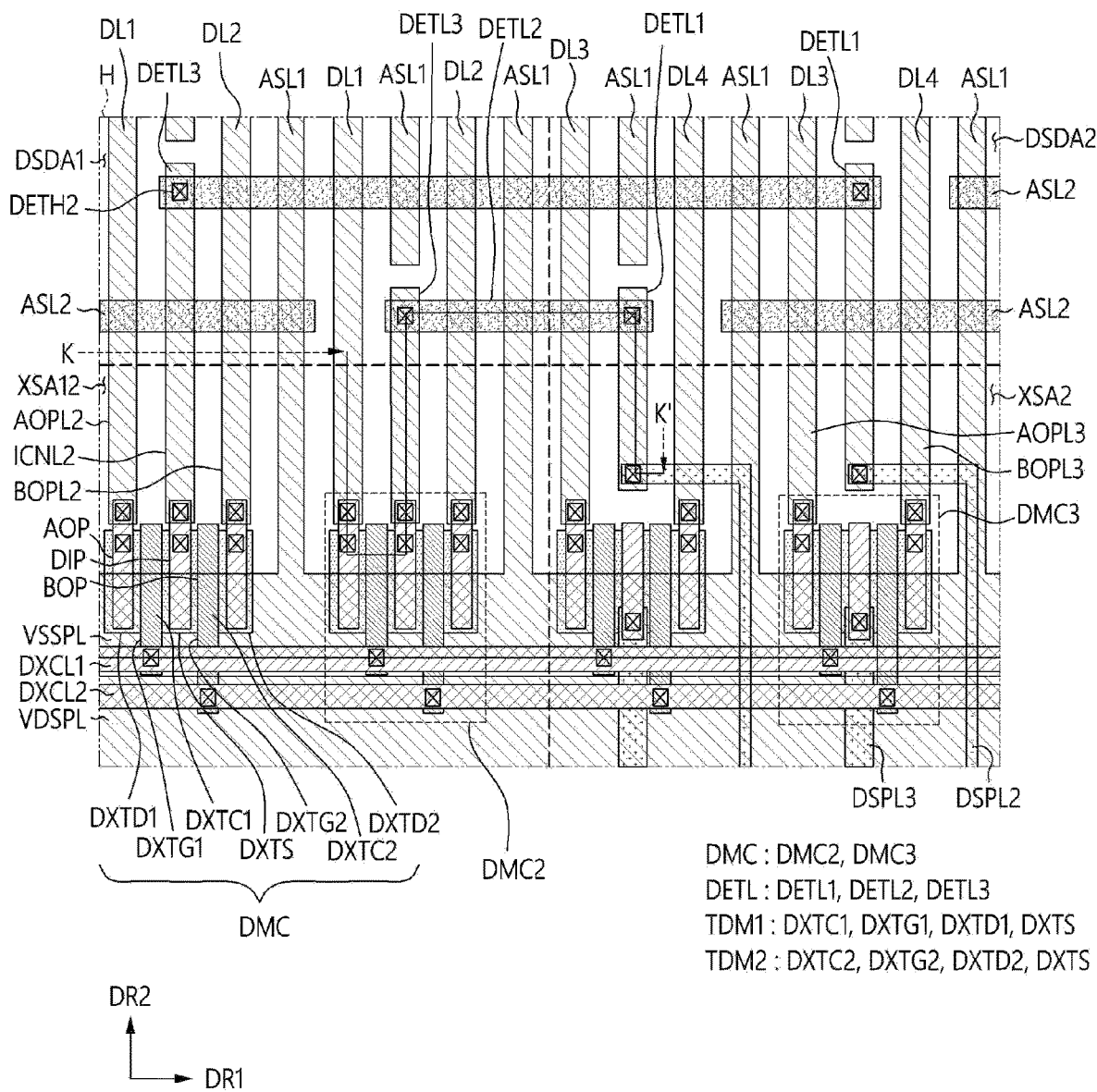
FIG. 17 is a plan view illustrating an example of the part H of FIG. 5.
Figure 18:
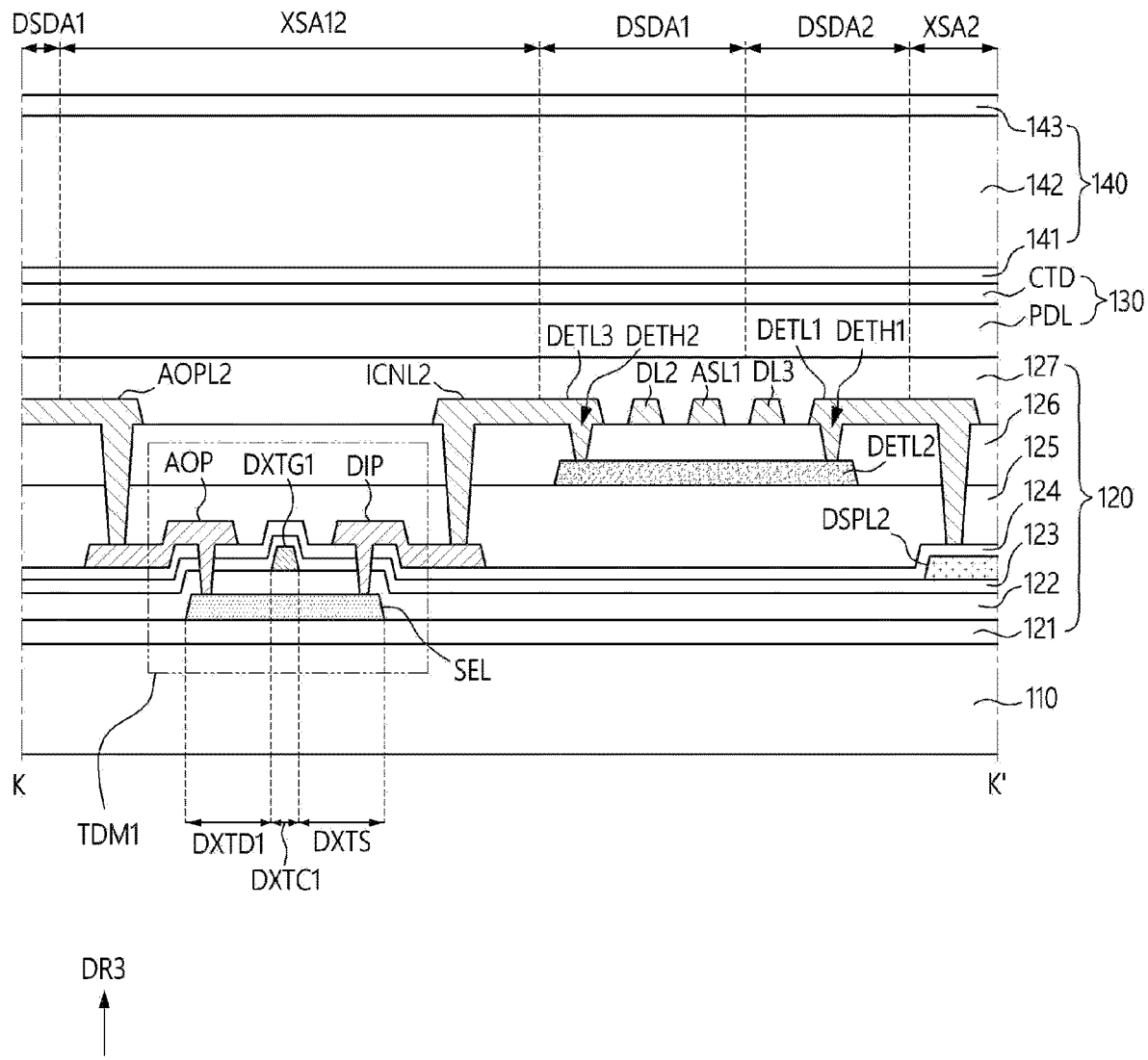
FIG. 18 is a cross-sectional view showing an example of a plane taken along the line K-K' of FIG. 17.

FIG. 17 is a plan view illustrating an example of the part H of FIG. 5. FIG. 18 is a cross-sectional view showing an example of a plane taken along the line K-K' of FIG. 17.

Referring to FIG. 17, one demux circuit DMC of the demux circuits DMC, which include the second demux circuit DMC2 in the straight region XSA12 of the first demux side region XSA1 and the third demux circuit DMC3 in the second demux side region XSA2, may have a first demux drain DXTD1, a first demux channel DXTC1, a first demux gate DXTG1, a demux source DXTS, a second demux channel DXTC2, a second demux gate DXTG2, and a second demux drain DXTD2.

As shown in FIGS. 17 and 18, the first demux drain DXTD1, the first demux channel DXTC1, the demux source DXTS, the second demux channel DXTC2, and the second demux drain DXTD2 may be formed of the semiconductor layer SEL.

The demux source DXTS may be disposed between the first demux channel DXTC1 and the second demux channel DXTC2.

The first demux drain DXTD1 may be opposite to one side of the demux source DXTS with the first demux channel DXTC1 interposed therebetween.

The second demux drain DXTD2 may be opposite to the other side of the demux source DXTS with the second demux channel DXTC2 interposed therebetween.

The first demux gate DXTG1 and the second demux gate DXTG2 may be formed of the first conductive layer CDL1 on the first gate insulating layer 122 or the second conductive layer CDL2 on the second gate insulating layer 123.

The higher-priority output terminal AOP of one demux circuit DMC may be electrically connected to the first demux drain DXTD1.

The lower-priority output terminal BOP of one demux circuit DMC may be electrically connected to the second demux drain DXTD2.

The input terminal DIP of one demux circuit DMC may be electrically connected to the demux source DXTS.

The second higher-priority output connection line AOPL2 electrically connects the higher-priority output terminal AOP of the second demux circuit DMC2 to the first data line DL1.

The second lower-priority output connection line BOPL2 electrically connects the lower-priority output terminal BOP of the second demux circuit DMC2 to the second data line DL2.

The second input connection line ICNL2 electrically connects the input terminal DIP of the second demux circuit DMC2 to the third bypass line DETL3.

Here, the data lines DL including the first data line DL1, the second data line DL2, the third data line DL3, and the fourth data line DL4, and the first dummy line DML1 including the first bypass line DETL1, the third bypass line DETL3, and the first auxiliary line ASL1 may be formed of the fifth conductive layer CDL5 on the second planarization layer 126.

Also, the second higher-priority output connection line AOPL2, the second lower-priority output connection line BOPL2, and the second input connection line ICNL2 may be formed of the fifth conductive layer CDL5 on the second planarization layer 126.

In other words, the second higher-priority output connection line AOPL2 may be an extension of the first data line DL1 that extends to the straight region XSA12.

The second lower-priority output connection line BOPL2 may be an extension of the second data line DL2 that extends to the straight region XSA12.

The second input connection line ICNL2 may be an extension of the third bypass line DETL3 that extends to the straight region XSA12.

The third higher-priority output connection line AOPL3 electrically connects the higher-priority output terminal AOP of the third demux circuit DMC3 to the third data line DL3.

The third lower-priority output connection line BOPL3 electrically connects the lower-priority output terminal BOP of the third demux circuit DMC3 to the fourth data line DL4.

Similarly, the third higher-priority output connection line AOPL3 and the third lower-priority output connection line BOPL3 may be formed of the fifth conductive layer CDL5 on the second planarization layer 126. In other words, the third higher-priority output connection line AOPL3 may be an extension of the third data line DL3 that extends to the second demux side region XSA2. Also, the third lower-priority output connection line BOPL3 may be an extension of the fourth data line DL4 that extends to the second demux side region XSA2.

The first bypass line DETL1 may extend to the second demux side region XSA2 and may be electrically connected to the second circuit output line DSPL2.

The circuit output lines DSPL including the second circuit output line DSPL2 and the third circuit output line DSPL3 may be formed of the first conductive layer CDL1 or the second conductive layer CDL2.

The input terminal DIP of the third demux circuit DMC3 may be electrically connected to the third circuit output line DSPL3.

The first demux control line DXCL1 and the second demux control line DXCL2 may be formed of the third conductive layer CDL3.

The first demux gate DXTG1 of the demux circuit DMC may extend to the first demux control line DXCL1 to be electrically connected to the first demux control line DXCL1.

The second demux gate DXTG2 of the demux circuit DMC may extend to the second demux control line DXCL2 to be electrically connected to the second demux control line DXCL2.

Each of the first power supply line VDSPL and the second power supply line VSSPL may include the fifth conductive layer CDL5.

Some of the first auxiliary lines ASL1 may extend to the demux area DXA to be electrically connected to the second power supply line VSSPL.

Figure 19:
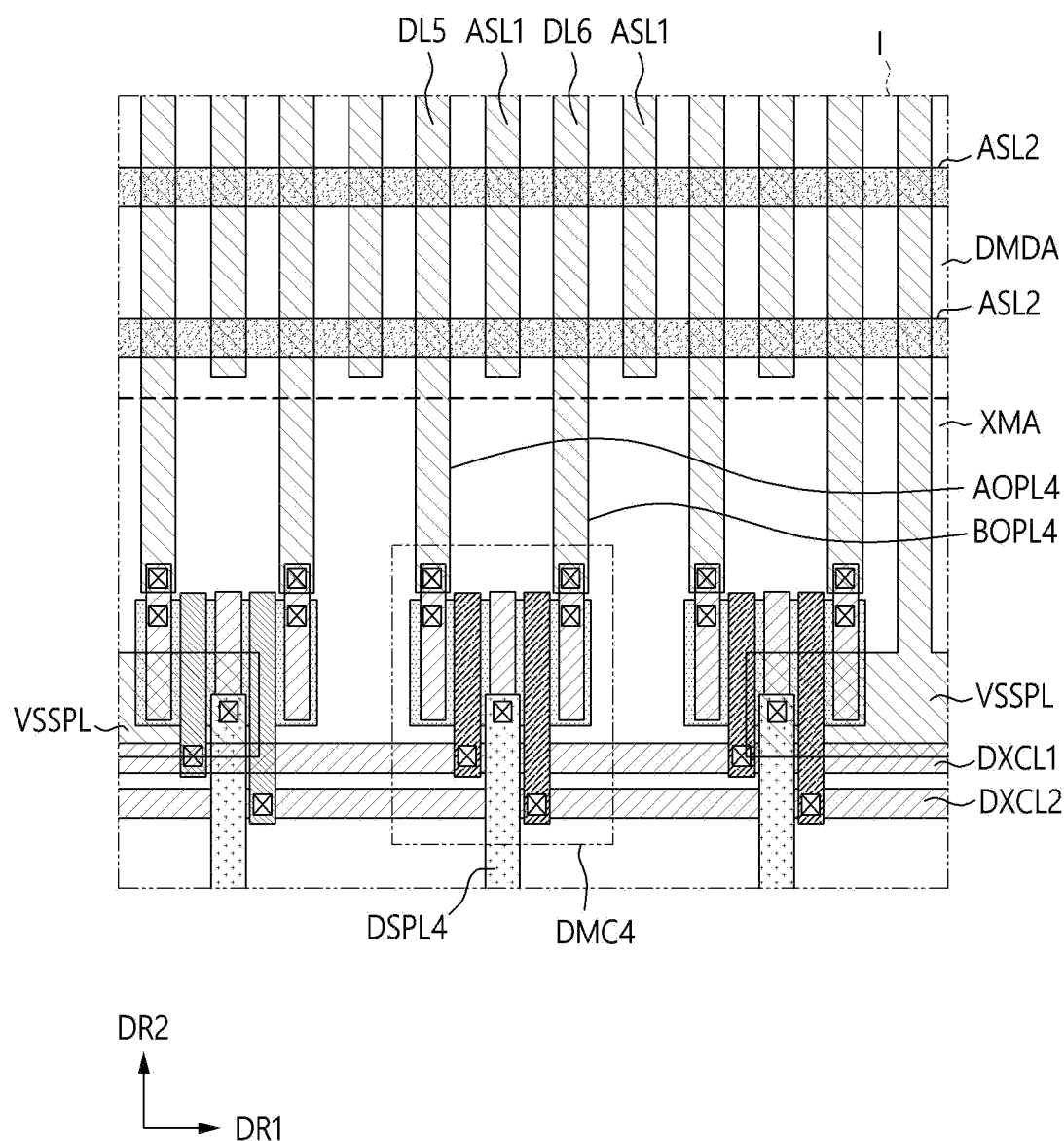
FIG. 19 is a plan view illustrating an example of the part I of FIG. 5.

FIG. 19 is a plan view illustrating an example of the part I of FIG. 5.

Referring to FIG. 19, because the fourth demux circuit DMC4 disposed in the demux middle region XMA is the same or substantially the same as (or similar to) the second demux circuit DMC2 and the third demux circuit DMC3 of FIG. 17, redundant description thereof may not be repeated.

The input terminal DIP of the fourth demux circuit DMC4 may be electrically connected to the fourth circuit output line DSPL4.

The fourth higher-priority output connection line AOPL4 electrically connects the higher-priority output terminal AOP of the fourth demux circuit DMC4 to the fifth data line DL5.

The fourth lower-priority output connection line BOPL4 electrically connects the lower-priority output terminal BOP of the fourth demux circuit DMC4 to the sixth data line DL6.

The fourth higher-priority output connection line AOPL4 and the fourth lower-priority output connection line BOPL4 may be formed of the fifth conductive layer CDL5 on the second planarization layer 126.

In other words, the fourth higher-priority output connection line AOPL4 may be an extension of the fifth data line DL5 that extends to the demux middle region XMA.

Also, the fourth lower-priority output connection line BOPL4 may be an extension of the sixth data line DL6 that extends to the demux middle region XMA.

As described above, according to an embodiment, the second higher-priority output connection line AOPL2, the second lower-priority output connection line BOPL2, and the second input connection line ICNL2 disposed in the straight region XSA12 of the first demux side region XSA1, the third higher-priority output connection line AOPL3 and the third lower-priority output connection line BOPL3 disposed in the second demux side region XSA2, and the fourth higher-priority output connection line AOPL4 and the fourth lower-priority output connection line BOPL4 disposed in the demux middle region XMA may be formed of the fifth conductive layer CDL5, similarly to that of the data lines DL.

In this way, the number of contact holes disposed in a portion of the non-display area NDA adjacent to the display area DA may be decreased, so that a usable area ratio of the non-display area NDA may be increased.

Because the straight region XSA12 of the first demux side region XSA1, the second demux side region XSA2, and the demux middle region XMA have a straight line shape in the first direction DR1, the distance from the display area DA in the second direction DR2 is relatively small. Accordingly, a data signal, which is output from each of the second demux circuit DMC2, the third demux circuit DMC3, and the fourth demux circuit DMC4 disposed in the straight region XSA12 of the first demux side region XSA1, the second demux side region XSA2, and the demux middle region XMA, is relatively less likely to be distorted due to poor coupling.

However, as the curved region XSA11 of the first demux side region XSA1 is formed in a curved shape, a separation distance between the curved region XSA11 and the display area DA is relatively large. Accordingly, the first higher-priority output connection line AOPL1, the first lower-priority output connection line BOPL1, and the first input connection line ICNL1, which are disposed between the first demux circuit DMC1 and the display area DA, may be easily coupled to each other.

In addition, after the first data signal is output through the first higher-priority output connection line AOPL1 during the first output period AP, the second data signal is output through the first lower-priority output connection line BOPL1 during the second output period BP. In other words, the signal is not supplied to the first higher-priority output connection line AOPL1 during the second output period BP after the first output period AP. Therefore, the first data signal of the first higher-priority output connection line AOPL1 may be distorted due to coupling with the second data signal of the first lower-priority output connection line BOPL1 or the data driving signal DDRS of the first input connection line ICNL1 during the second output period BP.

In order to prevent this, according to an embodiment, one of the first higher-priority output connection line AOPL1, the first lower-priority output connection line BOPL1, or the first input connection line ICNL1 disposed between the first demux circuit DMC1 and the display area DA is formed of the same conductive layer (e.g., the fifth conductive layer CDL5) as that of the data lines DL, and the others are formed of a different conductive layer from that of the data lines DL. As such, the first higher-priority output connection line AOPL1, the first lower-priority output connection line BOPL1, and the first input connection line ICNL1 are spaced apart from one another in the second direction DR2 as well as in the third direction DR3, so that the separation distances from among the first higher-priority output connection line AOPL1, the first lower-priority output connection line BOPL1, and the first input connection line ICNL1 may be increased. Consequently, because the data signals output from the first demux circuit DMC1 are relatively less affected by poor coupling, the data signals are less likely to be distorted.

Hereinafter, various suitable arrangement examples of the first higher-priority output connection line AOPL1, the first lower-priority output connection line BOPL1, and the first input connection line ICNL1 will be described in more detail.

Figure 20:
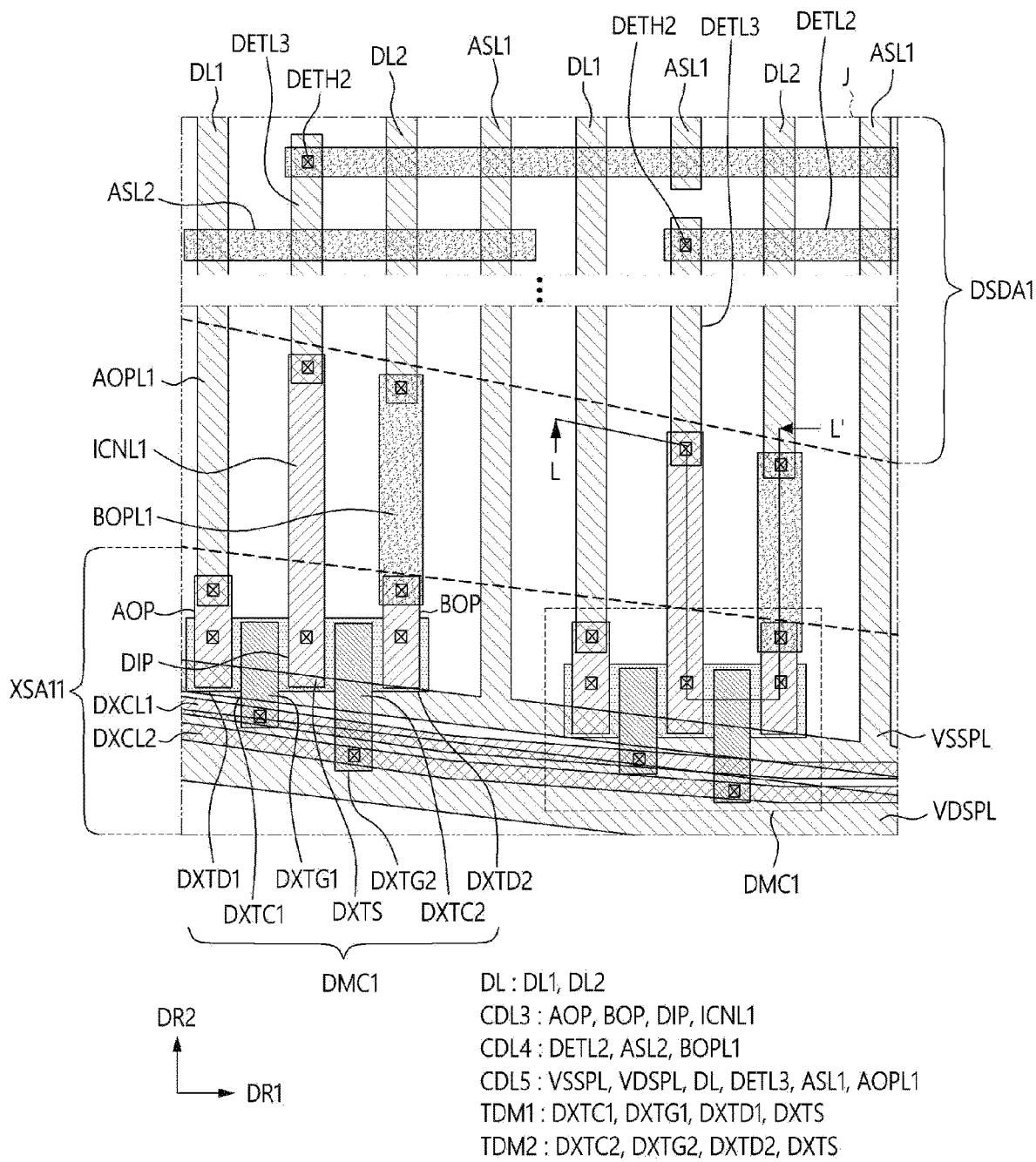
FIG. 20 is a plan view showing the part J of FIG. 5 according to a first embodiment.
Figure 21:
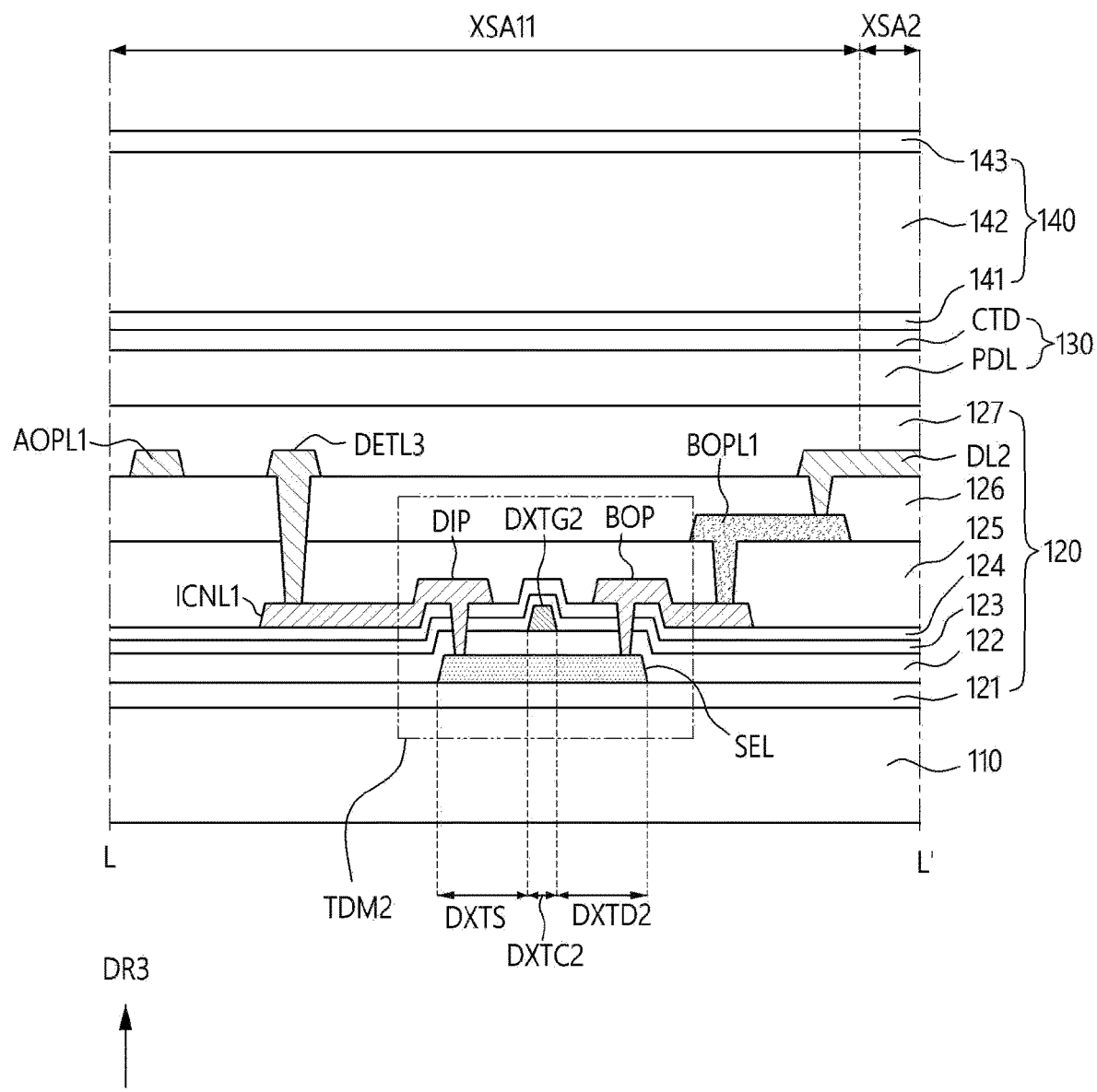
FIG. 21 is a cross-sectional view showing a plane taken along the line L-L' of FIG. 20.
Figure 22:
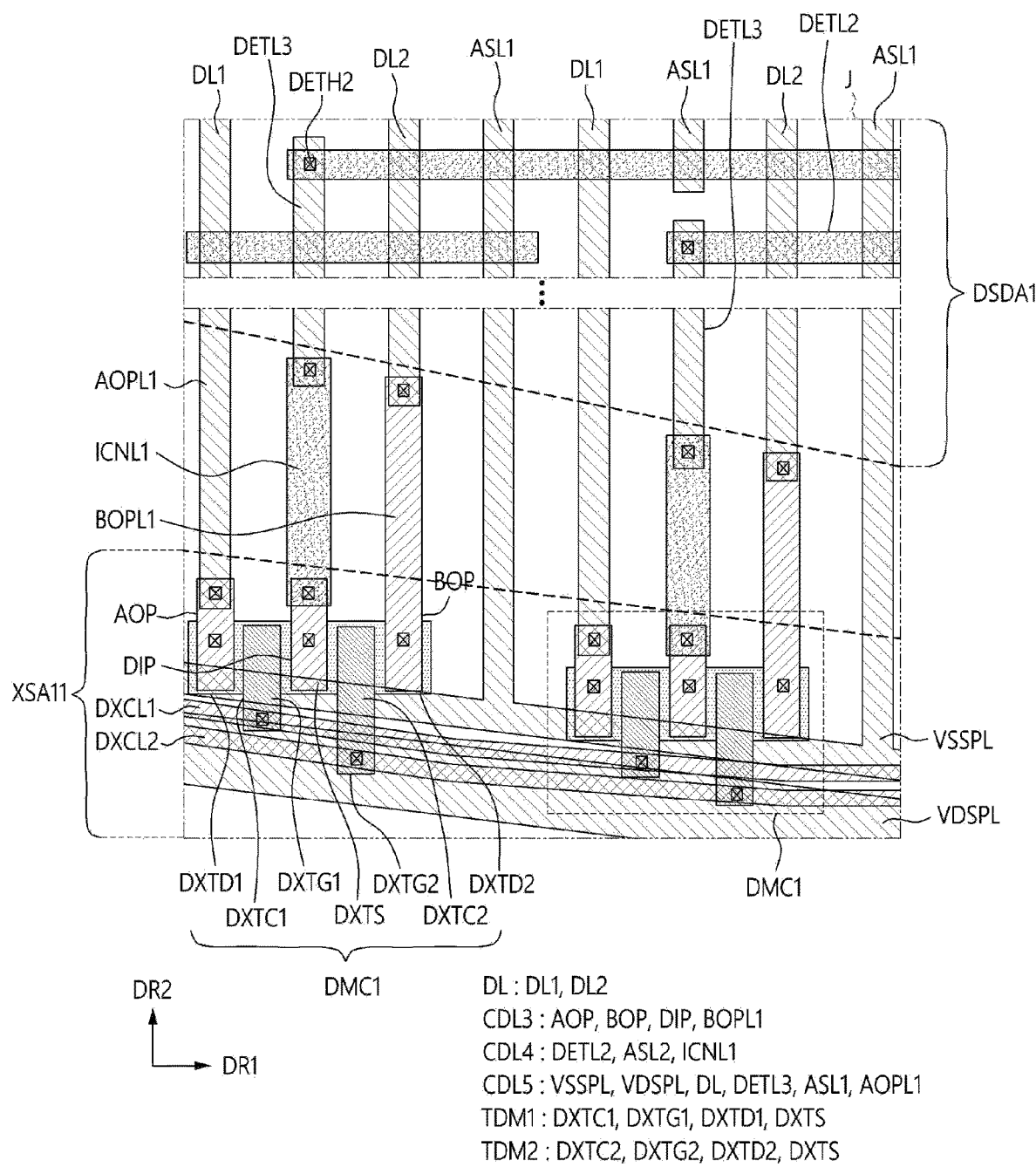
FIG. 22 is a plan view showing the part J of FIG. 5 according to a second embodiment.

FIG. 20 is a plan view showing the part J of FIG. 5 according to a first embodiment. FIG. 21 is a cross-sectional view showing a plane taken along the line L-L' of FIG. 20. FIG. 22 is a plan view showing the part J of FIG. 5 according to a second embodiment.

As shown in FIGS. 20 and 21, according to the first embodiment, the first higher-priority output connection line AOPL1, the first lower-priority output connection line BOPL1, and the first input connection line ICNL1 may be arranged side by side with one another in the first direction DR1. For example, the first input connection line ICNL1 may be disposed between the first higher-priority output connection line AOPL1 and the first lower-priority output connection line BOPL1 in the first direction DR1.

According to the first embodiment, the first higher-priority output connection line AOPL1, the first lower-priority output connection line BOPL1, and the first input connection line ICNL1 may be formed of different conductive layers from each other from among the third conductive layer CDL3 on the interlayer insulating layer 124, the fourth conductive layer CDL4 on the first planarization layer 125, and the fifth conductive layer CDL5 on the second planarization layer 126.

In consideration that the first data signal of the first higher-priority output connection line AOPL1 may be greatly affected by poor coupling, the first higher-priority output connection line AOPL1 may be spaced apart (e.g., as far as possible) from the first lower-priority output connection line BOPL1 and the first input connection line ICNL1.

Accordingly, the first higher-priority output connection line AOPL1 may be formed of the third conductive layer CDL3 closest to the substrate 110, or may be formed of the fifth conductive layer CDL5 spaced farthest from the substrate 110, from among the third conductive layer CDL3, the fourth conductive layer CDL4, and the fifth conductive layer CDL5. In other words, the first higher-priority output connection line AOPL1 may be formed of one of the third conductive layer CDL3 or the fifth conductive layer CDL5.

In this case, the first input connection line ICNL1 may be formed of the other one of the third conductive layer CDL3 or the fifth conductive layer CDL5.

Further, the first lower-priority output connection line BOPL1 may include the fourth conductive layer CDL4.

In other words, as illustrated in FIGS. 20 and 21, the first higher-priority output connection line AOPL1 may be formed of the fifth conductive layer CDL5, similarly to that of the data lines DL.

Further, the first input connection line ICNL1 may be formed of the third conductive layer CDL3, and the first lower-priority output connection line BOPL1 may be formed of the fourth conductive layer CDL4.

In this case, the first higher-priority output connection line AOPL1 may be formed of an extension of the first data line DL1, which extends from the display area DA to the curved region XSA11, to be electrically connected to the first data line DL1.

One side of the first lower-priority output connection line BOPL1 may be electrically connected to the second demux drain DXTD2 through the second output terminal BOP, and the other side of the first lower-priority output connection line BOPL1 may be electrically connected to the second data line DL2 extending to the curved region XSA1.

One side of the first input connection line ICNL1 may be electrically connected to the demux source DXTS, and the other side of the first input connection line ICNL1 may be electrically connected to the third bypass line DETL3 extending to the curved region XSA1.

In this way, because the separation distance between the first higher-priority output connection line AOPL1 and the first input connection line ICNL1 may be increased, the first data signal of the first higher-priority output connection line AOPL1 may be less affected by the data driving signal DDRS of the first input connection line ICNL1.

Because the second demux transistor TDM2 of the first demux circuit DMC1 shown in FIG. 21 is the same or substantially the same as the first demux transistor TDM1 shown in FIG. 18, redundant description thereof may not be repeated.

As another example, as shown in FIG. 22, the first input connection line ICNL1 may be formed of the fourth conductive layer CDL4, and the first lower-priority output connection line BOPL1 may be formed of the third conductive layer CDL3.

In this way, because the separation distance between the first higher-priority output connection line AOPL1 and the first lower-priority output connection line BOPL1 may be increased, the first data signal of the first higher-priority output connection line AOPL1 may be less affected by the second data signal of the first lower-priority output connection line BOPL1.

Figure 23:
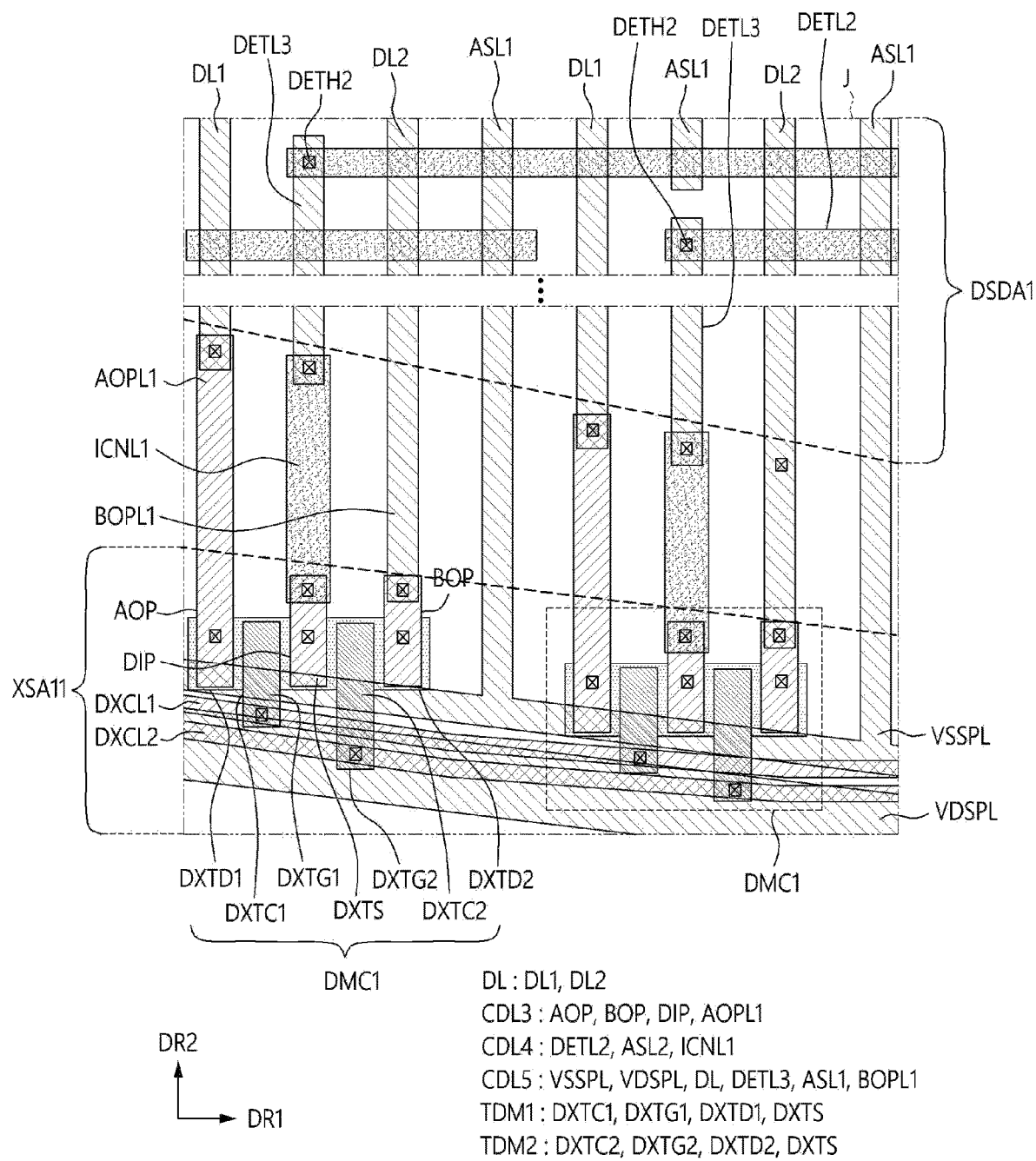
FIG. 23 is a plan view showing the part J of FIG. 5 according to a third embodiment.

FIG. 23 is a plan view showing the part J of FIG. 5 according to a third embodiment.

Referring to FIG. 23, unlike that illustrated in FIGS. 21 and 22, the first higher-priority output connection line AOPL1 may be formed of the third conductive layer CDL3.

In this case, the first input connection line ICNL1 may be formed of the fourth conductive layer CDL4, and the first lower-priority output connection line BOPL1 may be formed of the fifth conductive layer CDL5.

As another example, the first higher-priority output connection line AOPL1 may be formed of the third conductive layer CDL3, the first input connection line ICNL1 may be formed of the fifth conductive layer CDL5, and the first lower-priority output connection line BOPL1 may be formed of the fourth conductive layer CDL4.

However, the present disclosure is not limited thereto, and unlike the illustrations shown in FIGS. 20, 21, 22, and 23, the first higher-priority output connection line AOPL1 may be formed of the fourth conductive layer CDL4.

Figure 24:
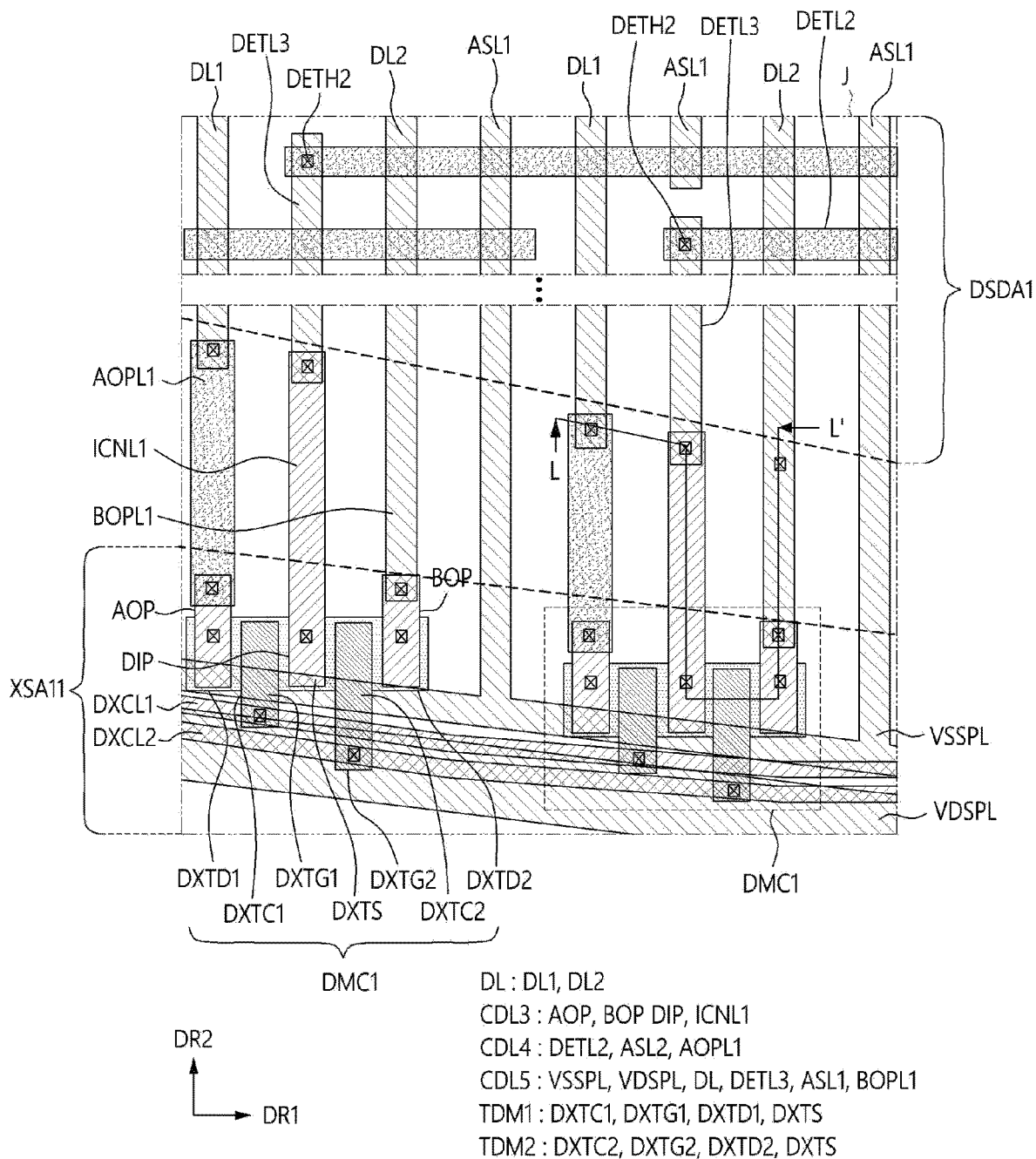
FIG. 24 is a plan view showing the part J of FIG. 5 according to a fourth embodiment.
Figure 25:
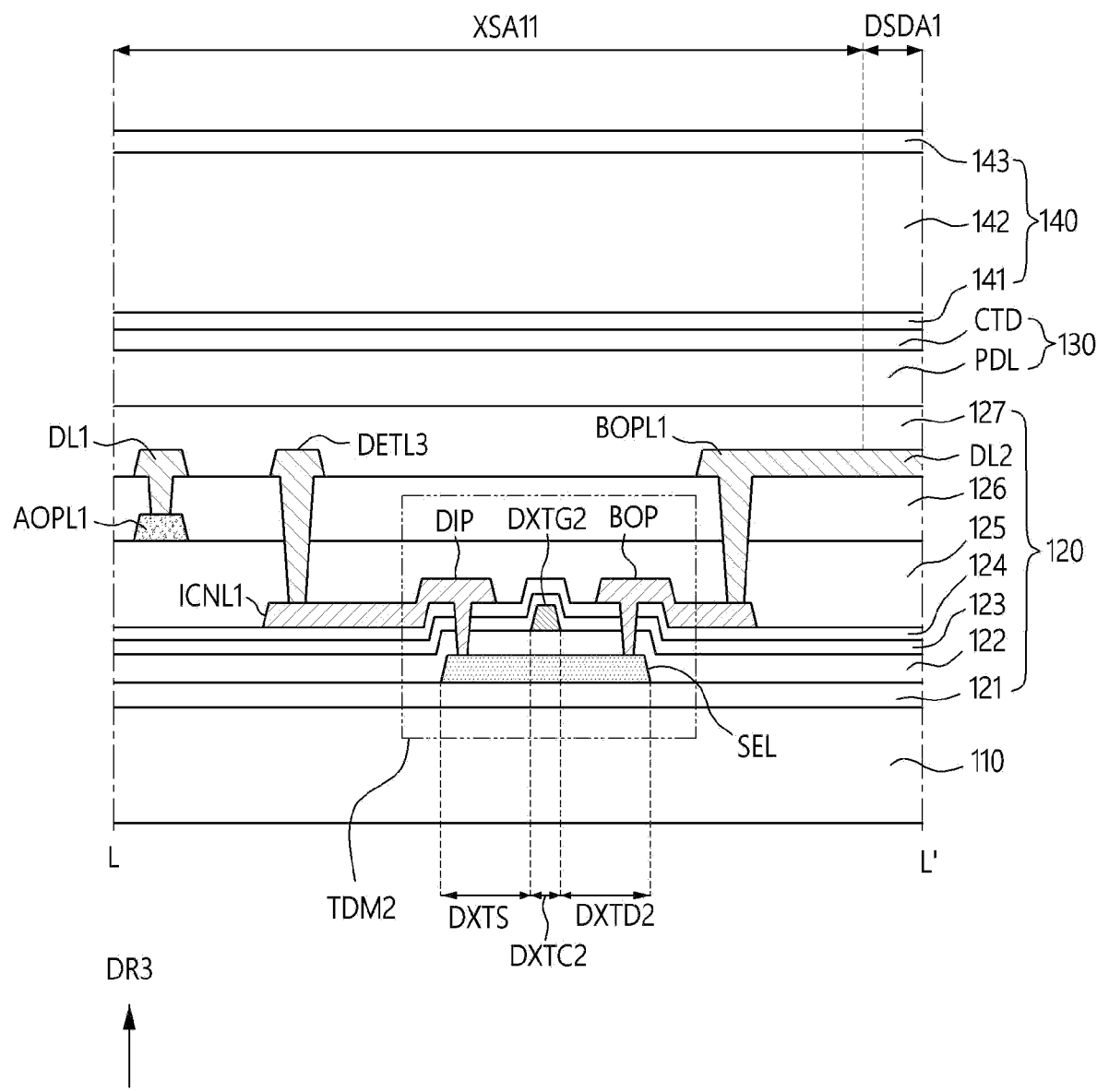
FIG. 25 is a cross-sectional view showing a plane taken along the line L-L' of FIG. 24.

FIG. 24 is a plan view showing the part J of FIG. 5 according to a fourth embodiment. FIG. 25 is a cross-sectional view showing a plane taken along the line L-L' of FIG. 24.

Referring to FIGS. 24 and 25, each of the first input connection line ICNL1 and the first lower-priority output connection line BOPL1 may be formed of the third conductive layer CDL3 or the fifth conductive layer CDL5, and the first higher-priority output connection line AOPL1 may be formed of the fourth conductive layer CDL4.

In other words, the first higher-priority output connection line AOPL1 may be formed of the fourth conductive layer CDL4, the first input connection line ICNL1 may be formed of the third conductive layer CDL3, and the first lower-priority output connection line BOPL1 may be formed of the fifth conductive layer CDL5.

As another example, the first higher-priority output connection line AOPL1 may be formed of the fourth conductive layer CDL4, the first input connection line ICNL1 may be formed of the fifth conductive layer CDL5, and the first lower-priority output connection line BOPL1 may be formed of the third conductive layer CDL3.

Figure 26:
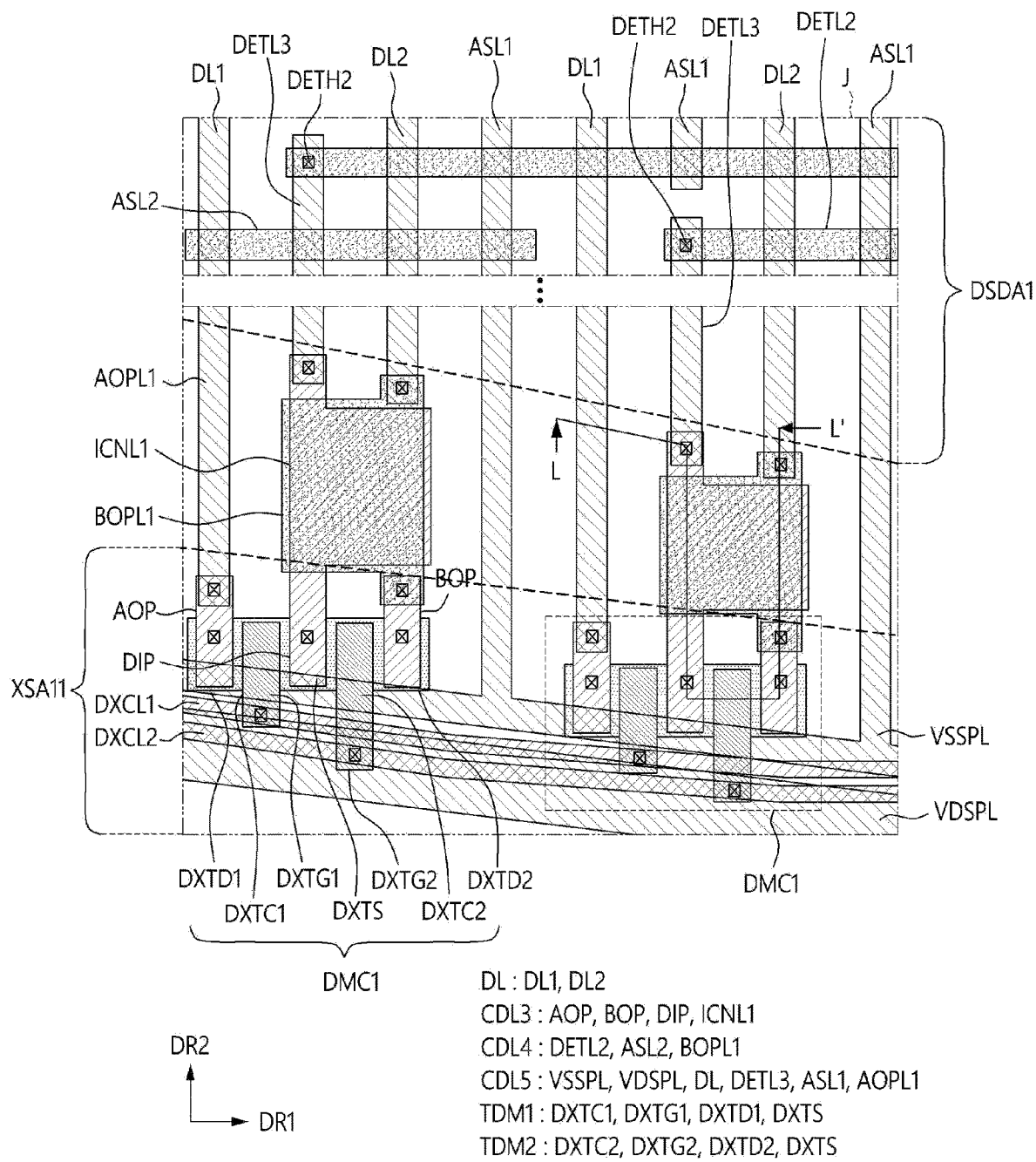
FIG. 26 is a plan view showing the part J of FIG. 5 according to a fifth embodiment.
Figure 27:
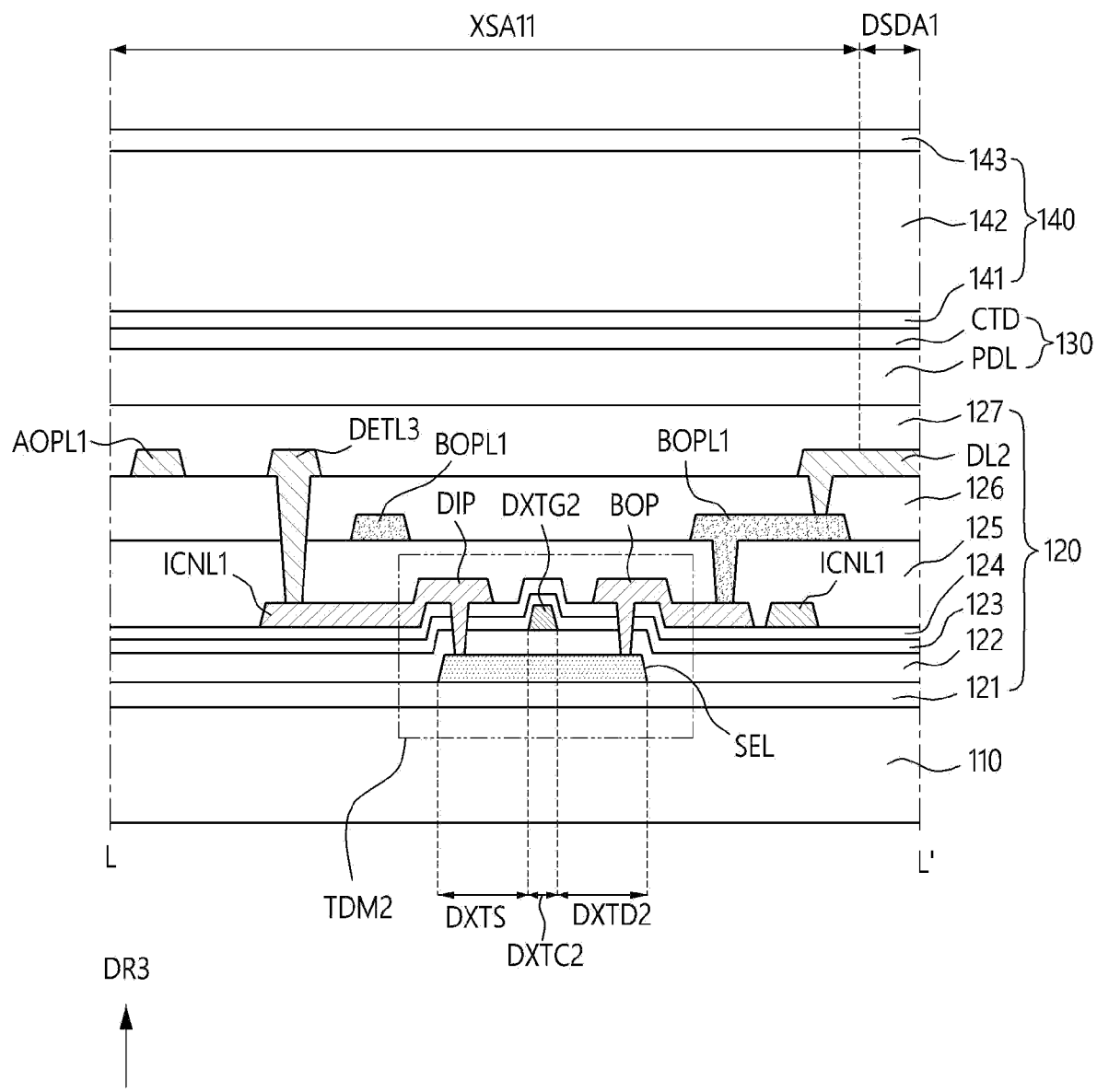
FIG. 27 is a cross-sectional view showing a plane taken along the line L-L' of FIG. 26.

FIG. 26 is a plan view showing the part J of FIG. 5 according to a fifth embodiment. FIG. 27 is a cross-sectional view showing a plane taken along the line L-L' of FIG. 26.

Because the fifth embodiment shown in FIGS. 26 and 27 may be the same or substantially the same as the first, second, and third embodiments shown in FIGS. 20 to 23, except that the first input connection line ICNL1 and the first lower-priority output connection line BOPL1 overlap with each other, redundant description thereof may not be repeated.

In other words, according to the fifth embodiment, the first higher-priority output connection line AOPL1 may be formed of one of the third conductive layer CDL3 or the fifth conductive layer CDL5.

In addition, each of the first input connection line ICNL1 and the first lower-priority output connection line BOPL1 may be formed of the fourth conductive layer CDL4, or may be formed of the other one of the third conductive layer CDL3 or the fifth conductive layer CDL5.

After the second data signal is output through the first lower-priority output connection line BOPL1 during the second output period BP, data signals may be transmitted to the pixel drivers PXD through the data lines DL, respectively. In other words, unlike the first data signal of the first higher-priority output connection line AOPL1 that is supplied during the first output period, is maintained during the second output period BP, and then is transferred to the first data line DL1, the second data signal of the first lower-priority output connection line BOPL1 may be supplied during the second output period BP and transferred to the second data line DL2. Accordingly, the second data signal of the first lower-priority output connection line BOPL1 may be less affected by coupling by signals of adjacent lines compared to the first data signal of the first higher-priority output connection line AOPL1.

Because the data driving signal DDRS of the first input connection line ICNL1 is output as the second data signal of the first lower-priority output connection line BOPL1 during the second output period BP, the second data signal of the first lower-priority output connection line BOPL1 may become clearer by the data driving signal DDRS of the first input connection line ICNL1.

Therefore, according to the fifth embodiment, the first lower-priority output connection line BOPL1 and the first input connection line ICNL1 may at least partially overlap with each other.

In other words, the overlapping area between the first lower-priority output connection line BOPL1 and the first input connection line ICNL1 may be spaced apart from contact holes for electrical connection between the first input connection line ICNL1 and each of the third bypass line DETL3 and the demux source DXTS and contact holes for electrical connection between the first lower-priority output connection line BOPL1 and each of the second data line DL2 and the second demux drain DXTD2.

As such, the resistance of each of the first lower-priority output connection line BOPL1 and the first input connection line ICNL1 may be decreased within a limited width. As another example, because the width allocated to the arrangement of the first lower-priority output connection line BOPL1 and the first input connection line ICNL1 may be decreased, the width of the non-display area NDA may be decreased.

Figure 28:
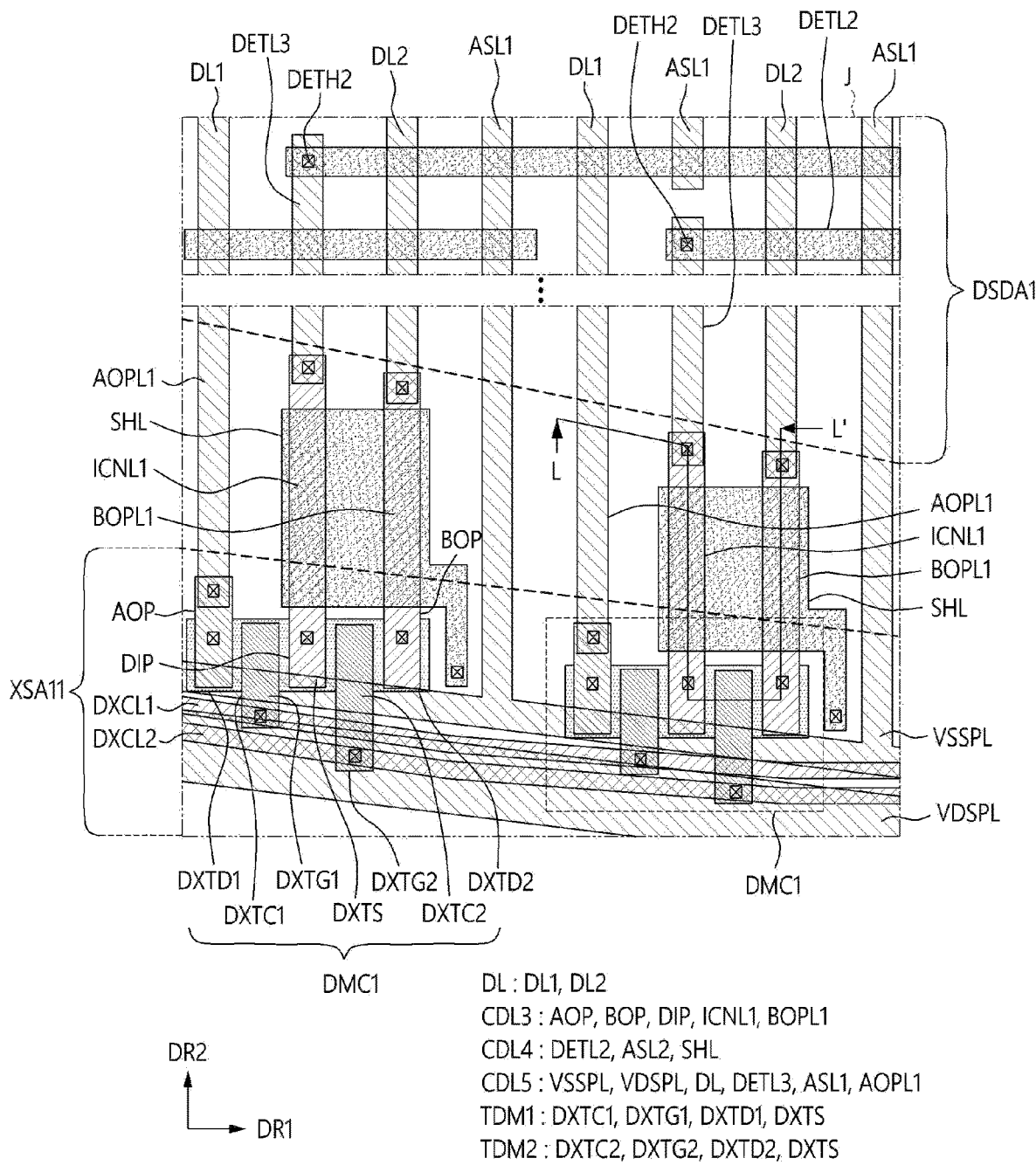
FIG. 28 is a plan view showing the part J of FIG. 5 according to a sixth embodiment.
Figure 29:
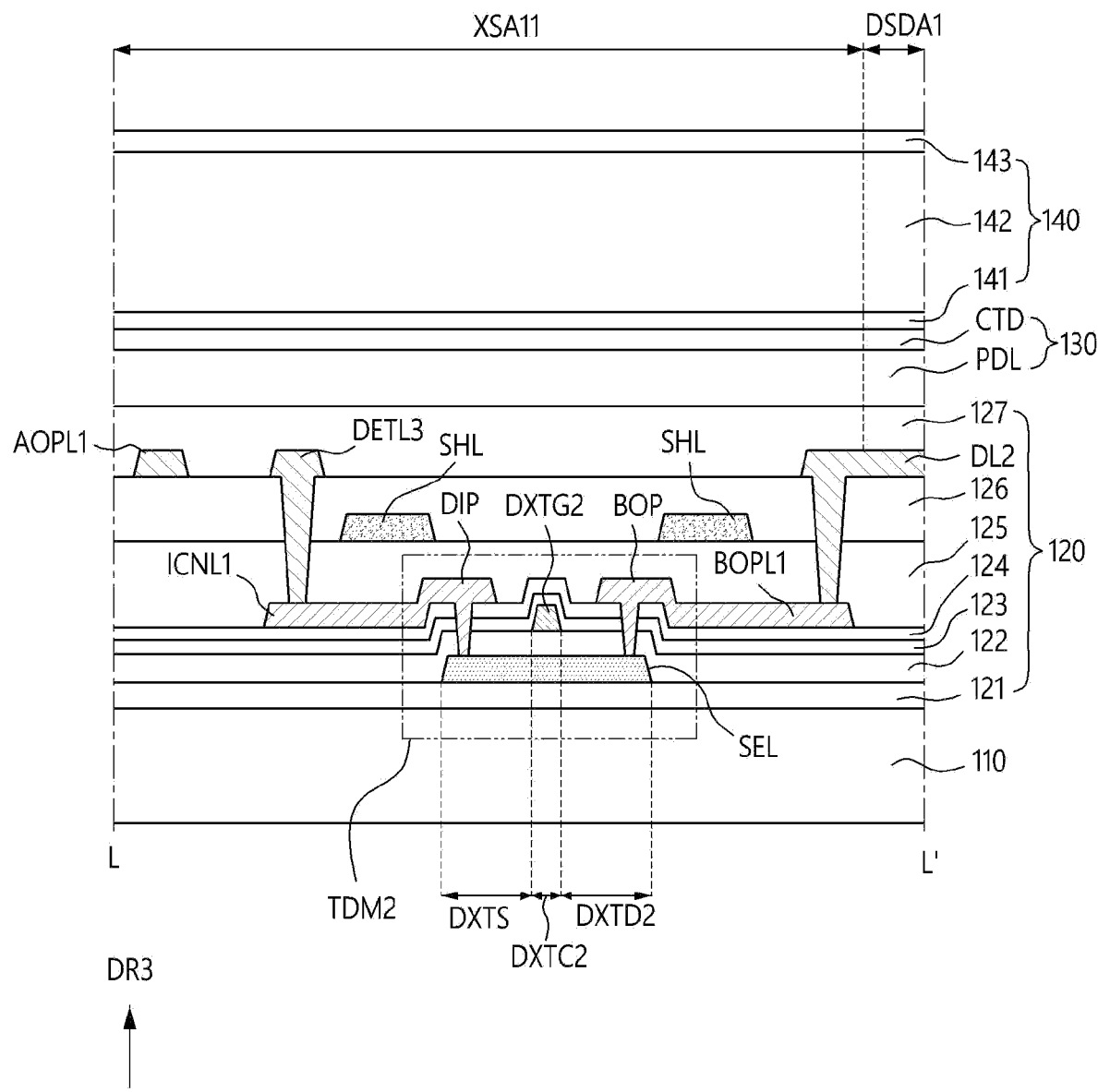
FIG. 29 is a cross-sectional view showing a plane taken along the line L-L' of FIG. 28.
Figure 30:
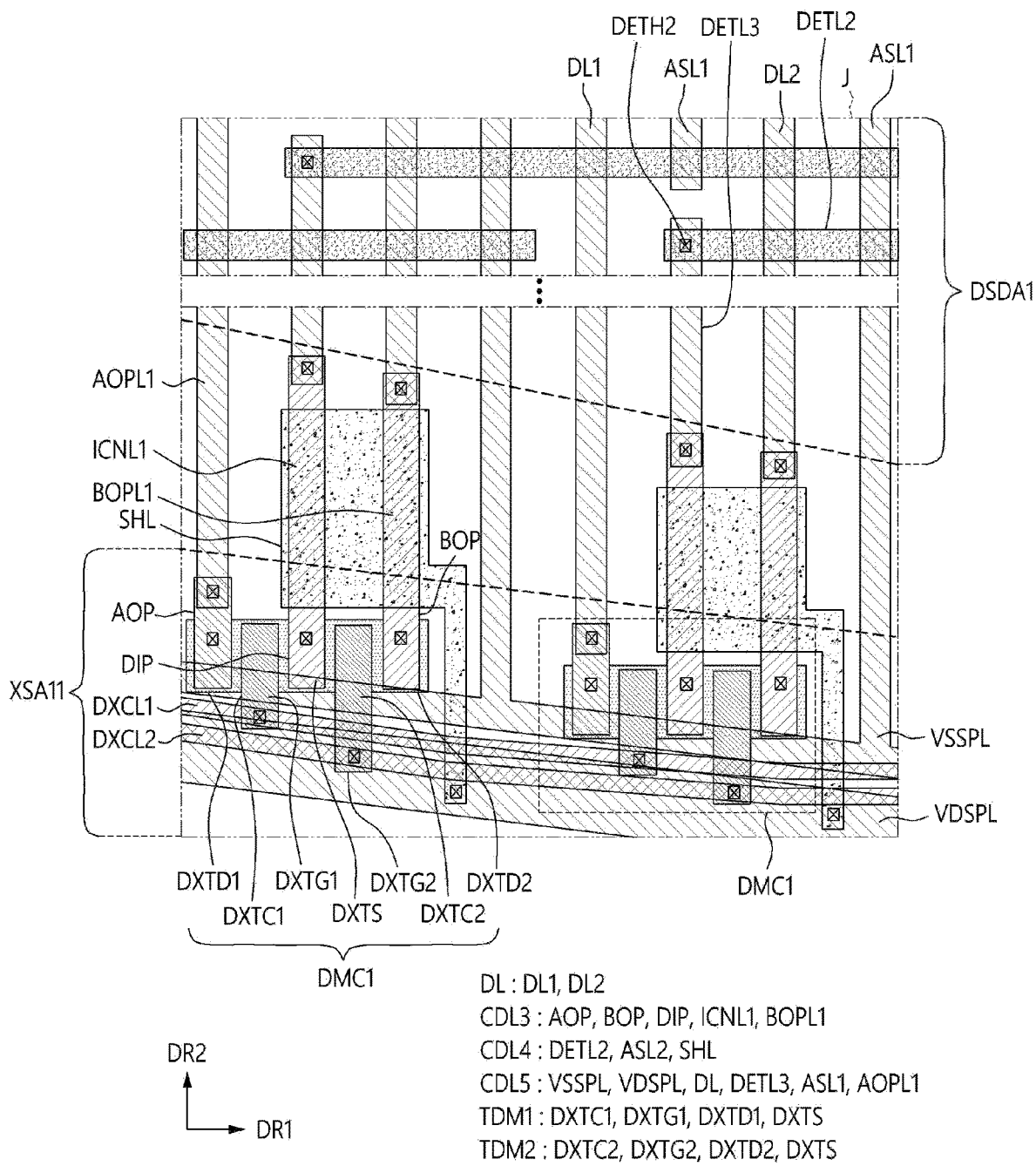
FIG. 30 is a plan view showing the part J of FIG. 5 according to a seventh embodiment.

FIG. 28 is a plan view showing the part J of FIG. 5 according to a sixth embodiment. FIG. 29 is a cross-sectional view showing a plane taken along the line L-L' of FIG. 28. FIG. 30 is a plan view showing the part J of FIG. 5 according to a seventh embodiment.

As show in FIGS. 28, 29, and 30, according to the sixth and seventh embodiments, the first higher-priority output connection line AOPL1 may be formed of one of the third conductive layer CDL3 or the fifth conductive layer CDL5, and the first lower-priority output connection line BOPL1 and the first input connection line ICNL1 may be formed of the other one of the third conductive layer CDL3 or the fifth conductive layer CDL5.

Further, the circuit layer 120 of the display device 10 according to the sixth and seventh embodiments may further include the shielding layer SHL that overlaps with the first lower-priority output connection line BOPL1 and the first input connection line ICNL1, and is formed of the fourth conductive layer CDL4.

In this case, the shielding layer SHL may be electrically connected to one of the first power supply line VDSPL or the second power supply line VSSPL.

In other words, as illustrated in FIG. 28, according to the sixth embodiment, the shielding layer SHL may be electrically connected to the second power supply line VDSPL.

As another example, as illustrated in FIG. 30, according to the seventh embodiment, the shielding layer SHL may be electrically connected to the first power supply line VDSPL.

In this way, the first data signal of the first higher-priority output connection line AOPL1 may be protected from the second data signal of the first lower-priority output connection line BOPL1 and the data driving signal DDRS of the first input connection line ICNL1 by the shielding layer SHL to which a first power or a second power is applied. Therefore, the first data signal of the first higher-priority output connection line AOPL1 may be further prevented from being distorted due to poor coupling.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a substrate comprising:
  a main region comprising a display area including emission areas, and a non-display area around the display area; and
  a sub-region protruding from one side of the main region;
a circuit layer on the substrate, and comprising:
  pixel drivers corresponding to the emission areas, respectively; and
  data lines configured to transmit data signals to the pixel drivers;
a light emitting element layer on the circuit layer, and comprising light emitting elements corresponding to the emission areas, respectively; and
a display driving circuit in the sub-region of the substrate, and configured to supply data driving signals corresponding to the data lines,
wherein the circuit layer further comprises:
  demux circuits located side by side with one another in a demux area of the non-display area and electrically connected between the data lines and the display driving circuit, each of the demux circuits comprising:
    an input terminal configured to receive a data driving signal from among the data driving signals of the display driving circuit;
    a higher-priority output terminal configured to output a first data signal from among the data signals corresponding to the data driving signal from among the data driving signals during a first output period; and
    a lower-priority output terminal configured to output a second data signal from among the data signals corresponding to the data driving signal from among the data driving signals during a second output period after the first output period;
  a first higher-priority output connection line electrically connected to the higher-priority output terminal of a first demux circuit from among the demux circuits, and extending to the display area;
  a first lower-priority output connection line electrically connected to the lower-priority output terminal of the first demux circuit, and extending to the display area; and
  a first input connection line electrically connected to the input terminal of the first demux circuit, and
wherein one of the first higher-priority output connection line, the first lower-priority output connection line, or the first input connection line is comprised in the same conductive layer as that of the data lines, and the others are comprised in a conductive layer different from that of the data lines.

2. The display device of claim 1, wherein the first demux circuit is adjacent to a bent corner of an edge of the substrate.

3. The display device of claim 2, wherein the demux area comprises:
a demux middle region at a center of the demux area in a first direction;
a first demux side region adjacent to the edge of the substrate in the first direction, the first demux side region comprising:
  a curved region having a bent shape along the bent corner of the edge of the substrate; and
  a straight region other than the curved region; and
a second demux side region between the demux middle region and the first demux side region in the first direction, and
wherein the first demux circuit is located in the curved region.

4. The display device of claim 3, wherein, in the first direction, the first input connection line is located between the first higher-priority output connection line and the first lower-priority output connection line.

5. The display device of claim 4, wherein the circuit layer has a multilayered structure comprising:
a semiconductor layer on the substrate;
a first conductive layer on a first gate insulating layer covering the semiconductor layer;
a second conductive layer on a second gate insulating layer covering the first conductive layer;
a third conductive layer on an interlayer insulating layer covering the second conductive layer;
a fourth conductive layer on a first planarization layer covering the third conductive layer;
a fifth conductive layer on a second planarization layer covering the fourth conductive layer; and
a third planarization layer covering the fifth conductive layer,
wherein the data lines are comprised in the fifth conductive layer, and
wherein one of the first higher-priority output connection line, the first lower-priority output connection line, or the first input connection line is comprised in the fifth conductive layer, and each of the others is comprised in the third conductive layer or the fourth conductive layer.

6. The display device of claim 5, wherein the first higher-priority output connection line, the first lower-priority output connection line, and the first input connection line are comprised in different conductive layers from each other.

7. The display device of claim 6, wherein:
the first higher-priority output connection line is comprised in one of the third conductive layer or the fifth conductive layer;
the first lower-priority output connection line is comprised in the other one of the third conductive layer or the fifth conductive layer; and
the first input connection line is comprised in the fourth conductive layer.

8. The display device of claim 6, wherein:
the first higher-priority output connection line is comprised in one of the third conductive layer or the fifth conductive layer;
the first lower-priority output connection line is comprised in the fourth conductive layer; and
the first input connection line is comprised in the other one of the third conductive layer or the fifth conductive layer.

9. The display device of claim 6, wherein the first higher-priority output connection line is comprised in one of the third conductive layer or the fifth conductive layer, and
wherein the first lower-priority output connection line and the first input connection line overlap with each other.

10. The display device of claim 5, wherein the first higher-priority output connection line is comprised in one of the third conductive layer or the fifth conductive layer, and
wherein the first lower-priority output connection line and the first input connection line are comprised in the other one of the third conductive layer or the fifth conductive layer, and are spaced from each other.

11. The display device of claim 10, wherein the circuit layer further comprises a shielding layer overlapping with the first lower-priority output connection line and the first input connection line, and comprised in the fourth conductive layer.

12. The display device of claim 11, wherein the circuit layer further comprises a first power supply line and a second power supply line in the non-display area to transmit a first power and a second power, respectively, for driving the light emitting elements, and
wherein the shielding layer is electrically connected to one of the first power supply line or the second power supply line.

13. The display device of claim 5, wherein the demux circuits further comprise a second demux circuit in the straight region,
wherein the circuit layer further comprises:
a second higher-priority output connection line electrically connected to the higher-priority output terminal of the second demux circuit, and extending to the display area;
a second lower-priority output connection line electrically connected to the lower-priority output terminal of the second demux circuit, and extending to the display area; and
a second input connection line electrically connected to the input terminal of the second demux circuit, and
wherein the second higher-priority output connection line, the second lower-priority output connection line, and the second input connection line are comprised in the same conductive layer as that of the data lines.

14. The display device of claim 13, wherein the demux circuits further comprise a third demux circuit in the second demux side region, and a fourth demux circuit in the demux middle region,
wherein the circuit layer further comprises:
a third higher-priority output connection line electrically connected to the higher-priority output terminal of the third demux circuit, and extending to the display area;
a third lower-priority output connection line electrically connected to the lower-priority output terminal of the third demux circuit, and extending to the display area;
a fourth higher-priority output connection line electrically connected to the higher-priority output terminal of the fourth demux circuit, and extending to the display area; and
a fourth lower-priority output connection line electrically connected to the lower-priority output terminal of the fourth demux circuit, and extending to the display area, and
wherein the third higher-priority output connection line, the third lower-priority output connection line, the fourth higher-priority output connection line, and the fourth lower-priority output connection line are comprised in the fifth conductive layer.

15. The display device of claim 14, wherein:
the circuit layer further comprises circuit output lines in the sub-region and the non-display area to electrically connect the demux circuits to the display driving circuit;
the first input connection line and the second input connection line are electrically connected to a first circuit output line and a second circuit output line from among the circuit output lines, respectively, through input bypass lines in the display area; and
the input terminal of the third demux circuit and the input terminal of the fourth demux circuit are electrically connected to a third circuit output line and a fourth circuit output line from among the circuit output lines, respectively.

16. The display device of claim 15, wherein the display area comprises:
a display middle region adjacent to the demux middle region in a second direction crossing the first direction;
a first display side region adjacent to the first demux side region in the second direction; and
a second display side region adjacent to the second demux side region in the second direction,
wherein the data lines extend in the second direction, and
wherein each of the input bypass lines comprises:
a first bypass line in the second display side region, electrically connected to the first circuit output line, and extending in the second direction;
a second bypass line electrically connected to the first bypass line, and extending in the first direction; and
a third bypass line in the first display side region, electrically connected to the second bypass line, and extending in the second direction toward the demux area.

17. The display device of claim 16, wherein the first bypass line and the third bypass line are comprised in the fifth conductive layer, and
wherein the second bypass line is comprised in the fourth conductive layer.

18. The display device of claim 17, wherein the circuit layer further comprises first dummy lines in the display area, adjacent to the data lines, respectively, extending in the second direction, and comprised in the fifth conductive layer, and
wherein the first dummy lines comprise the first bypass line of the input bypass lines, the third bypass line of the input bypass lines, and first auxiliary lines other than the first bypass line and the third bypass line.

19. The display device of claim 18, wherein the circuit layer further comprises:
a first power supply line and a second power supply line in the non-display area to transmit a first power and a second power, respectively, for driving the light emitting elements;
first power additional lines in the display area, extending in the first direction, comprised in the fourth conductive layer, and electrically connected to the first power supply line; and
second dummy lines in the display area, extending in the first direction, comprised in the fourth conductive layer, and adjacent to the first power additional lines, respectively,
wherein the second dummy lines comprise the second bypass line of the input bypass lines and second auxiliary lines other than the second bypass line, and
wherein the first auxiliary lines and the second auxiliary lines are electrically connected to the second power supply line.

20. A display device comprising:
a substrate comprising:
a main region comprising a display area including emission areas, and a non-display area around the display area; and
a sub-region protruding from one side of the main region;

a circuit layer on the substrate, and comprising pixel drivers corresponding to the emission areas, respectively, and data lines configured to transmit data signals to the pixel drivers;

a light emitting element layer on the circuit layer, and comprising light emitting elements corresponding to the emission areas, respectively; and a display driving circuit in the sub-region of the substrate, and configured to supply data driving signals corresponding to the data lines, wherein the circuit layer has a multilayered structure comprising:
- a semiconductor layer on the substrate;
- a first conductive layer on a first gate insulating layer covering the semiconductor layer;
- a second conductive layer on a second gate insulating layer covering the first conductive layer;
- a third conductive layer on an interlayer insulating layer covering the second conductive layer;
- a fourth conductive layer on a first planarization layer covering the third conductive layer;
- a fifth conductive layer on a second planarization layer covering the fourth conductive layer, and comprising the data lines; and
- a third planarization layer covering the fifth conductive layer, wherein the circuit layer further comprises demux circuits located side by side with one another in a demux area of the non-display area and electrically connected between the data lines and the display driving circuit, each of the demux circuits comprising:
- an input terminal configured to receive a data driving signal from among the data driving signals of the display driving circuit;
- a higher-priority output terminal configured to output a first data signal from among the data signals corresponding to the data driving signal during a first output period; and
- a lower-priority output terminal configured to output a second data signal from among the data signals corresponding to the data driving signal during a second output period after the first output period, wherein the circuit layer further comprises:
- a first higher-priority output connection line electrically connected to the higher-priority output terminal of a first demux circuit adjacent to a bent corner of an edge of the substrate from among the demux circuits, and extending to the display area;
- a first lower-priority output connection line electrically connected to the lower-priority output terminal of the first demux circuit, and extending to the display area; and
- a first input connection line electrically connected to the input terminal of the first demux circuit, wherein the first higher-priority output connection line is comprised in one of the third conductive layer or the fifth conductive layer, and wherein at least one of the first lower-priority output connection line or the first input connection line is comprised in the other one of the third conductive layer or the fifth conductive layer.

21. The display device of claim 20, wherein the demux area comprises:
- a demux middle region at a center of the demux area in a first direction;
- a first demux side region adjacent to the edge of the substrate in the first direction; and
- a second demux side region between the demux middle region and the first demux side region in the first direction, wherein the first demux side region comprises a curved region including a bent shape corresponding to the bent corner of the substrate, and a straight region other than the curved region, and wherein the first demux circuit is located in the curved region.

22. The display device of claim 21, wherein the first higher-priority output connection line, the first lower-priority output connection line, and the first input connection line are comprised in different conductive layers from each other.

23. The display device of claim 22, wherein one of the first lower-priority output connection line or the first input connection line is comprised in the other one of the third conductive layer or the fifth conductive layer, and
the other one of the first lower-priority output connection line or the first input connection line is comprised in the fourth conductive layer.

24. The display device of claim 22, wherein the first lower-priority output connection line and the first input connection line overlap with each other.

25. The display device of claim 21, wherein the first lower-priority output connection line and the first input connection line are comprised in the other one of the third conductive layer or the fifth conductive layer, and are spaced from each other.

26. The display device of claim 25, wherein the circuit layer further comprises a shielding layer overlapping with the first lower-priority output connection line and the first input connection line, and comprised in the fourth conductive layer.

27. The display device of claim 26, wherein the circuit layer further comprises a first power supply line and a second power supply line in the non-display area to transmit a first power and a second power, respectively, for driving the light emitting elements, and
wherein the shielding layer is electrically connected to one of the first power supply line or the second power supply line.

28. The display device of claim 21, wherein the demux circuits further comprise a second demux circuit in the straight region,
wherein the circuit layer further comprises:
- a second higher-priority output connection line electrically connected to the higher-priority output terminal of the second demux circuit, and extending to the display area;
- a second lower-priority output connection line electrically connected to the lower-priority output terminal of the second demux circuit, and extending to the display area; and
- a second input connection line electrically connected to the input terminal of the second demux circuit, and
wherein the second higher-priority output connection line, the second lower-priority output connection line, and the second input connection line are comprised in the fifth conductive layer.

29. The display device of claim 28, wherein the demux circuits further comprise a third demux circuit in the second demux side region, and a fourth demux circuit in the demux middle region,
wherein the circuit layer further comprises:

a third higher-priority output connection line electrically connected to the higher-priority output terminal of the third demux circuit, and extending to the display area;

a third lower-priority output connection line electrically connected to the lower-priority output terminal of the third demux circuit, and extending to the display area;

a fourth higher-priority output connection line electrically connected to the higher-priority output terminal of the fourth demux circuit, and extending to the display area; and a fourth lower-priority output connection line electrically connected to the lower-priority output terminal of the fourth demux circuit, and extending to the display area, and wherein the third higher-priority output connection line, the third lower-priority output connection line, the fourth higher-priority output connection line, and the fourth lower-priority output connection line are comprised in the fifth conductive layer.

30. The display device of claim 29, wherein the circuit layer further comprises circuit output lines in the sub-region and the non-display area to electrically connect the demux circuits to the display driving circuit, wherein the first input connection line and the second input connection line are electrically connected to a first circuit output line and a second circuit output line from among the circuit output lines, respectively, through input bypass lines in the display area, and wherein the input terminal of the third demux circuit and the input terminal of the fourth demux circuit are electrically connected to a third circuit output line and a fourth circuit output line from among the circuit output lines, respectively.

31. The display device of claim 30, wherein the display area comprises:

a display middle region adjacent to the demux middle region in a second direction crossing the first direction;

a first display side region adjacent to the first demux side region in the second direction; and a second display side region adjacent to the second demux side region in the second direction, wherein the data lines extend in the second direction, and wherein each of the input bypass lines comprises:

a first bypass line in the second display side region, electrically connected to the first circuit output line, and extending in the second direction;

a second bypass line electrically connected to the first bypass line, and extending in the first direction; and a third bypass line in the first display side region, electrically connected to the second bypass line, and extending in the second direction toward the demux area.

32. The display device of claim 31, wherein the first bypass line and the third bypass line are comprised in the fifth conductive layer, and wherein the second bypass line is comprised in the fourth conductive layer.

* * * * *